(12) United States Patent
Yamaguchi et al.

(10) Patent No.: US 7,741,007 B2
(45) Date of Patent: Jun. 22, 2010

(54) CHEMICALLLY AMPLIFIED RESIST COMPOSITION

(75) Inventors: Satoshi Yamaguchi, Kawachinagano (JP); Satoshi Yamamoto, Kawabe-gun (JP); Nobuo Ando, Toyonaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 11/987,672

(22) Filed: Dec. 3, 2007

(65) Prior Publication Data

US 2008/0213695 A1   Sep. 4, 2008

(30) Foreign Application Priority Data

Dec. 6, 2006   (JP) .............................. 2006-329132

(51) Int. Cl.
*G03F 7/004*   (2006.01)
(52) U.S. Cl. .................... 430/270.1; 430/905; 430/910; 430/921; 430/922
(58) Field of Classification Search ............. 430/270.1, 430/905, 910, 921, 922
See application file for complete search history.

(56) References Cited

U.S. PATENT DOCUMENTS

| | | | |
|---|---|---|---|
| 6,348,297 B1 | 2/2002 | Uetani et al. | |
| 6,383,713 B1 | 5/2002 | Uetani et al. | |
| 6,548,220 B2 | 4/2003 | Uetani et al. | |
| 6,548,221 B2 | 4/2003 | Uetani et al. | |
| 6,824,957 B2 | 11/2004 | Okino et al. | |
| 6,893,792 B2 | 5/2005 | Miya et al. | |
| 6,908,722 B2 | 6/2005 | Ebata et al. | |
| 7,262,321 B2 * | 8/2007 | Harada et al. ................ | 560/129 |
| 7,301,047 B2 * | 11/2007 | Yoshida et al. .............. | 560/129 |
| 7,304,175 B2 | 12/2007 | Harada et al. | |
| 2003/0194639 A1 | 10/2003 | Miya et al. | |
| 2006/0019042 A1 | 1/2006 | Nojima et al. | |
| 2006/0194982 A1 | 8/2006 | Harada et al. | |
| 2007/0078269 A1 * | 4/2007 | Harada et al. ................ | 549/266 |
| 2007/0100096 A1 | 5/2007 | Harada et al. | |
| 2007/0100158 A1 | 5/2007 | Harada et al. | |
| 2007/0100159 A1 | 5/2007 | Yoshida et al. | |
| 2007/0122750 A1 | 5/2007 | Yamaguchi et al. | |
| 2007/0148702 A1 | 6/2007 | Nakamura et al. | |
| 2007/0184382 A1 * | 8/2007 | Yamaguchi et al. ...... | 430/270.1 |
| 2008/0193874 A1 | 8/2008 | Takata et al. | |

FOREIGN PATENT DOCUMENTS

| | | |
|---|---|---|
| EP | 1041442 A1 | 10/2000 |
| EP | 1077391 A1 | 2/2001 |
| EP | 1167349 A1 | 1/2002 |
| GB | 2441032 A | 2/2008 |
| JP | 2002-202607 A | 7/2002 |
| JP | 2002-265436 A | 9/2002 |
| JP | 2003-122012 A | 4/2003 |
| JP | 2003-131383 A | 5/2003 |
| JP | 2004-4561 A | 1/2004 |
| JP | 2004-117959 A | 4/2004 |
| JP | 2006-306856 A | 11/2006 |

* cited by examiner

*Primary Examiner*—John S Chu
(74) *Attorney, Agent, or Firm*—Birch, Stewart, Kolasch & Birch, LLP

(57) ABSTRACT

The present invention provides a chemically amplified resist composition comprising:
(A) a salt represented by the formula (1)

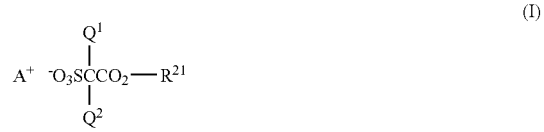

wherein $R^{21}$, $Q^1$, $Q^2$, and $A^+$ defined in the specification;
(B) a salt represented by the formula (II):

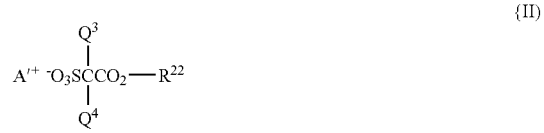

wherein $R^{22}$, $Q^3$, $Q^4$, and $A'^+$ are defined in the specification; and
(C) a resin which contains a structural unit having a structural unit having an acid-labile group and which itself is insoluble or poorly soluble in an aqueous alkali solution but becomes soluble in an aqueous alkali solution by the action of an acid.

22 Claims, No Drawings

CHEMICALLLY AMPLIFIED RESIST COMPOSITION

This nonprovisional application claims priority under 35 U.S.C. §119(a) on Patent Application No. 2006-329132 filed in JAPAN on Dec. 6, 2006, the entire contents of which are hereby incorporated by reference.

FIELD OF THE INVENTION

The present invention relates to a chemically amplified resist composition.

BACKGROUND OF THE INVENTION

A chemically amplified resist composition used for semiconductor microfabrication employing a lithography process contains a resin which contains a structural unit having an acid-labile group and which itself is insoluble or poorly soluble in an alkali aqueous solution but becomes soluble in an alkali aqueous solution by the action of an acid, and an acid generator comprising a compound generating an acid by irradiation.

In semiconductor microfabrication, it is desirable to form patterns having high resolution and good line edge roughness, and it is expected for a chemically amplified resist composition to give such patterns.

US 2006-0194982 A1 discloses a chemically amplified resist composition containing the salt represented by the following formula:

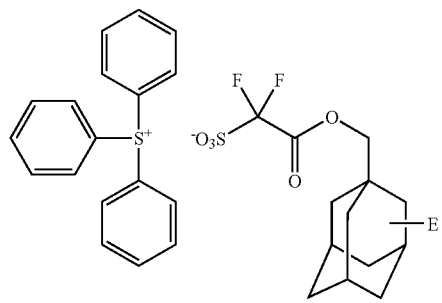

wherein E represents a hydrogen atom or a hydroxyl group, and a resin which contains a structural unit having an acid-labile group and which itself is insoluble or poorly soluble in an alkali aqueous solution but becomes soluble in an alkali aqueous solution by the action of an acid.

US 2007-27336 A1 discloses a chemically amplified resist composition comprising the salt represented by the following formula:

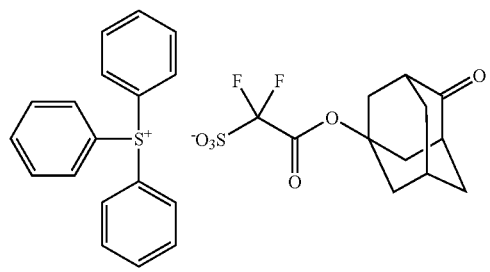

and a resin which contains a structural unit having an acid-labile group and which itself is insoluble or poorly soluble in an alkali aqueous solution but becomes soluble in an alkali aqueous solution by the action of an acid.

US 2003/0194639 A1 also discloses a chemically amplified resist composition containing the salt represented by the following formula:

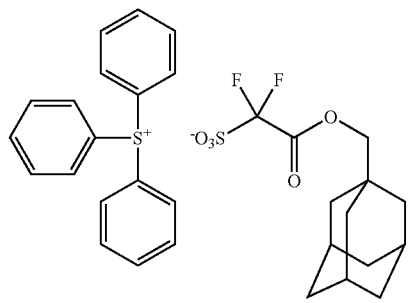

as the acid generator.

SUMMARY OF THE INVENTION

An object of the present invention is to provide a chemically amplified resist composition.

This and other objects of the present invention will be apparent from the following description.

The present invention relates to the followings:

<1> A chemically amplified resist composition comprising:
(A) a salt represented by the formula (I):

wherein $R^{21}$ represents a C1-C30 hydrocarbon group which may be substituted, and at least one —$CH_2$— in the hydrocarbon group may be substituted by —CO— or —O—, $Q^1$ and $Q^2$ each independently represent a fluorine atom or a C1-C6 perfluoroalkyl group, and $A^+$ represents at least one organic cation selected from a cation represented by the formula (Ia):

wherein $P^1$, $P^2$ and $P^3$ each independently represent a C1-C30 alkyl group which may be substituted with at least one selected from a hydroxyl group, a C3-C12 cyclic hydrocarbon group and a C1-C12 alkoxy group, or a C3-C30 cyclic hydrocarbon group which may be substituted with at least one selected from a hydroxyl group and a C1-C12 alkoxy group, a cation represented by the formula (Ib):

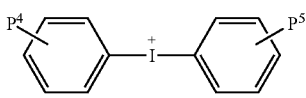

wherein P⁴ and P⁵ each independently represent a hydrogen atom, a hydroxyl group, a C1-C12 alkyl group or a C1-C12 alkoxy group, and a cation represented by the formula (Ic):

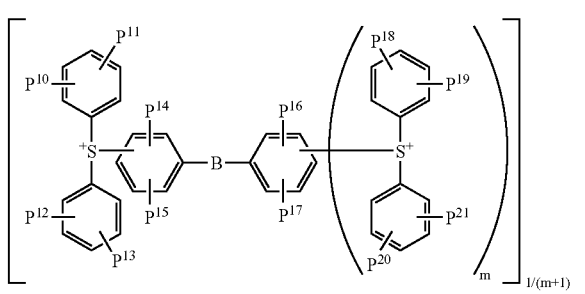

wherein $P^{10}$, $P^{12}$, $P^{13}$, $P^{14}$, $P^{15}$, $P^{16}$, $P^{17}$, $P^{18}$, $P^{19}$, $P^{20}$ and $P^{21}$ each independently represent a hydrogen atom, a hydroxyl group, a C1-C12 alkyl group or a C1-C12 alkoxy group, B represents a sulfur or oxygen atom and m represents 0 or 1, (B) a salt represented by the formula (II):

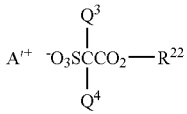

wherein $R^{22}$ represents a C1-C30 hydrocarbon group which may be substituted, and at least one —CH₂— in the hydrocarbon group may be substituted by —CO— or —O—, $Q^3$ and $Q^4$ each independently represent a fluorine atom or a C1-C6 perfluoroalkyl group, and $A'^+$ represents an organic cation represented by the formula (IIa):

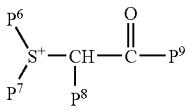

wherein P⁶ and P⁷ each independently represent a C1-C12 alkyl group or a C3-C12 cycloalkyl group, or P⁶ and P⁷ are bonded to form a C3-C12 divalent acyclic hydrocarbon group which forms a ring together with the adjacent S⁺, and at least one —CH₂— in the divalent acyclic hydrocarbon group may be substituted with —CO—, —O— or —S—, P⁸ represents a hydrogen atom, P⁹ represents a C1-C12 alkyl group, a C3-C12 cycloalkyl group or an aromatic group which may be substituted, or P⁸ and P⁹ are bonded to form a divalent acyclic hydrocarbon group which forms a 2-oxo-cycloalkyl group together with the adjacent —CHCO—, and at least one —CH₂— in the divalent acyclic hydrocarbon group may be replaced with —CO—, —O— or —S—; and (C) a resin which contains a structural unit having an acid-labile group and which itself is insoluble or poorly soluble in an aqueous alkali solution but becomes soluble in an aqueous alkali solution by the action of an acid;

<2> The resist composition according to <1>, wherein $Q^1$, $Q^2$, $Q^3$ and $Q^4$ each independently represent a fluorine atom or a trifluoromethyl group;

<3> The resist composition according to <1>, wherein $Q^1$, $Q^2$, $Q^3$ and $Q^4$ represent fluorine atoms;

<4> The resist composition according to any one of <1> to <3>, wherein A⁺ is a cation represented by the formula (Id), (Ie) or (If):

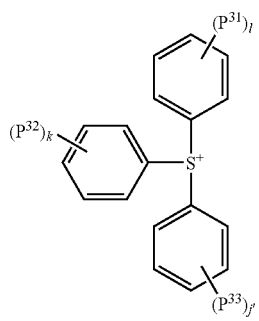

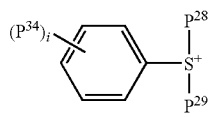

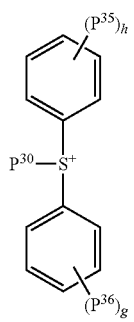

wherein $P^{28}$, $P^{29}$ and $P^{30}$ each independently represent a C1-C20 alkyl group or a C3-C30 cyclic hydrocarbon group except a phenyl group, and at least one hydrogen atom in the C1-C20 alkyl group may be substituted with a hydroxyl group, a C1-C12 alkoxy group or a C3-C12 cyclic hydrocarbon group and at least one hydrogen atom in the C3-C30 cyclic hydrocarbon group may be substituted with a hydroxyl group, a C1-C12 alkyl group or a C1-C12 alkoxy group, and $P^{31}$, $P^{32}$, $P^{33}$, $P^{34}$, $P^{35}$ and $P^{36}$ each independently represent a hydroxyl group, a C1-C12 alkyl group, a C1-C12 alkoxy group or a C3-C12 cyclic hydrocarbon group, and l, k, j, i, h and g each independently represent an integer of 0 to 5;

<5> The resist composition according to any one of <1> to <3>, wherein A⁺ is a cation represented by the formula (Ig):

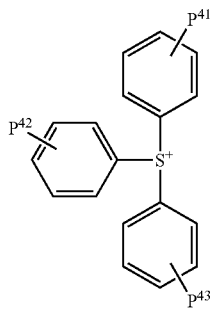

(Ig)

wherein $P^{41}$, $P^{42}$ and $P^{43}$ each independently represent a hydrogen atom, a hydroxyl group, a C1-C12 alkyl group or a C1-C12 alkoxy group; <6> The resist composition according to any one of <1> to <3>, wherein A⁺ is a cation represented by the formula (Ih):

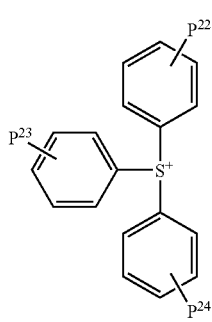

(Ih)

wherein $P^{22}$, $P^{23}$ and $P^{24}$ each independently represent a hydrogen atom or a C1-C4 alkyl group;

<7> The resist composition according to any one of <1> to <6>, wherein $R^{21}$ represents a group represented by the formula:

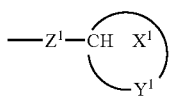

wherein $Z^1$ represents a single bond or —(CH₂)$_f$—, f represents an integer of 1 to 4, $Y^1$ represents —CH₂—, —CO— or —CH(OH)—; ring $X^1$ represents a C3-C30 monocyclic or polycyclic hydrocarbon group in which a hydrogen atom is substituted with a hydroxyl group at $Y^1$ position when $Y^1$ is —CH(OH)— or in which two hydrogen atoms are substituted with =O at $Y^1$ position when $Y^1$ is —CO—, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group;

<8> The resist composition according to <7>, wherein the group represented by the formula:

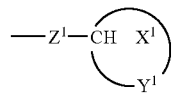

is a group represented by the formula (l), (m) or (n):

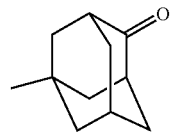

(l)

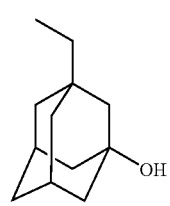

(m)

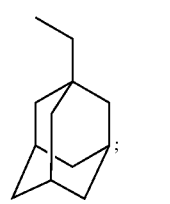

(n)

<9> The resist composition according to any one of <1> to <3>, wherein A⁺ is a cation represented by the formula (Ih):

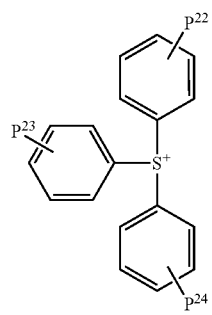

(Ih)

wherein $P^{22}$, $P^{23}$ and $P^{24}$ each independently represent a hydrogen atom or a C1-C4 alkyl group, and $R^{21}$ represents a group represented by the formula:

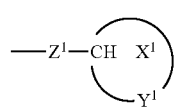

wherein $Z^1$ represents a single bond or —$(CH_2)_f$—, f represents an integer of 1 to 4, $Y^1$ represents —$CH_2$—, —CO— or —CH(OH)—; ring $X^1$ represents a C3-C30 monocyclic or polycyclic hydrocarbon group in which a hydrogen atom is substituted with a hydroxyl group at $Y^1$ position when $Y^1$ is —CH(OH)— or in which two hydrogen atoms are substituted with =O at $Y^1$ position when Y is —CO—, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group;

<10> The resist composition according to <9>, wherein the group represented by the formula:

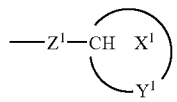

is a group represented by the formula (l), (m) or (n):

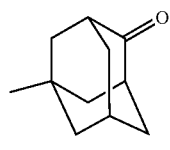
(l)

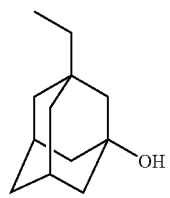
(m)

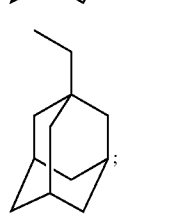
(n)

<11> The resist composition according to <1>, <2>, <3>, <7> or <8>, wherein $P^6$ and $P^7$ are bonded to form a C3-C12 divalent acyclic hydrocarbon group which forms a ring together with the adjacent $S^+$, $P^8$ represents a hydrogen atom, $P^9$ represents a C1-C12 alkyl group, a C3-C12 cycloalkyl group or an aromatic group which may be substituted with at least one selected from a C1-C6 alkoxy group, a C2-C20 acyl group and a nitro group;

<12> The resist composition according to any one of <1> to <11>, wherein $R^{22}$ represents a group represented by the formula:

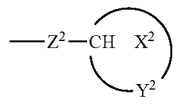

wherein $Z^2$ represents a single bond or —$(CH_2)_g$, g represents an integer of 1 to 4, $Y^2$ represents —$CH_2$—, —CO— or —CH(OH)—; ring $X^2$ represents a C3-C30 monocyclic or polycyclic hydrocarbon group in which a hydrogen atom is substituted with a hydroxyl group at $Y^2$ position when $Y^2$ is —CH(OH)— or in which two hydrogen atoms are substituted with =O at $Y^2$ position when $Y^2$ is —CO—, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group;

<13> The resist composition according to <12>, wherein the group represented by the formula:

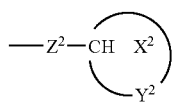

is a group represented by the formula (l), (m) or (n):

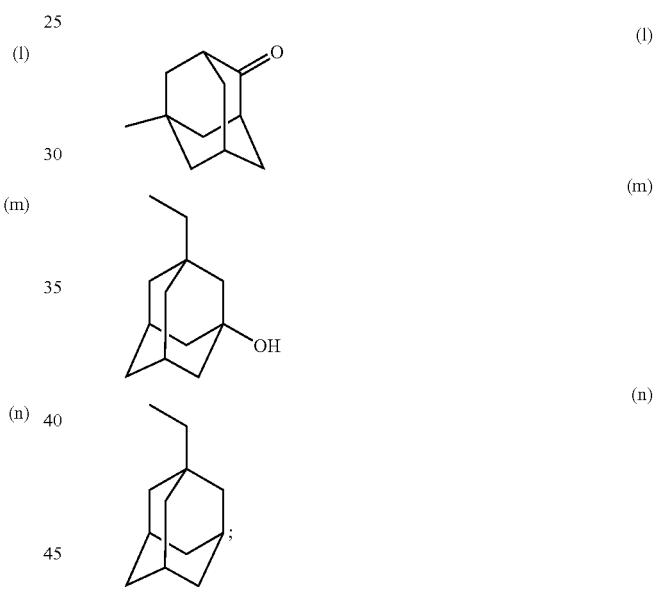

<14> The resist composition according to any one of <1> to <10>, wherein $P^6$ and $P^7$ are bonded to form a C3-C12 divalent acyclic hydrocarbon group which forms a ring together with the adjacent $S^+$, $P^8$ represents a hydrogen atom, $P^9$ represents a C1-C12 alkyl group, a C3-C12 cycloalkyl group or an aromatic group which may be substituted with at least one selected from a C1-C6 alkoxy group, a C2-C20 acyl group and a nitro group; and $R^{22}$ represents a group represented by the formula:

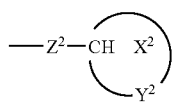

wherein $Z^2$ represents a single bond or —$(CH_2)_g$, g represents an integer of 1 to 4, $Y^2$ represents —$CH_2$—, —CO— or —CH(OH)—; ring $X^2$ represents a C3-C30 monocyclic or polycyclic hydrocarbon group in which a hydrogen atom is substituted with a hydroxyl group at $Y^2$ position when $Y^2$ is —CH(OH)— or in which two hydrogen atoms are substituted with =O at $Y^2$ position when $Y^2$ is —CO—, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group;

<15> The resist composition according to <14>, wherein the group represented by the formula:

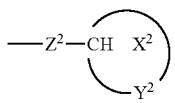

is a group represented by the formula (l), (m) or (n):

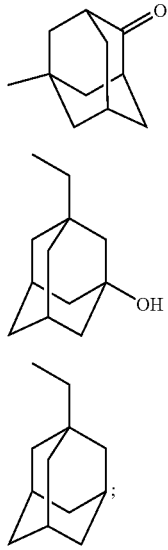

<16> The resist composition according to any one of <1> to <3>, wherein $A^+$ is a cation represented by the formula (Ih):

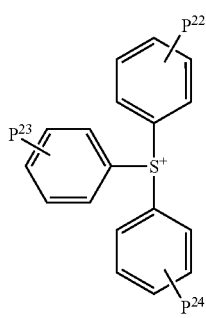

wherein $P^{22}$, $P^{23}$ and $P^{24}$ each independently represent a hydrogen atom or a C1-C4 alkyl group, $R^{21}$ represents a group represented by the formula:

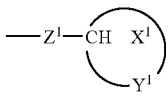

wherein $Z^1$ represents a single bond or —(CH$_2$)$_f$—, f represents an integer of 1 to 4, $Y^1$ represents —CH$_2$—, —CO— or —CH(OH)—; ring $X^1$ represents a C3-C30 monocyclic or polycyclic hydrocarbon group in which a hydrogen atom is substituted with a hydroxyl group at $Y^1$ position when $Y^1$ is —CH(OH)— or in which two hydrogen atoms are substituted with =O at $Y^1$ position when Y is —CO—, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group, and $R^{22}$ represents a group represented by the formula:

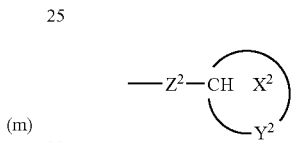

wherein $Z^2$ represents a single bond or —(CH$_2$)$_g$, g represents an integer of 1 to 4, $Y^2$ represents —CH$_2$—, —CO— or —CH(OH)—; ring $X^2$ represents a C3-C30 monocyclic or polycyclic hydrocarbon group in which a hydrogen atom is substituted with a hydroxyl group at $Y^2$ position when $Y^2$ is —CH(OH)— or in which two hydrogen atoms are substituted with =O at $Y^2$ position when $Y^2$ is —CO—, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group;

<17> The resist composition according to <16>, wherein the group represented by the formula:

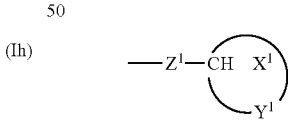

and the group represented by the formula:

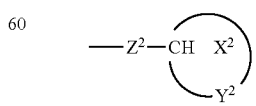

each independently represent a group represented by the formula (l), (m) or (n):

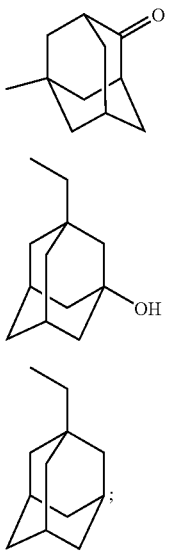

(l)

(m)

(n)

<18> The resist composition according to any one of <1> to <17>, wherein the amount ratio of the salt represented by the formula (I) and the salt represented by the formula (II) is 9/1 to 1/9;

<19> The resist composition according to any one of <1> to <18>, wherein the resin contains a structural unit derived from a monomer having a bulky and acid-labile group;

<20> The resist composition according to <19>, the bulky and acid-labile group is a 2-alkyl-2-adamantyl ester group or a 1-(1-adamantyl 1)-1-alkylalkyl ester group;

<21> The resist composition according to <19>, the monomer having a bulky and acid-labile group is 2-alkyl-2-adamantyl acrylate, 2-alkyl-2-adamantyl methacrylate, 1-(1-adamantyl)-1-alkylalkyl acrylate, 1-(1-adamantyl)-1-alkylalkyl methacrylate, 2-alkyl-2-adamantyl 5-norbornene-2-carboxylate, 1-(1-adamantyl)-1-alkylalkyl 5-norbornene-2-carboxylate, 2-alkyl-2-adamantyl α-chloroacrylate or 1-(1-adamantyl)-1-alkylalkyl α-chloroacrylate;

<22> The resist composition according to any one of <1> to <21>, wherein the resist composition further comprises a basic compound.

DESCRIPTION OF PREFERRED EMBODIMENTS

In the salt represented by the formula (I) (hereinafter, simply referred to as Salt (I)), $R^{21}$ represents a C1-C30 hydrocarbon group which may be substituted, and at least one —CH$_2$— in the hydrocarbon group may be substituted by —CO— or —O—.

The C1-C30 hydrocarbon group may be a linear or branched chain hydrocarbon group. The C1-C30 hydrocarbon group may have a monocyclic or polycyclic structure, and may have an aromatic group or groups. The C1-C30 hydrocarbon group may have a carbon-carbon double bond or bonds.

It is preferred that the C1-C30 hydrocarbon group has at least one cyclic structure, and it is more preferred that the C1-C30 hydrocarbon group has a cyclic structure. Examples of the cyclic structure include a cyclopropane, cyclohexane, cyclooctane, norbornane, adamantane, cyclohexene, benzene, naphthalene, anthracene, phenanthrene and fluorene structure.

Examples of the substituent include a C1-C6 alkyl group, a C1-C6 alkoxy group, a C1-C4 perfluoroalkyl group, a C1-C6 hydroxyalkyl group, a hydroxyl group or a cyano group, and the hydroxyl group is preferable as the substituent.

Examples of the C1-C6 alkyl group include a methyl, ethyl, n-propyl, isopropyl, n-butyl, isobutyl, sec-butyl, tert-butyl, n-pentyl and n-hezyl group. Examples of the C1-C6 alkoxy group include a methoxy, ethoxy, n-propoxy, isopropoxy, n-butoxy, isobutoxy, sec-butoxy, tert-butoxy, n-pentyloxy and n-hexyloxy group. Examples of the C1-C4 perfluoroalkyl group include a trifluoromethyl, pentafluoroethyl, heptafluoropropyl and nonafluorobutyl group. Examples of the C1-C6 hydroxyalkyl group include a hydroxymethyl, 2-hydroxyethyl, 3-hydroxypropyl, 4-hydroxybutyl and 6-hydroxyhexyl group.

$Q^1$ and $Q^2$ each independently represent a fluorine atom or a C1-C6 perfluoroalkyl group. Examples of the C1-C6 perfluoroalkyl group include a trifluoromethyl, pentafluoroethyl, heptafluoropropyl, nonafluorobutyl undecafluoropentyl and tridecafluorohexyl group, and the trifluoromethyl group is preferable.

It is preferable that $Q^1$ and $Q^2$ each independently represent the fluorine atom or the trifluoromethyl group, and it is more preferable that $Q^1$ and $Q^2$ represent the fluorine atoms.

Specific examples of the anion part of Salt (I) include the followings.

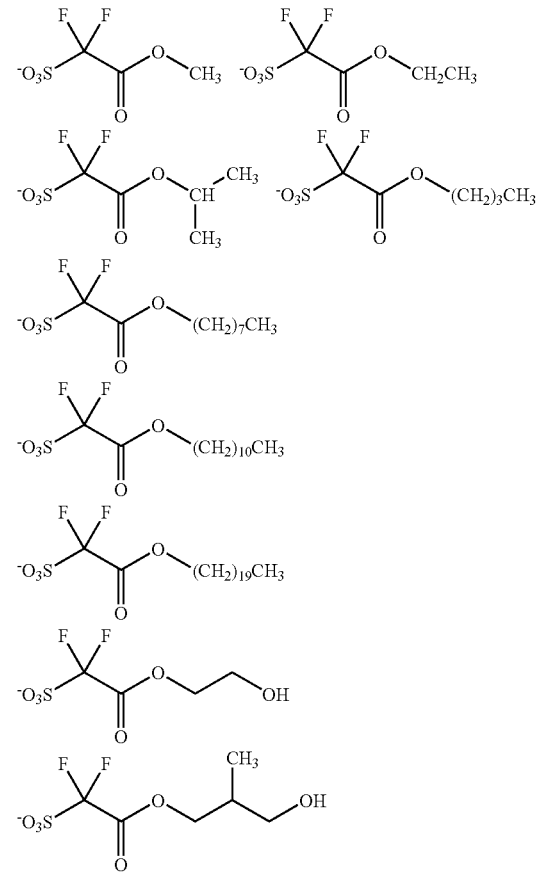

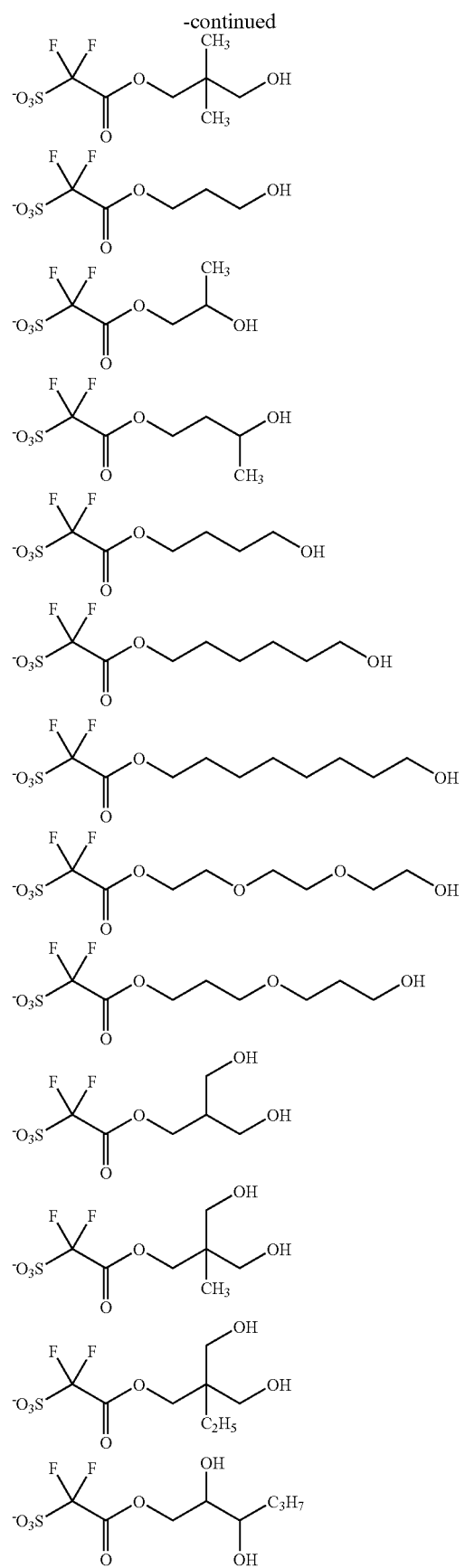

-continued
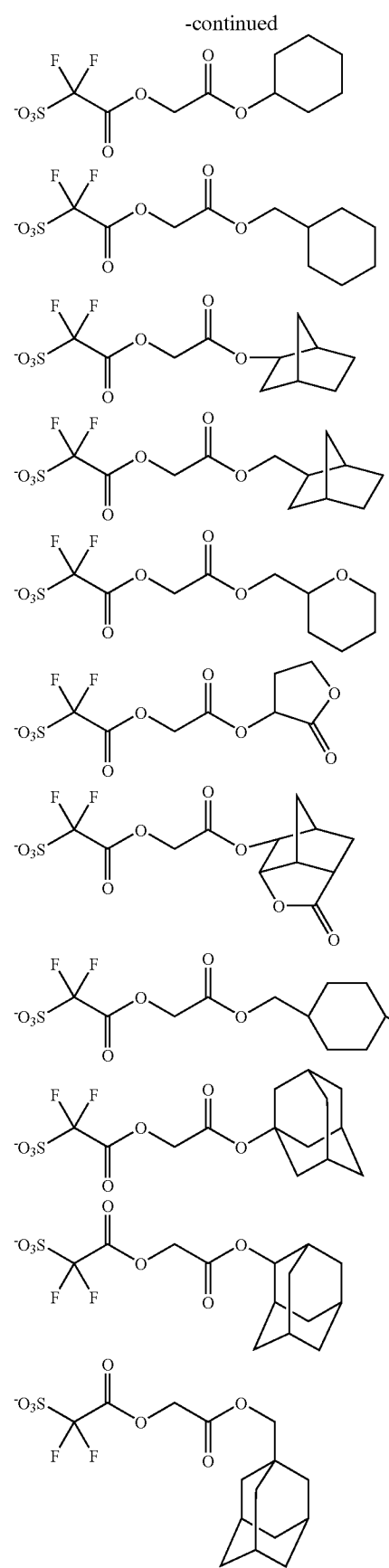
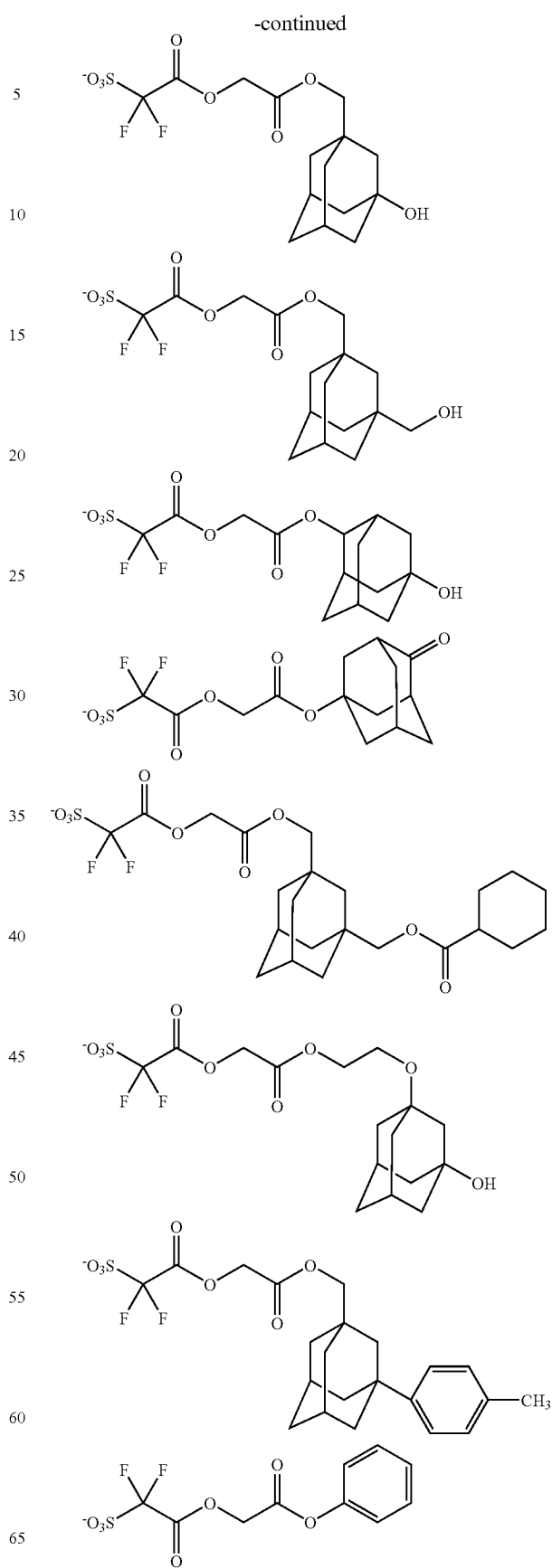

-continued
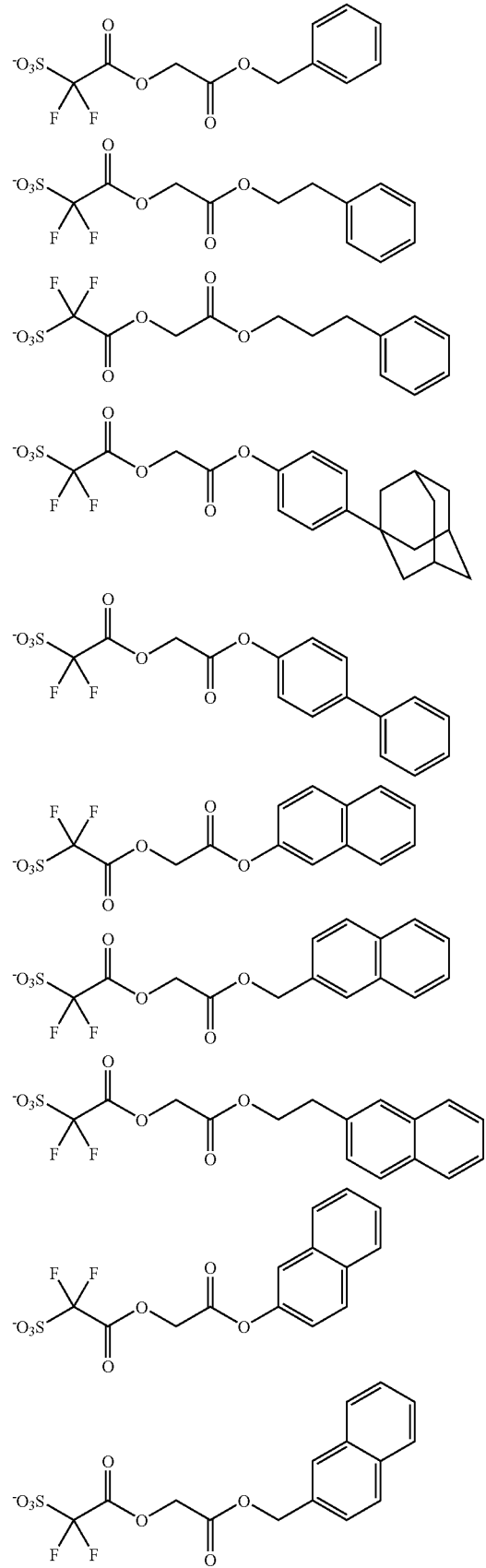
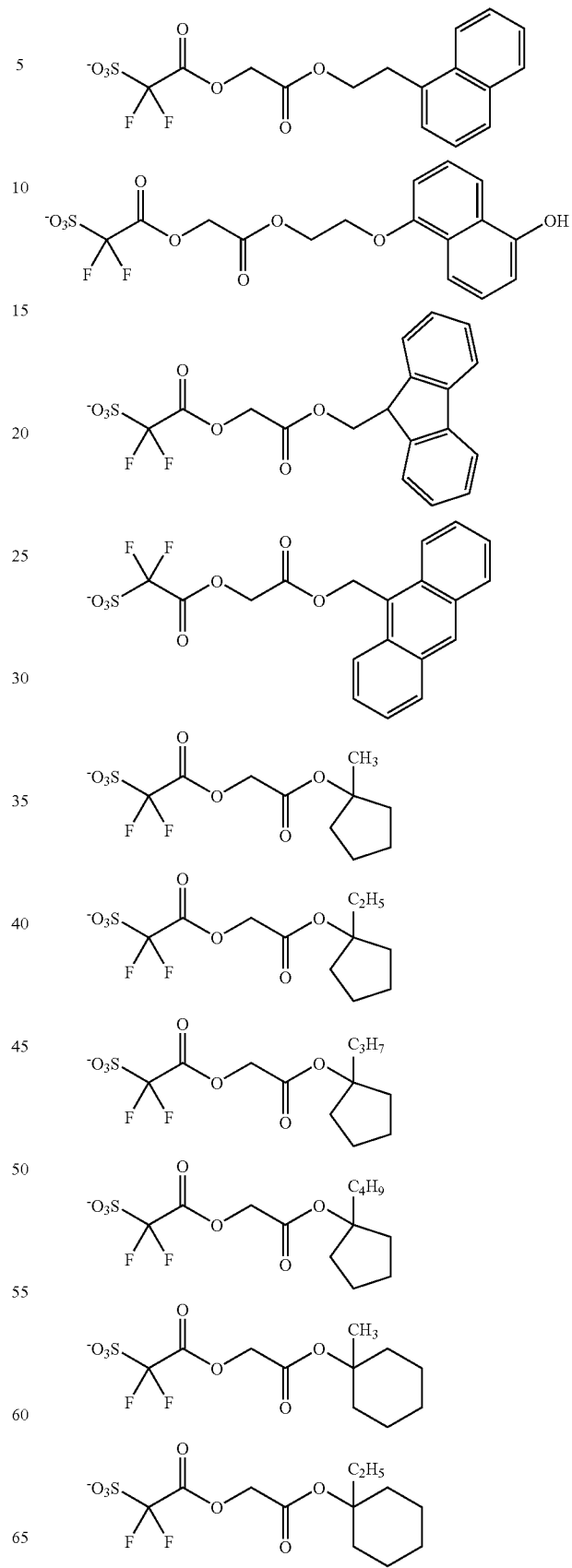

-continued
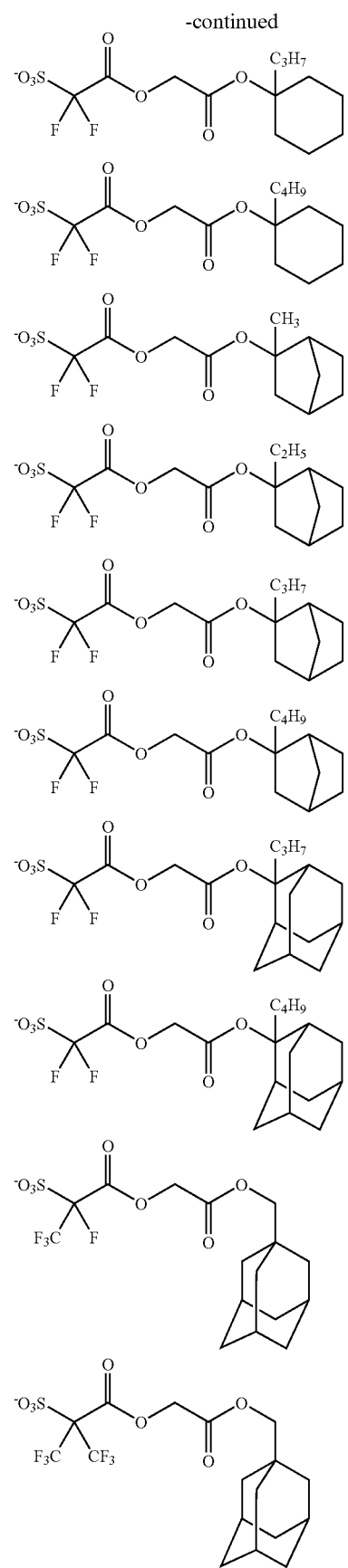
-continued
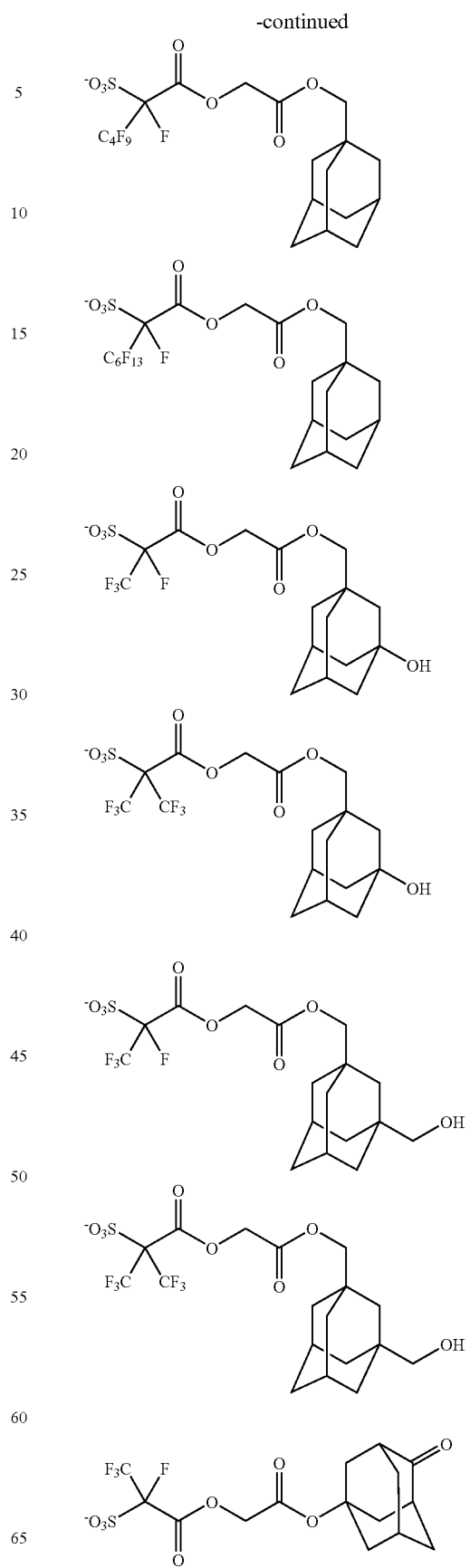

-continued
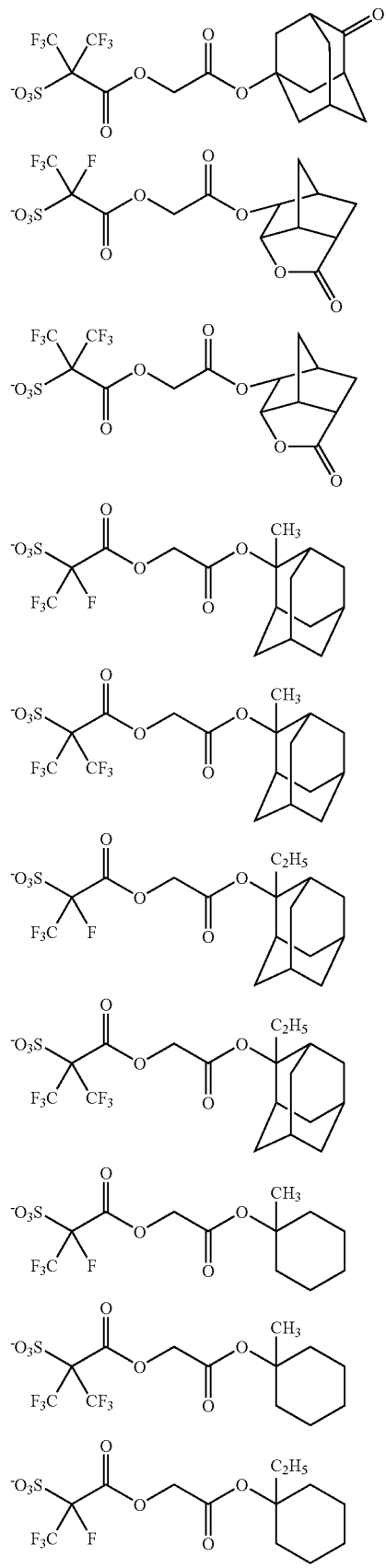
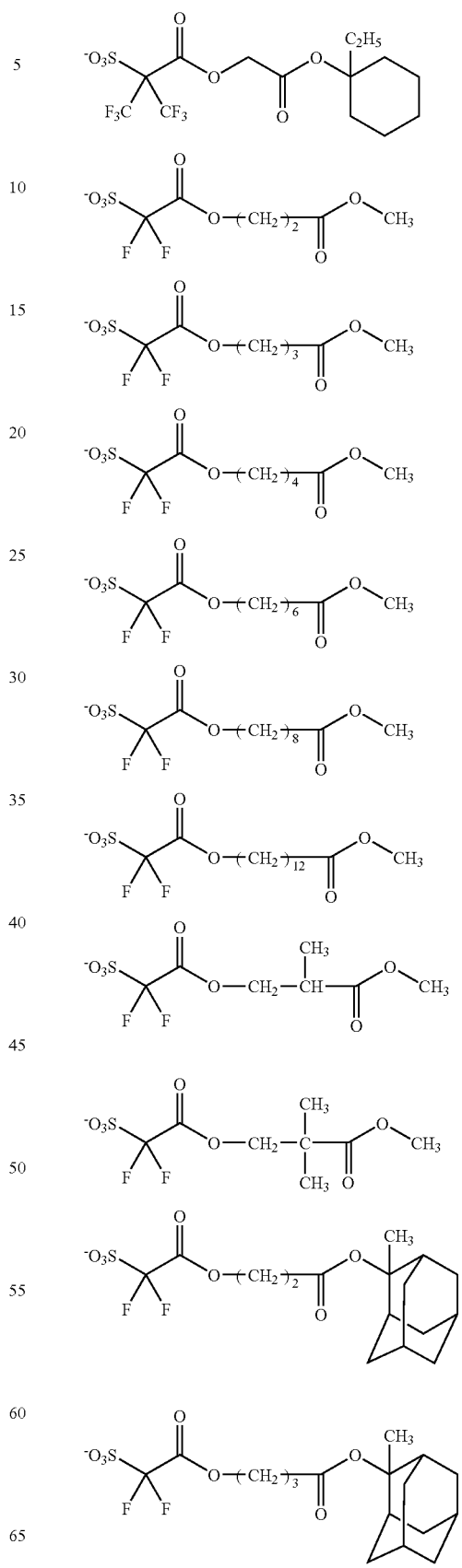

-continued
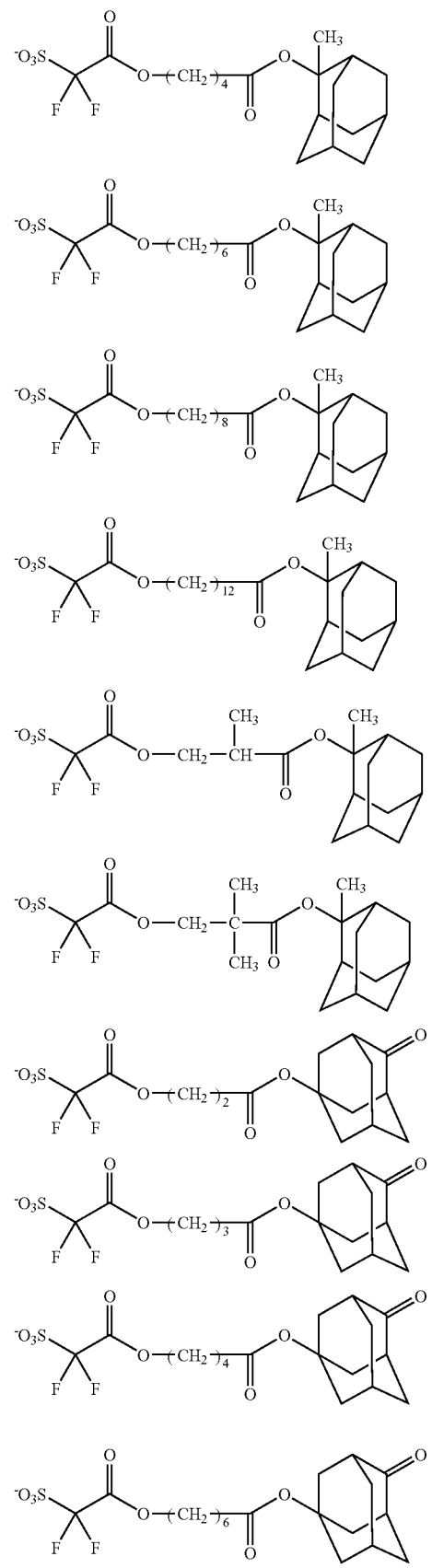
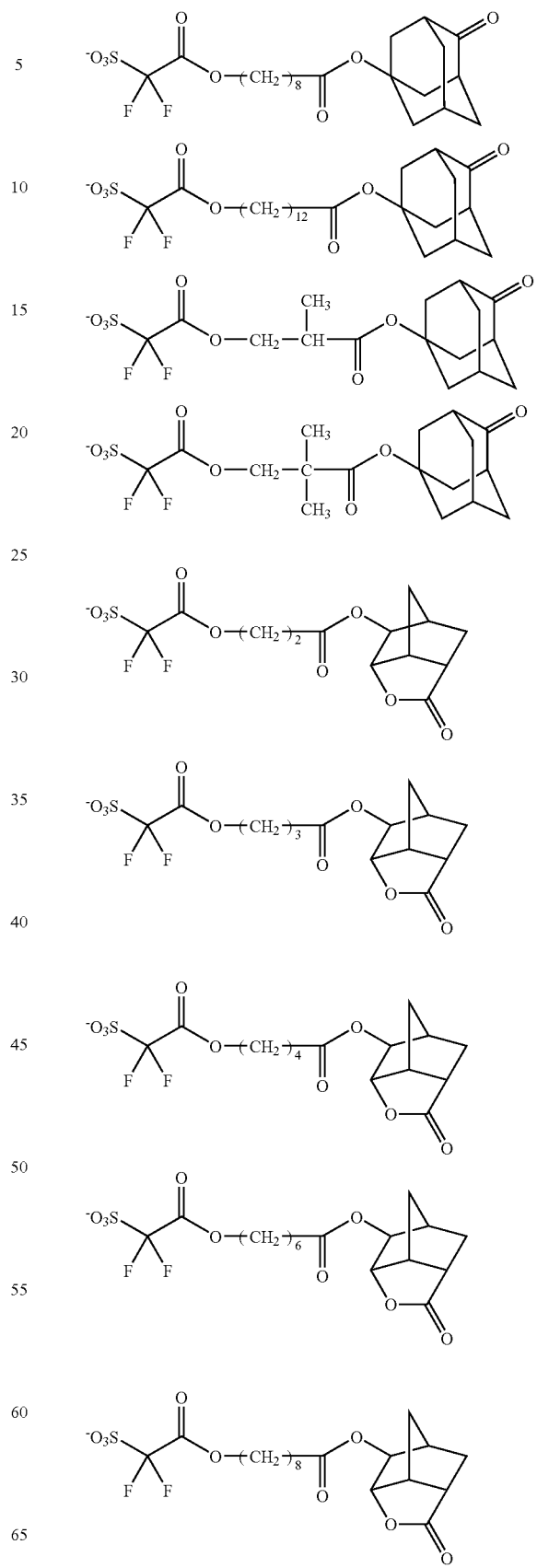

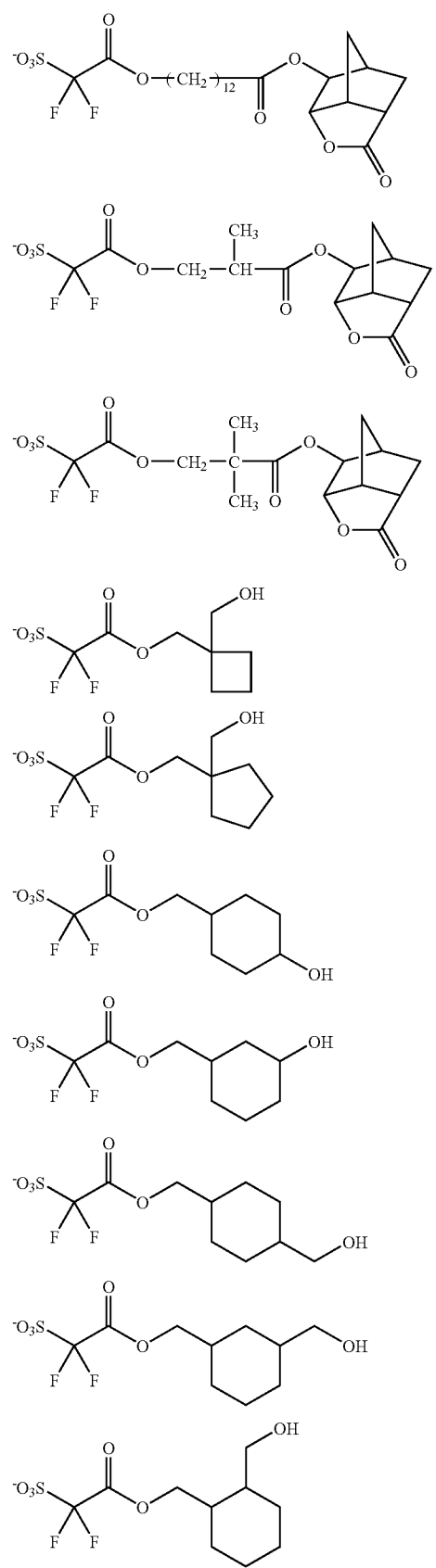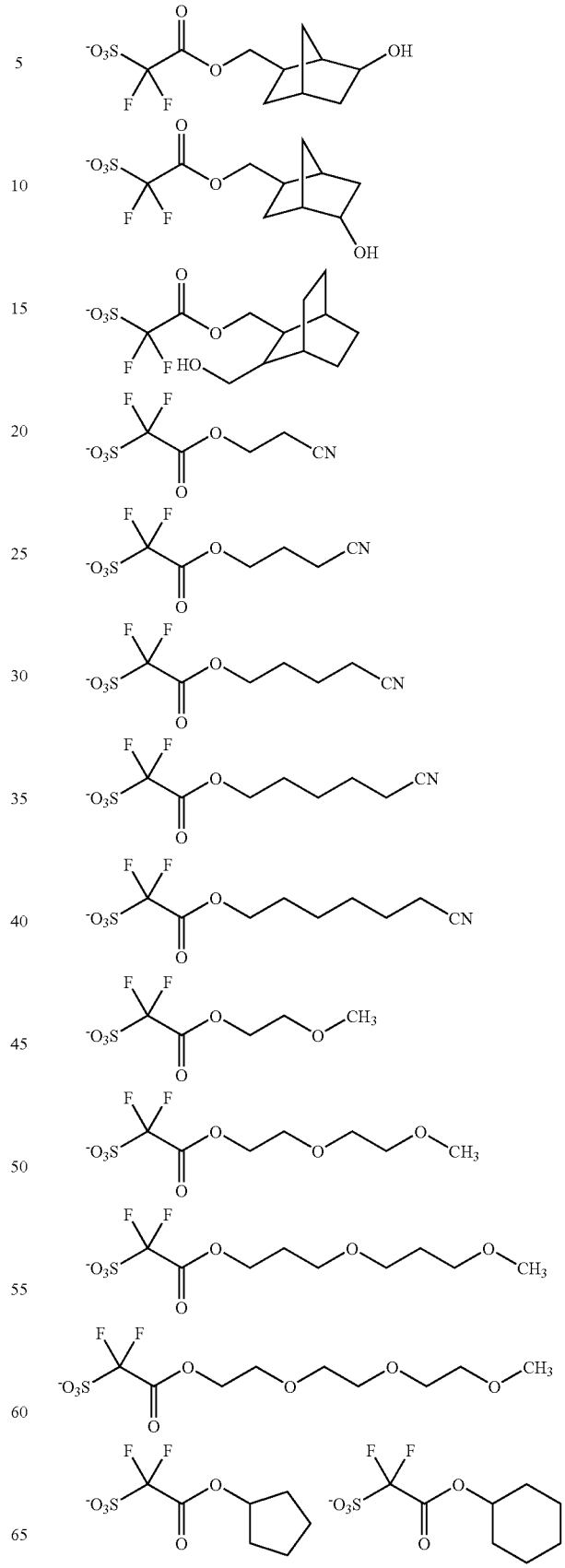

-continued
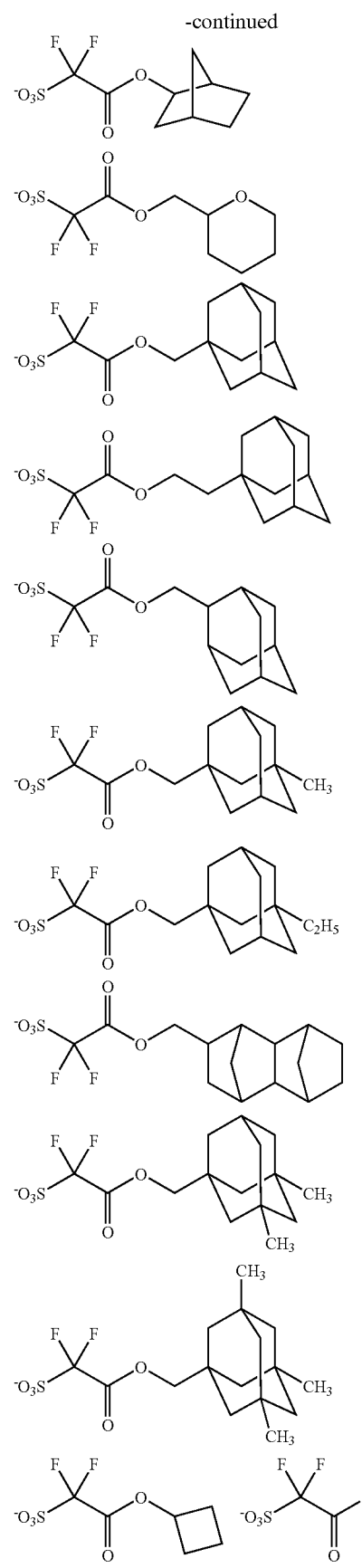
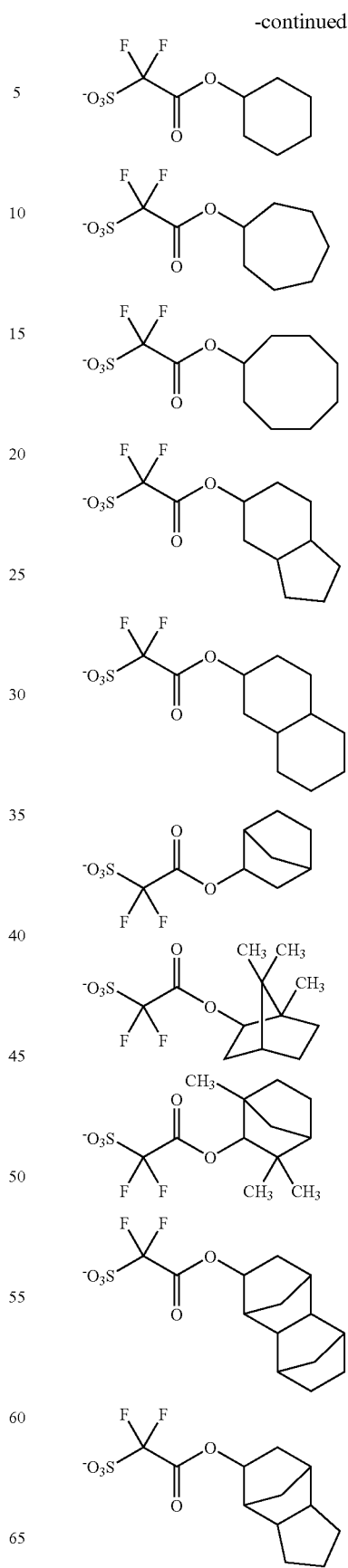

-continued
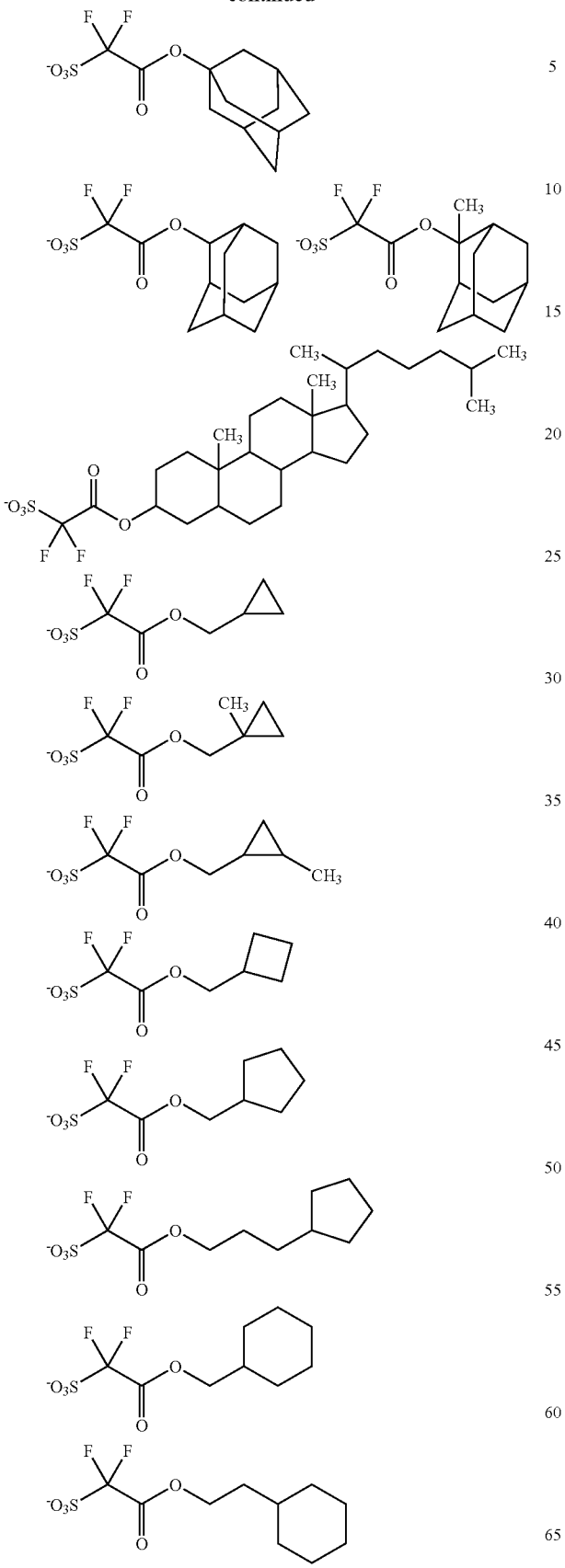
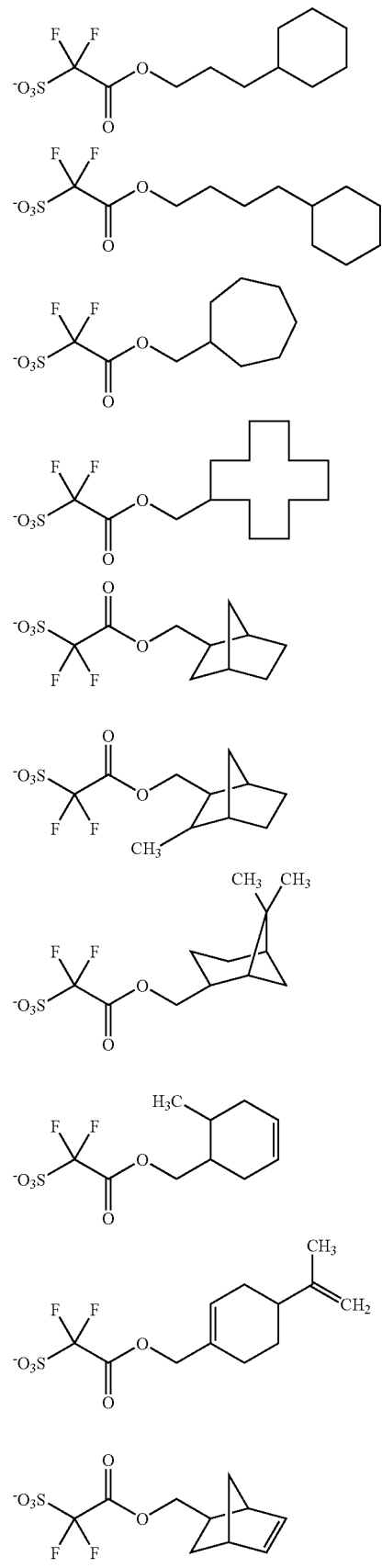

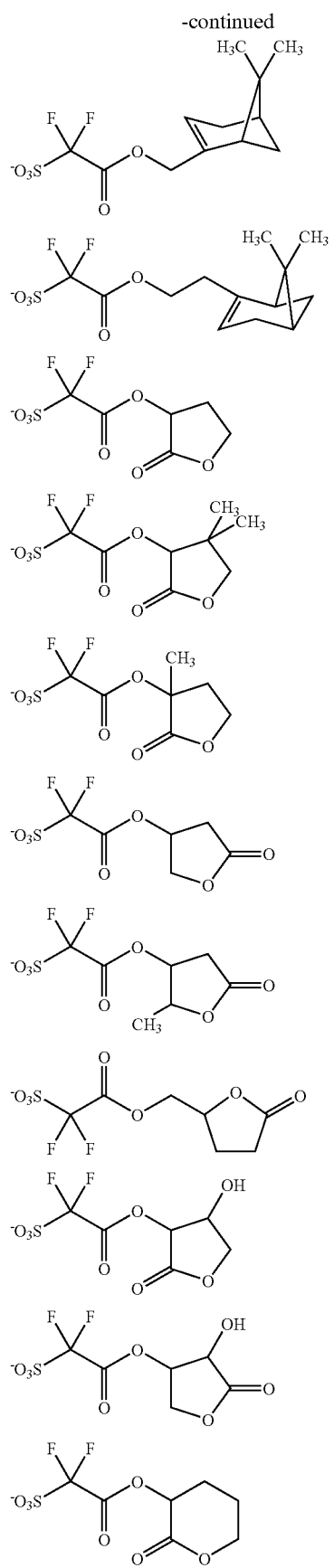
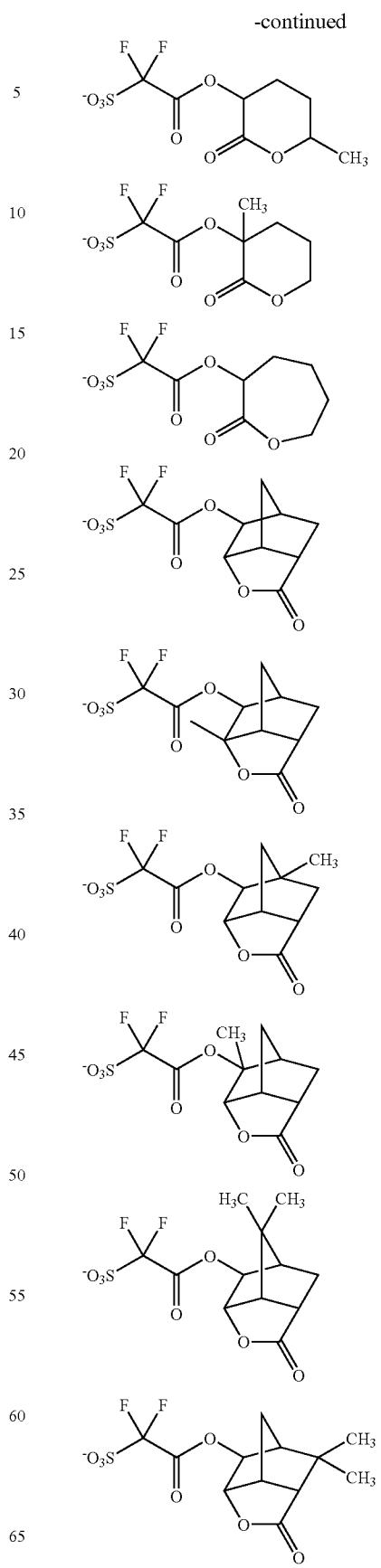

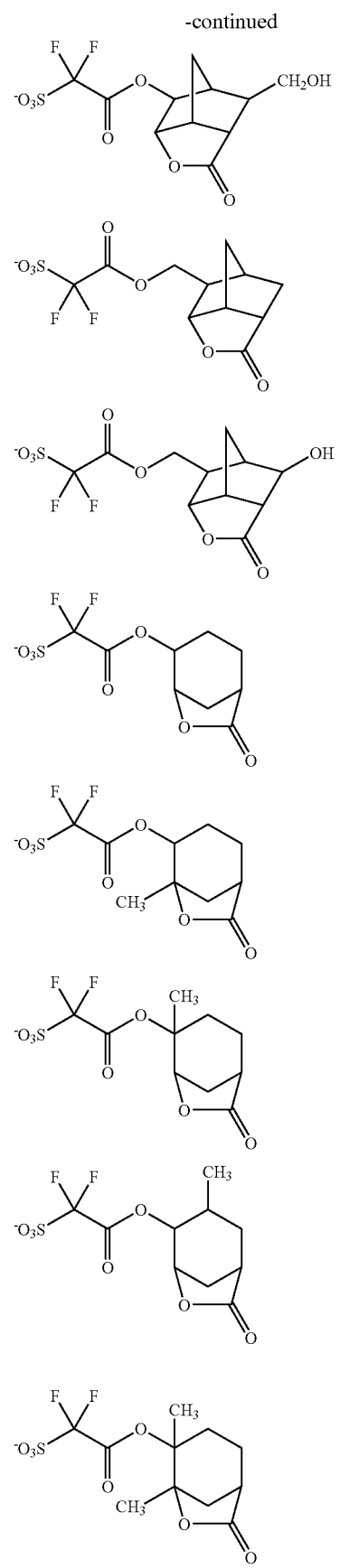
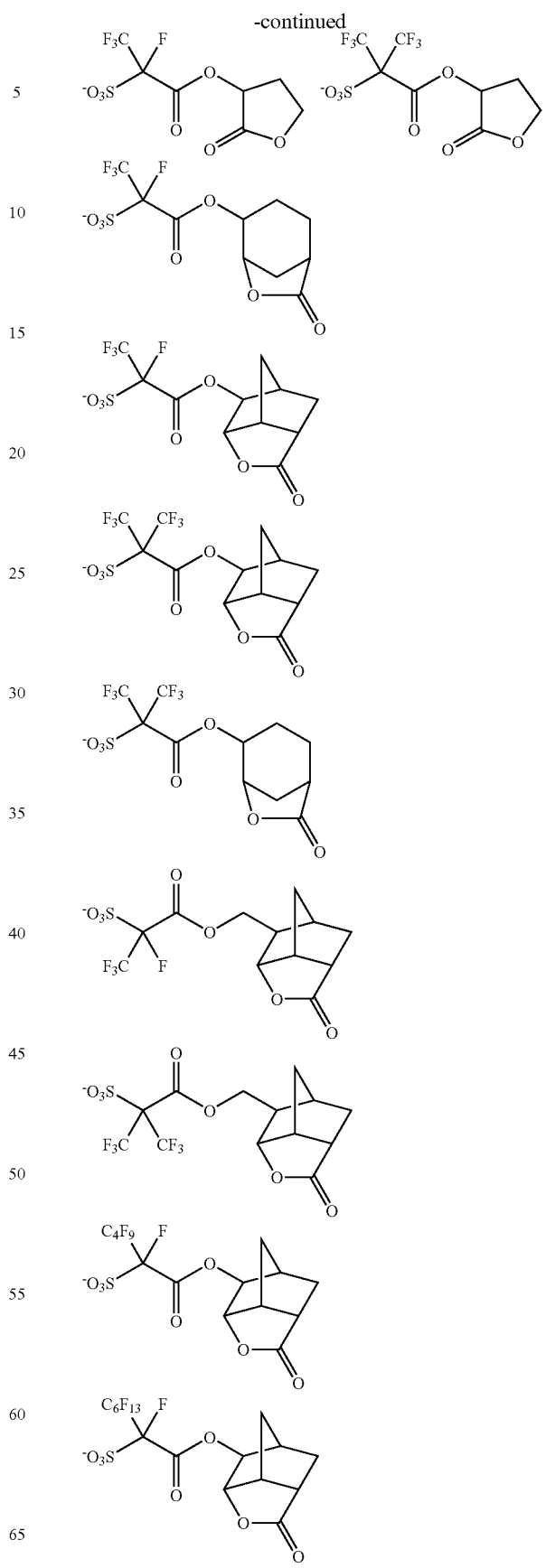

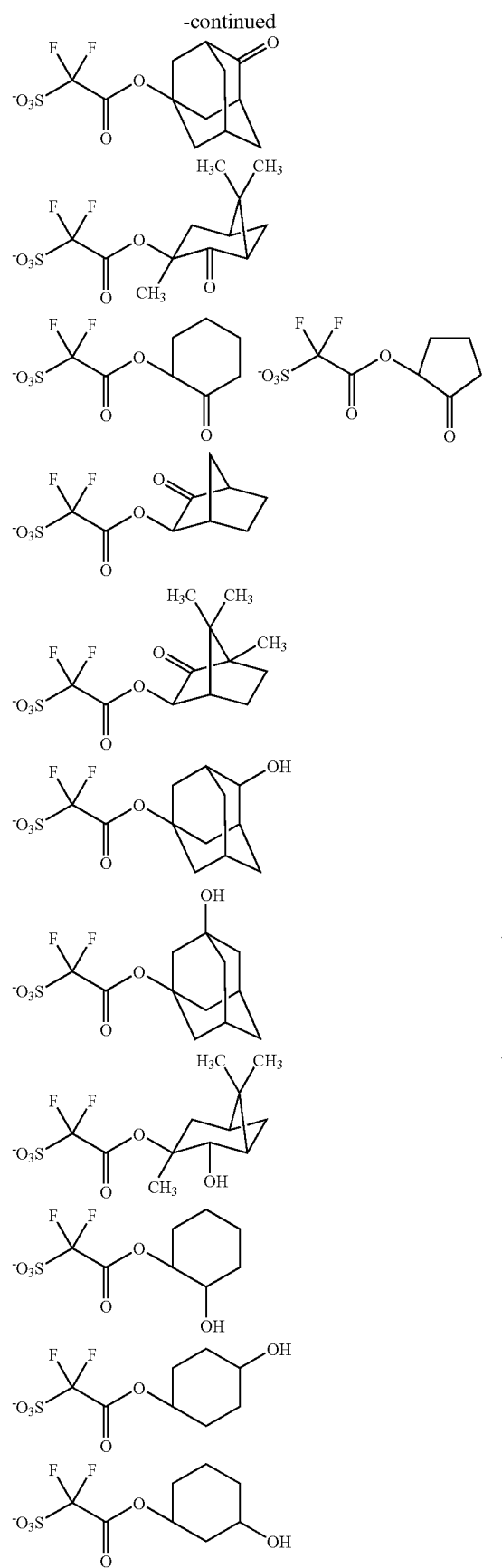
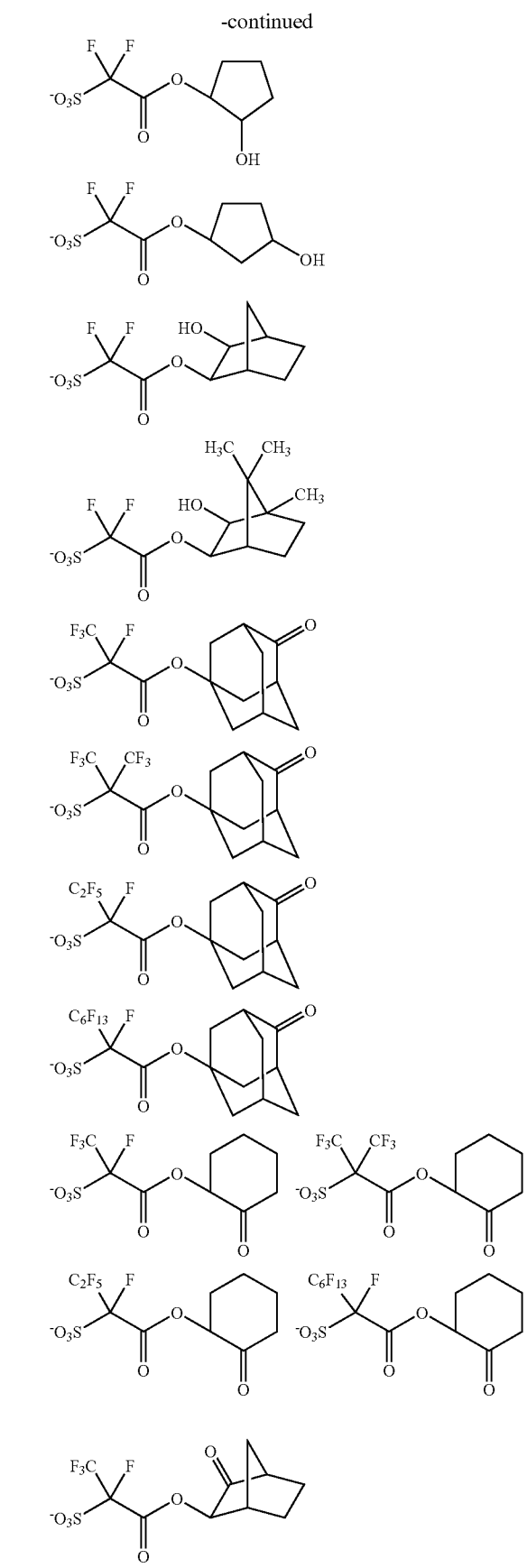

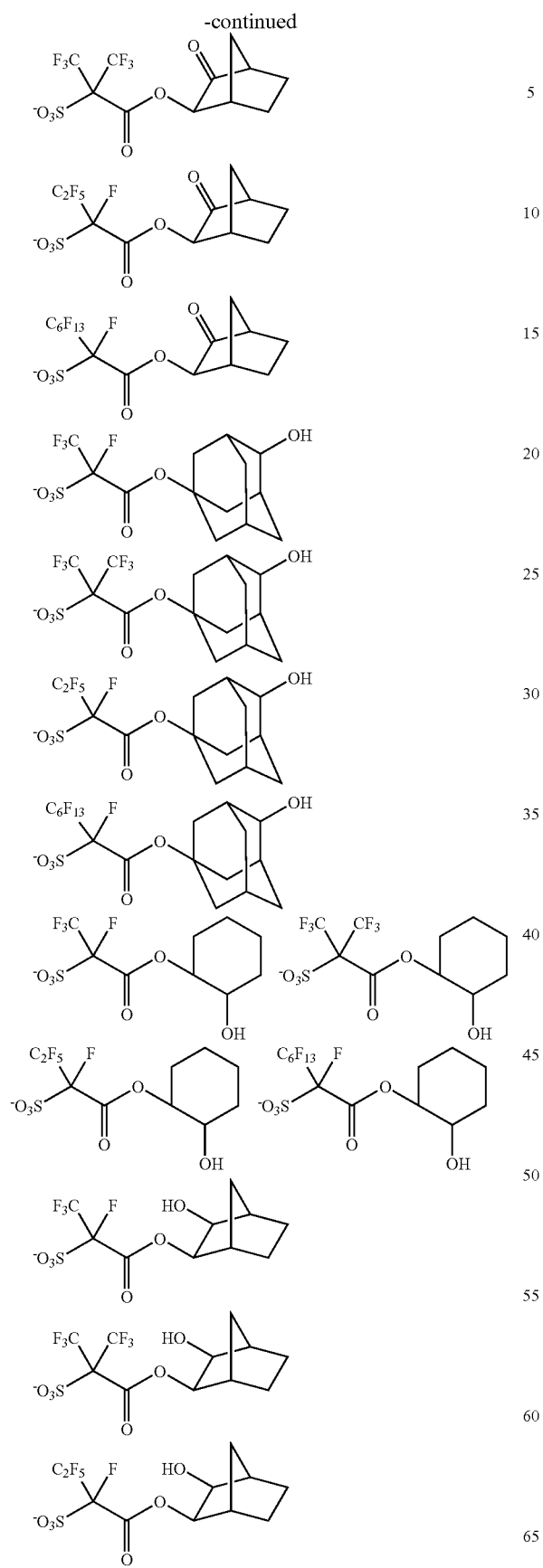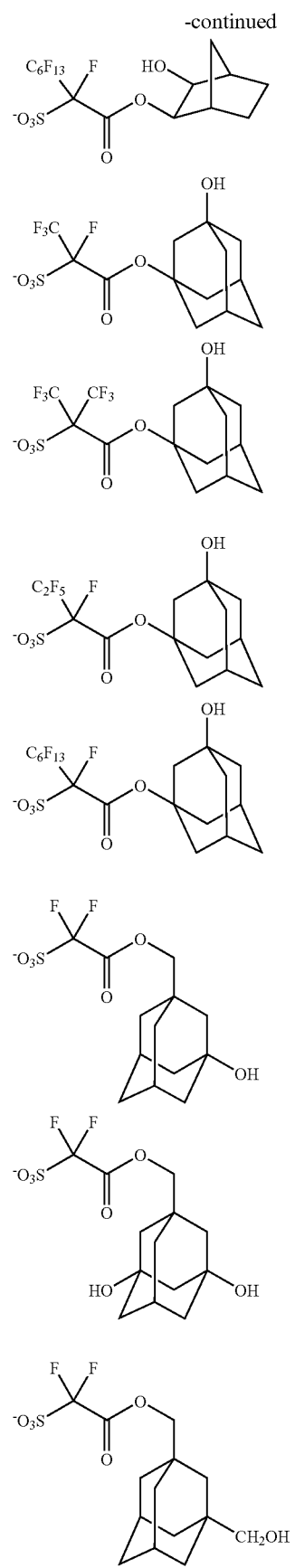

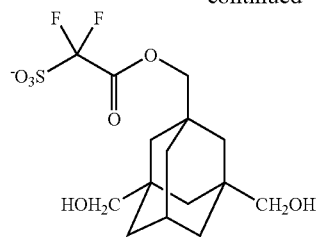
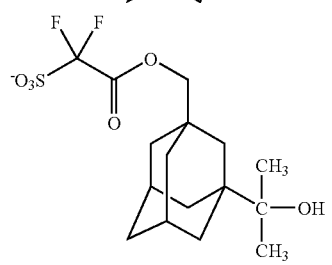
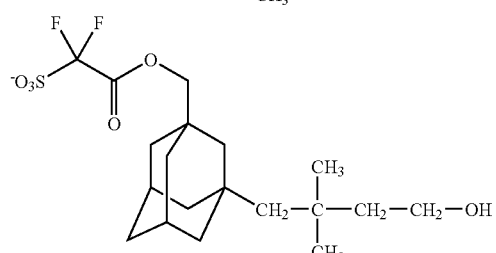
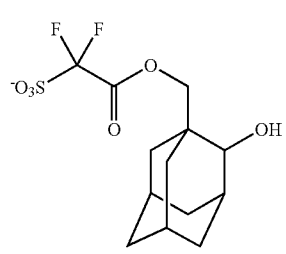
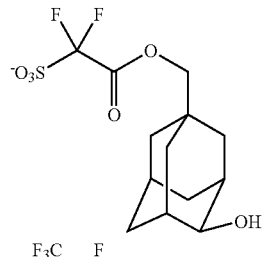
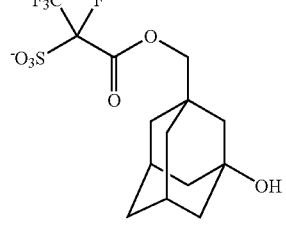
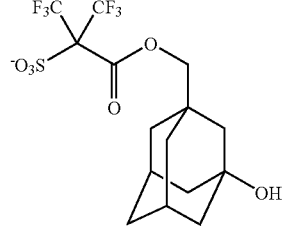
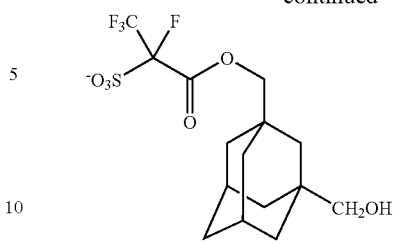
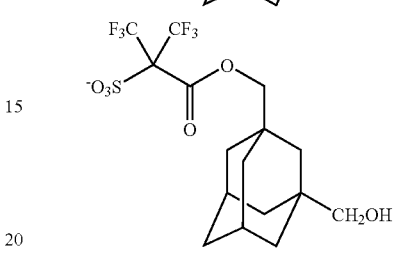
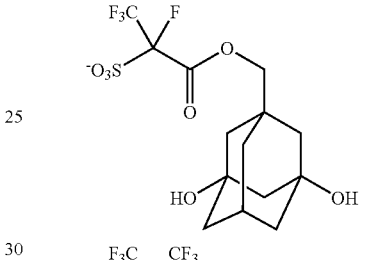
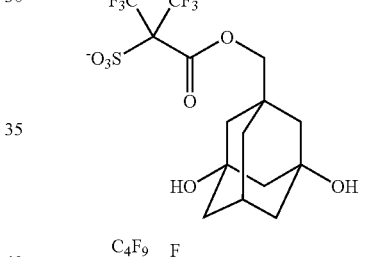
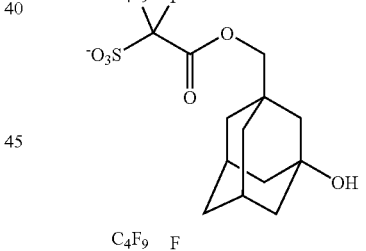
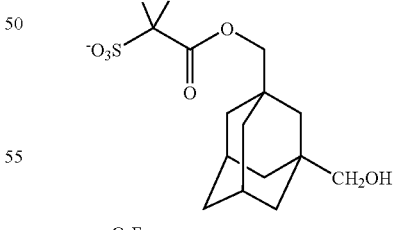
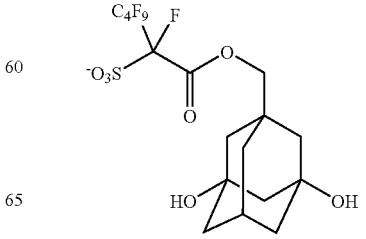

-continued
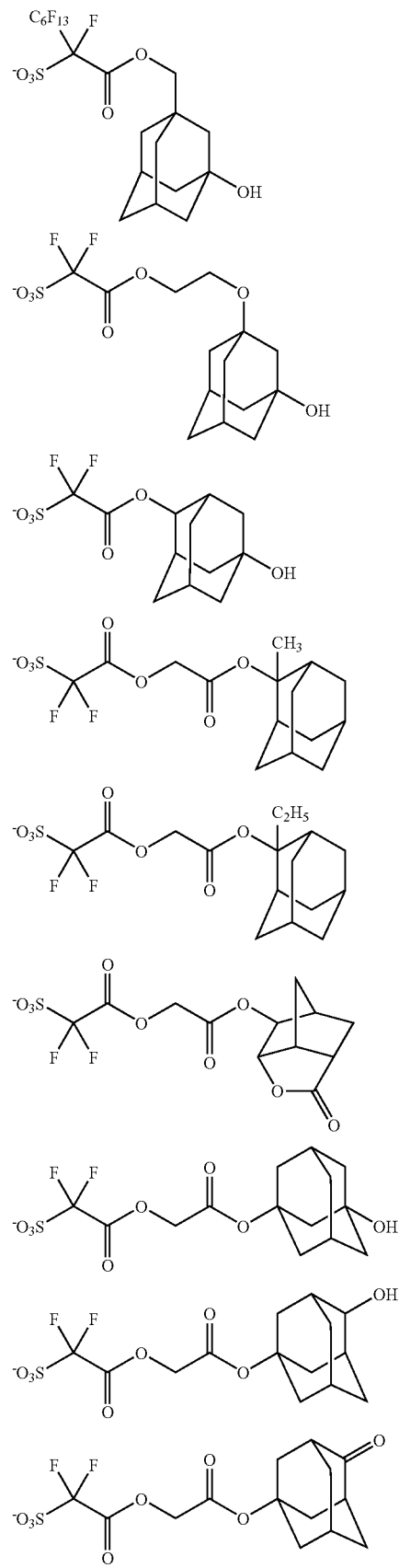
-continued
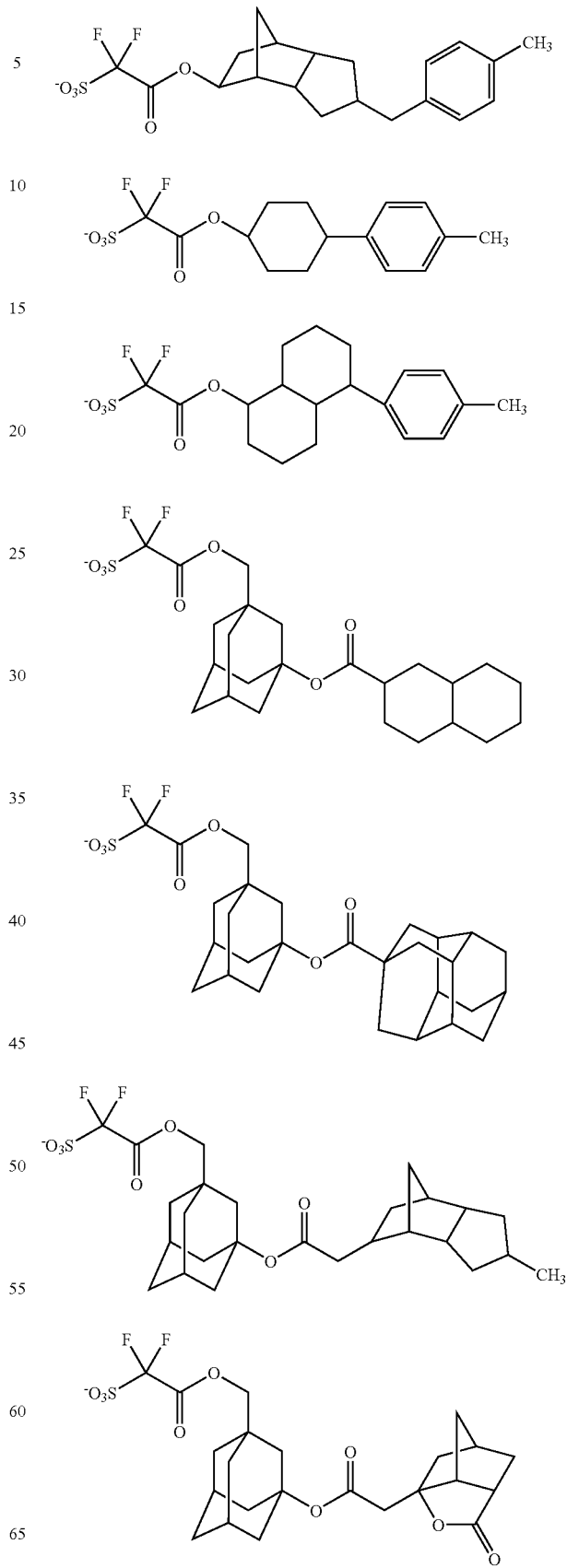

-continued
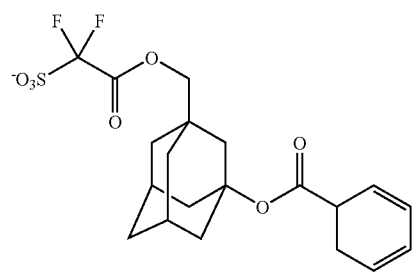
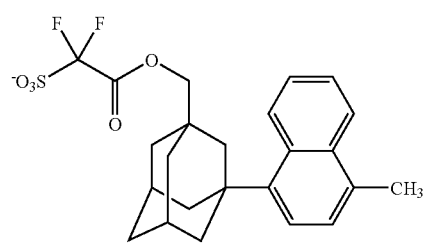
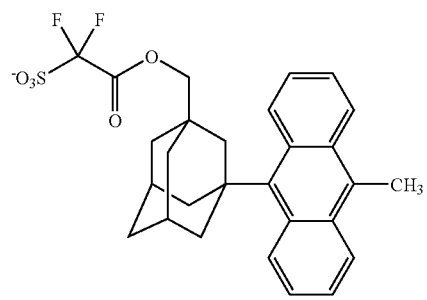
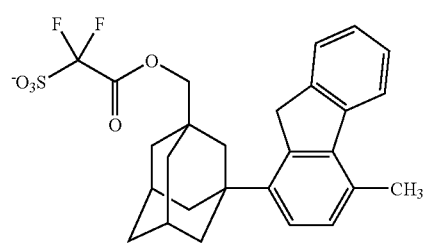
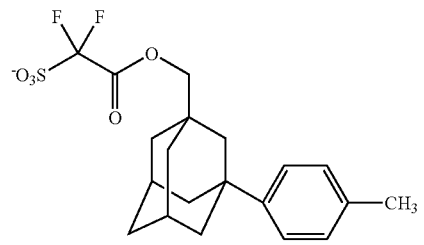
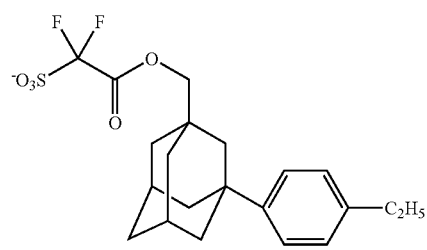
-continued
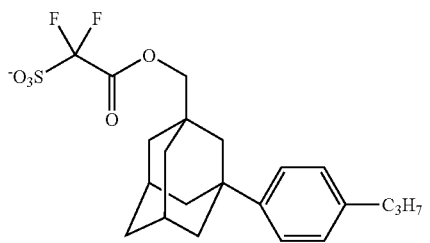
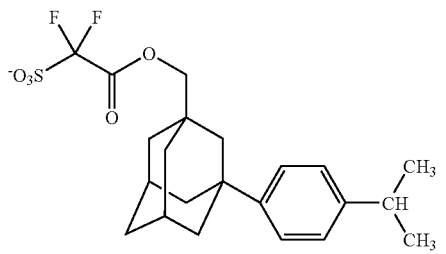
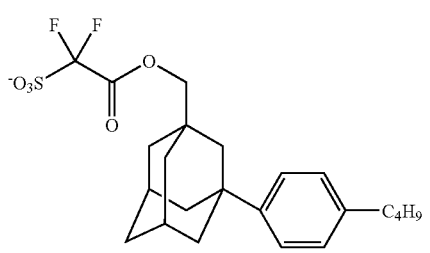
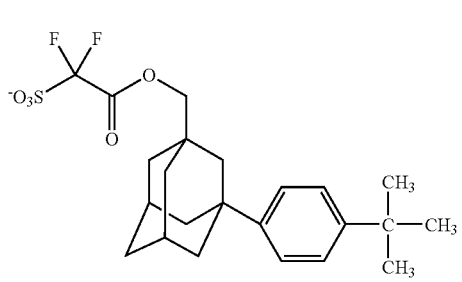
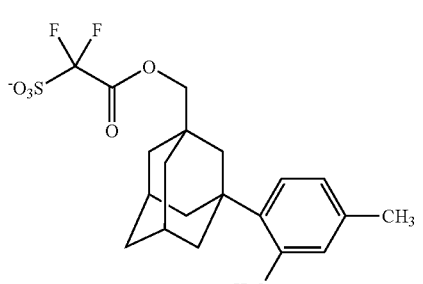
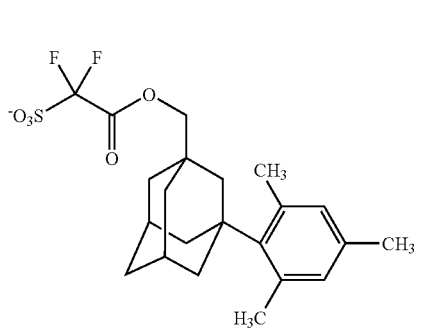

-continued
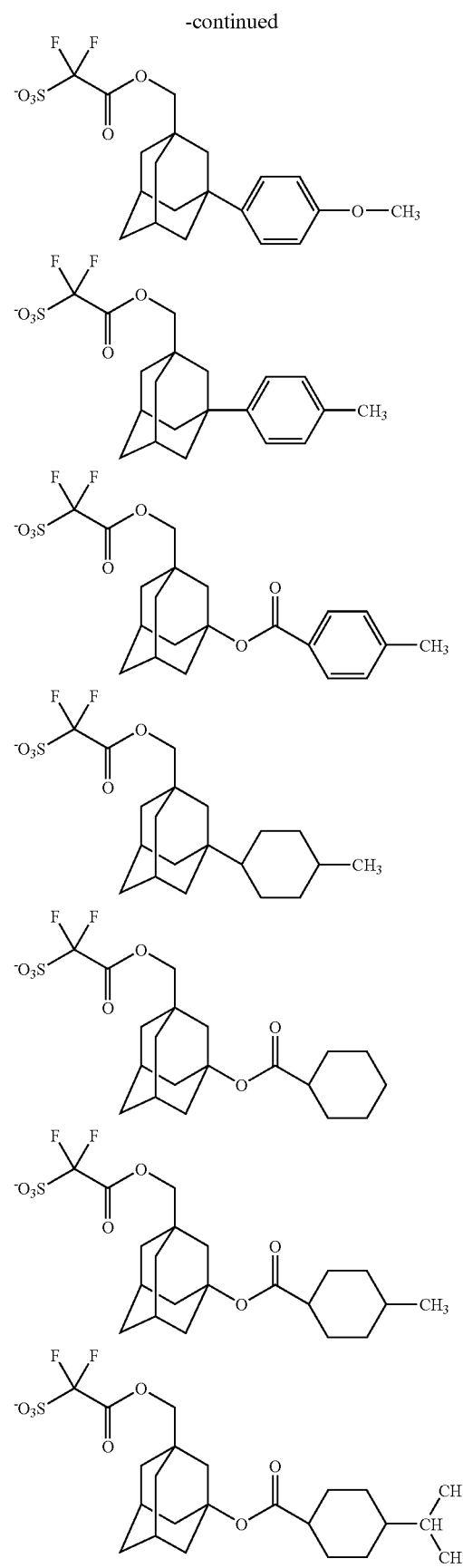
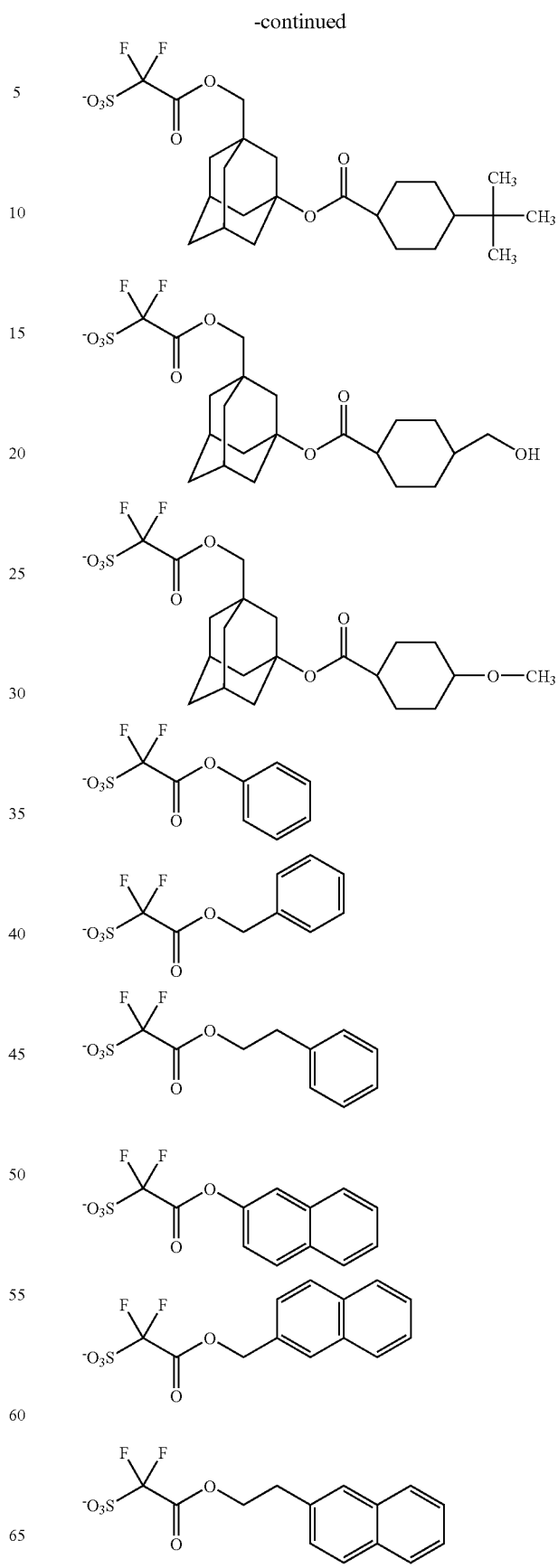

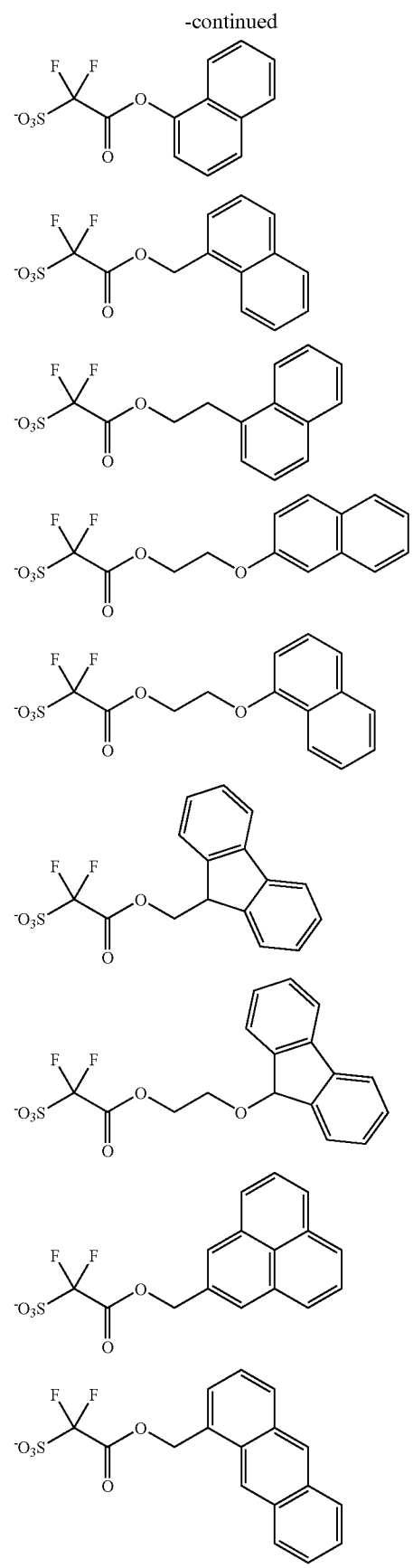
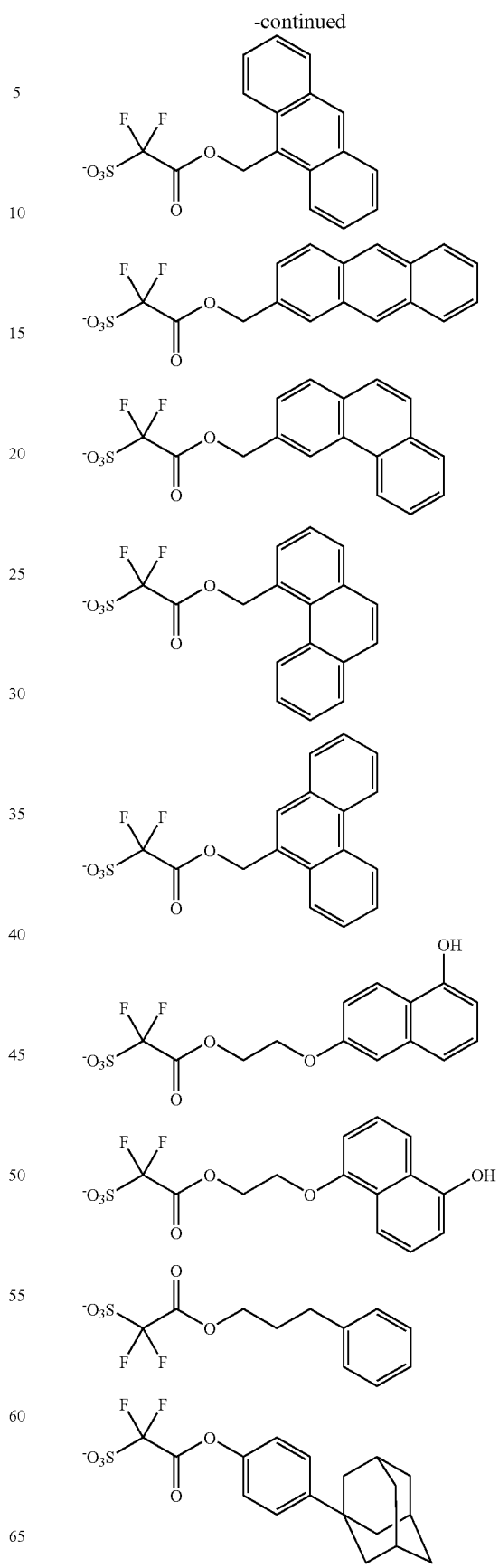

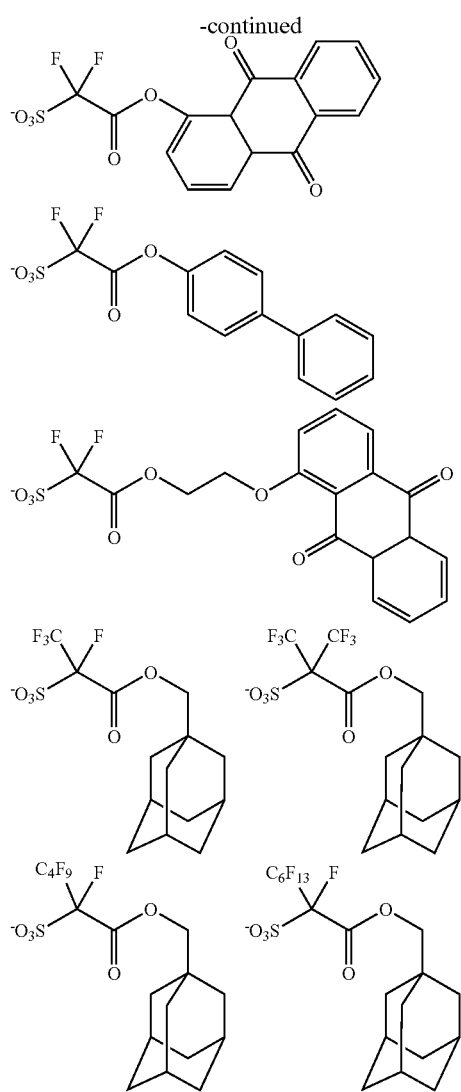

It is preferred that R[21] represents a group represented by the formula:

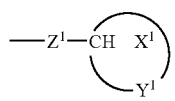

wherein $Z^1$ represents a single bond or —(CH$_2$)$_f$—, f represents an integer of 1 to 4, $Y^1$ represents —CH$_2$—, —CO— or —CH(OH)—; ring $X^1$ represents a C3-C30 monocyclic or polycyclic hydrocarbon group in which a hydrogen atom is substituted with a hydroxyl group at $Y^1$ position when $Y^1$ is —CH(OH)— or in which two hydrogen atoms are substituted with =O at $Y^1$ position when $Y^1$ is —CO—, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group.

Examples of the C1-C6 alkyl group include a methyl, ethyl, n-propyl, isopropyl, n-butyl, isobutyl, sec-butyl, tert-butyl, n-pentyl and n-hezyl group. Examples of the C1-C6 alkoxy group include a methoxy, ethoxy, n-propoxy, isopropoxy, n-butoxy, isobutoxy, sec-butoxy, tert-butoxy, n-pentyloxy and n-hexyloxy group. Examples of the C1-C4 perfluoroalkyl group include a trifluoromethyl, pentafluoroethyl, heptafluoropropyl and nonafluorobutyl group. Examples of the C1-C6 hydroxyalkyl group include a hydroxymethyl, 2-hydroxyethyl, 3-hydroxypropyl, 4-hydroxybutyl and 6-hydroxyhexyl group.

Examples of the ring $X^1$ include a C4-C8 cycloalkyl group such as a cyclobutyl, cyclopentyl, cyclohexyl and cyclooctyl group, an adamantyl group, and a norbornyl group, in which a hydrogen atom may be substituted with a hydroxyl group or in which two hydrogen atoms may be substituted with =O, and in which at least one hydrogen atom may be substituted with the C1-C6 alkyl group, the C1-C6 alkoxy group, the C1-C4 perfluoroalkyl group, the C1-C6 hydroxyalkyl group, the hydroxyl group or the cyano group.

Specific examples of the ring $X^1$ include a 2-oxocyclopentyl group, a 2-oxocyclohexyl group, a 3-oxocyclopentyl group, a 3-oxocyclohexyl group, a 4-oxocyclohexyl group, a 2-hydroxycyclopentyl group, a 2-hydroxycyclohexyl group, a 3-hydroxycyclopentyl group, a 3-hydroxycyclohexyl group, a 4-hydroxycyclohexyl group, a 4-oxo-2-adamantyl group, a 3-hydroxy-1-adamantyl group, a 4-hydroxy-1-adamantyl group, a 5-oxonorbornan-2-yl group, a 1,7,7-trimethyl-2-oxonorbornan-2-yl group, a 3,6,6-trimethyl-2-oxobicyclo[3.1.1]heptan-3-yl group, a 2-hydroxy-norbornan-3-yl group, a 1,7,7-trimethyl-2-hydroxynorbornan-3-yl group, a 3,6,6-trimethyl-2-hydroxybicyclo[3.1.1]heptan-3-yl group,

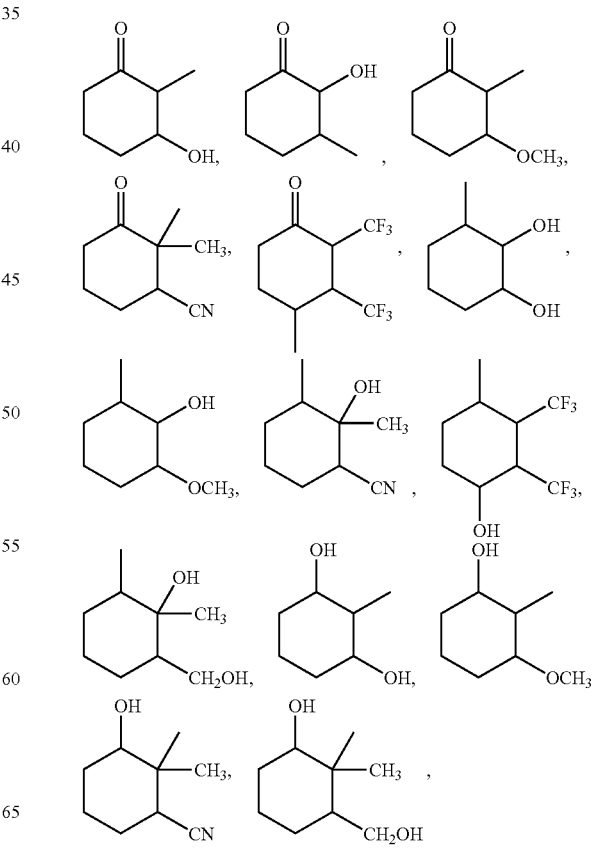

-continued

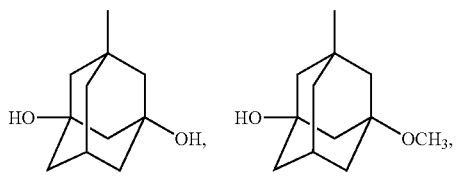

and the like.

In the formulae above, straight line with an open end shows a bond which is extended from an adjacent group.

As the ring $X^1$, the adamantane ring is preferable. The group represented by the following formulae (l), (m) or (n):

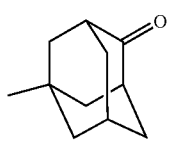
(l)

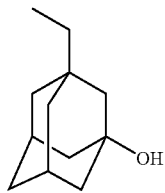
(m)

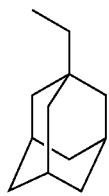
(n)

is preferable as $R^{21}$. In the above formulae (l), (m) and (n), straight line with an open end shows a bond which is extended from an adjacent group.

$A^+$ represents at least one organic cation selected from a cation represented by the formula (Ia):

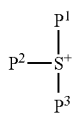
(Ia)

wherein $P^1$, $P^2$ and $P^3$ each independently represent a C1-C30 alkyl group which may be substituted with at least one selected from a hydroxyl group, a C3-C12 cyclic hydrocarbon group and a C1-C12 alkoxy group, or a C3-C30 cyclic hydrocarbon group which may be substituted with at least one selected from a hydroxyl group and a C1-C12 alkoxy group (hereinafter, simply referred to as the cation (Ia)), a cation represented by the formula (Ib):

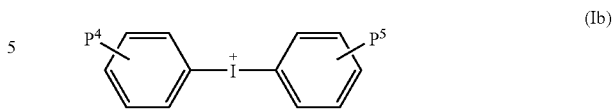
(Ib)

wherein $P^4$ and $P^5$ each independently represent a hydrogen atom, a hydroxyl group, a C1-C12 alkyl group or a C1-C12 alkoxy group (hereinafter, simply referred to as the cation (Ib)), and a cation represented by the formula (Ic):

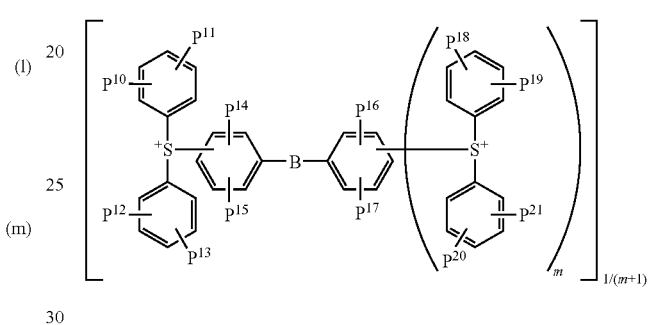
(Ic)

wherein $P^{10}$, $P^{11}$, $P^{12}$, $P^{13}$, $P^{14}$, $P^{15}$, $P^{16}$, $P^{17}$, $P^{18}$, $P^{19}$, $P^{20}$ and $P^{21}$ each independently represent a hydrogen atom, a hydroxyl group, a C1-C12 alkyl group or a C1-C12 alkoxy group, B represents a sulfur or oxygen atom and m represents 0 or 1 (hereinafter, simply referred to as the cation (Ic)).

Examples of the C1-C12 alkoxy group in the cations (Ia), (Ib) and (Ic) include a methoxy, ethoxy, n-propoxy, isopropoxy, n-butoxy, isobutoxy, sec-butoxy, tert-butoxy, n-pentyloxy, n-hexyloxy, n-octyloxy and 2-ethylhexyloxy group.

Examples of the C3-C12 cyclic hydrocarbon group in the cation (Ia) include a cyclopentyl, cyclohexyl, 1-adamantyl, 2-adamantyl, phenyl, 2-methylphenyl, 4-methylphenyl, 1-naphthyl and 2-naphthyl group.

Examples of the C1-C30 alkyl group which may be substituted with at least one selected from the hydroxyl group, the C3-C12 cyclic hydrocarbon group and the C1-C12 alkoxy group in the cation (Ia) include a methyl, ethyl, n-propyl, isopropyl, n-butyl, isobutyl, sec-butyl, tert-butyl, n-pentyl, n-hexyl, n-octyl, 2-ethylhexyl and benzyl group.

Examples of the C3-C30 cyclic hydrocarbon group which may be substituted with at least one selected from the hydroxyl group and the C1-C12 alkoxy group in the cation (Ia) include a cyclopentyl, cyclohexyl, 1-adamantyl, 2-adamantyl, bicyclohexyl, phenyl, 2-methylphenyl, 4-methylphenyl, 4-ethylphenyl, 4-isopropylphenyl, 4-tert-butylphenyl, 2,4-dimethylphenyl, 2,4,6-trimethylphenyl, 4-n-hexylphenyl, 4-n-octylphenyl, 1-naphthyl, 2-naphthyl, fluorenyl, 4-phenylphenyl, 4-hydroxyphenyl, 4-methoxyphenyl, 4-tert-butoxyphenyl, 4-n-hexyloxyphenyl group.

Examples of the C1-C12 alkyl group in the cations (Ib) and (Ic) include a methyl, ethyl, n-propyl, isopropyl, n-butyl, isobutyl, sec-butyl, tert-butyl, n-pentyl, n-hexyl, n-octyl and 2-ethylhexyl group.

Examples of the cation (Ia) include the followings:
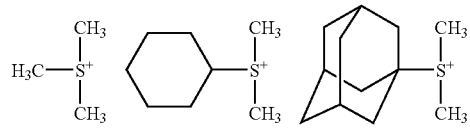
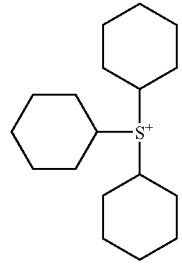
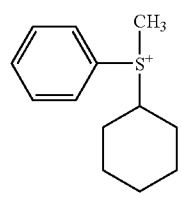
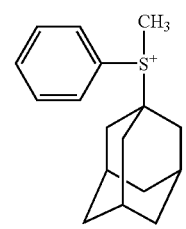
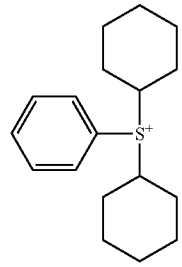
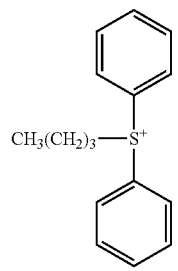
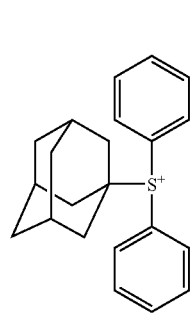
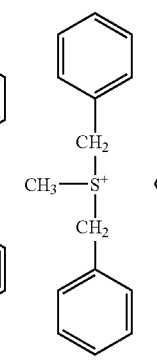
-continued
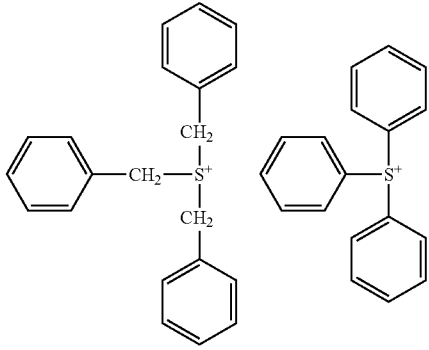
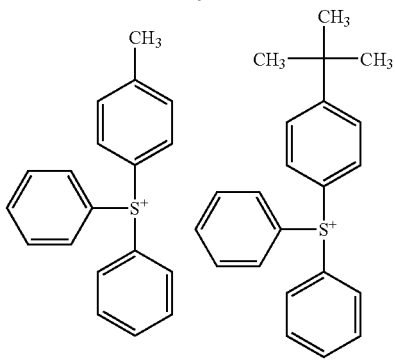
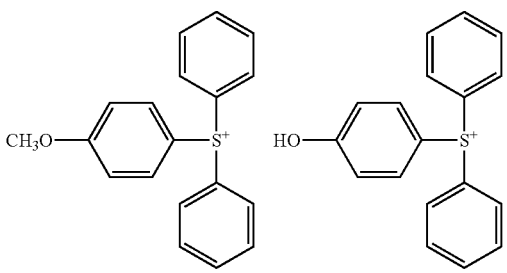
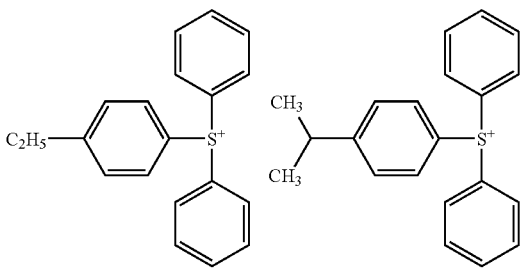
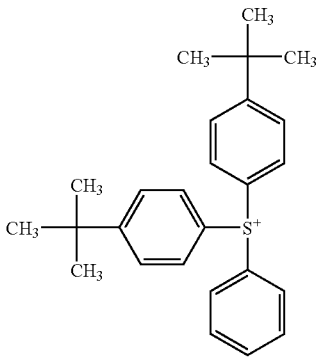

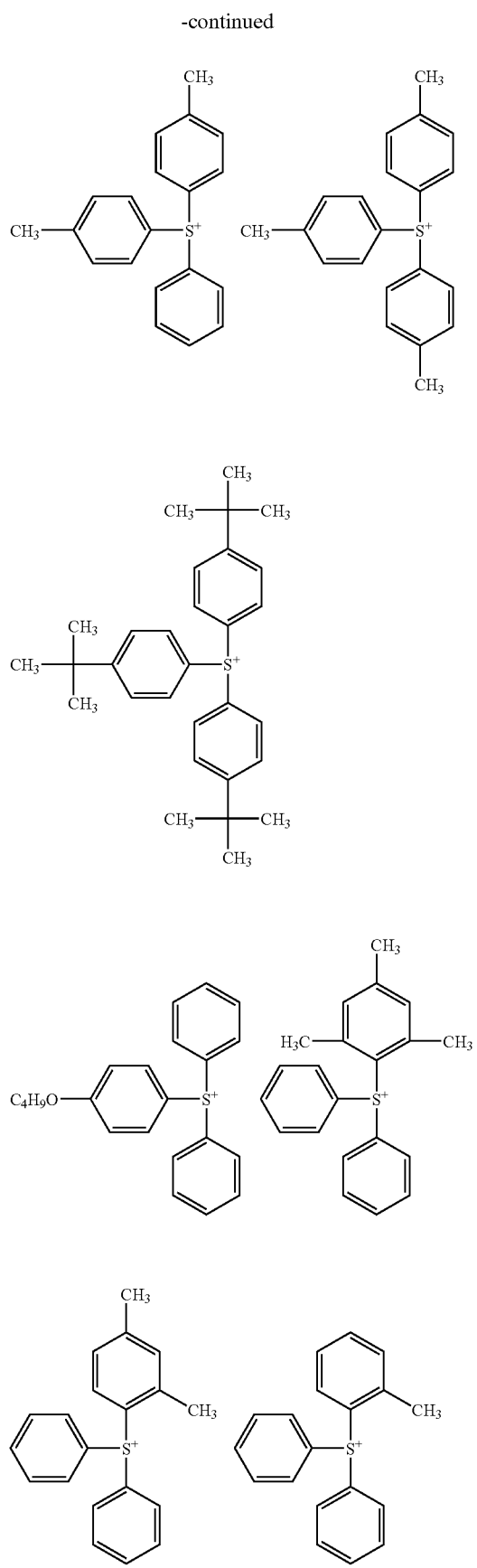
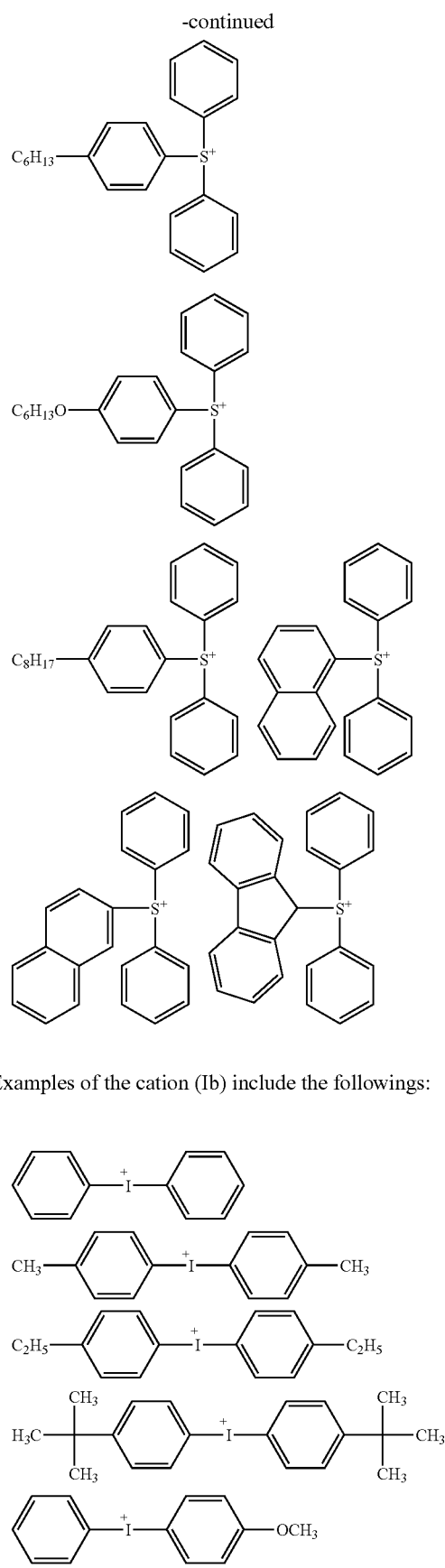
Examples of the cation (Ib) include the followings:
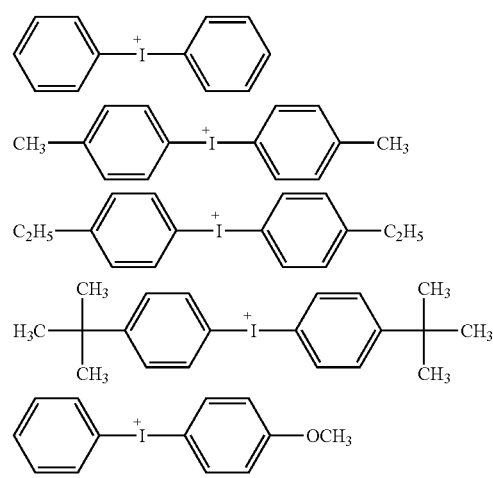

-continued
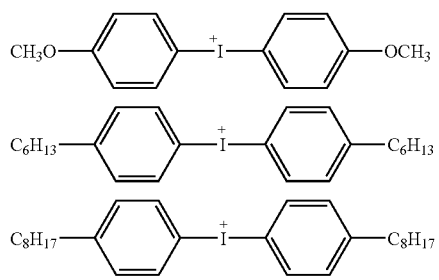
Examples of the cation (Ic) include the followings:
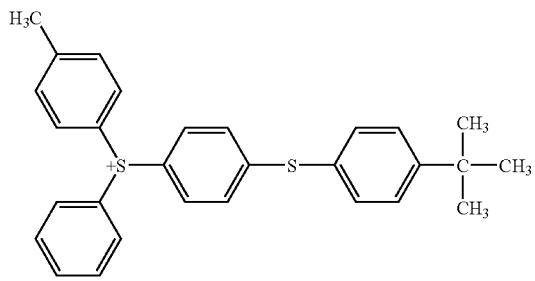
-continued
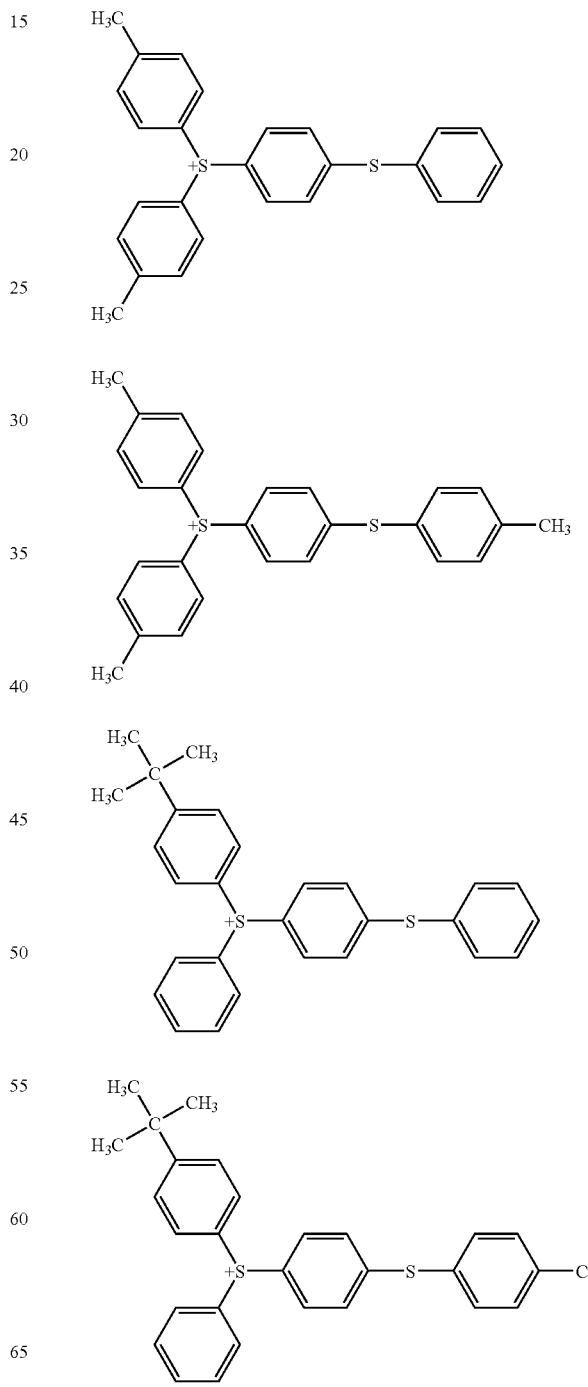

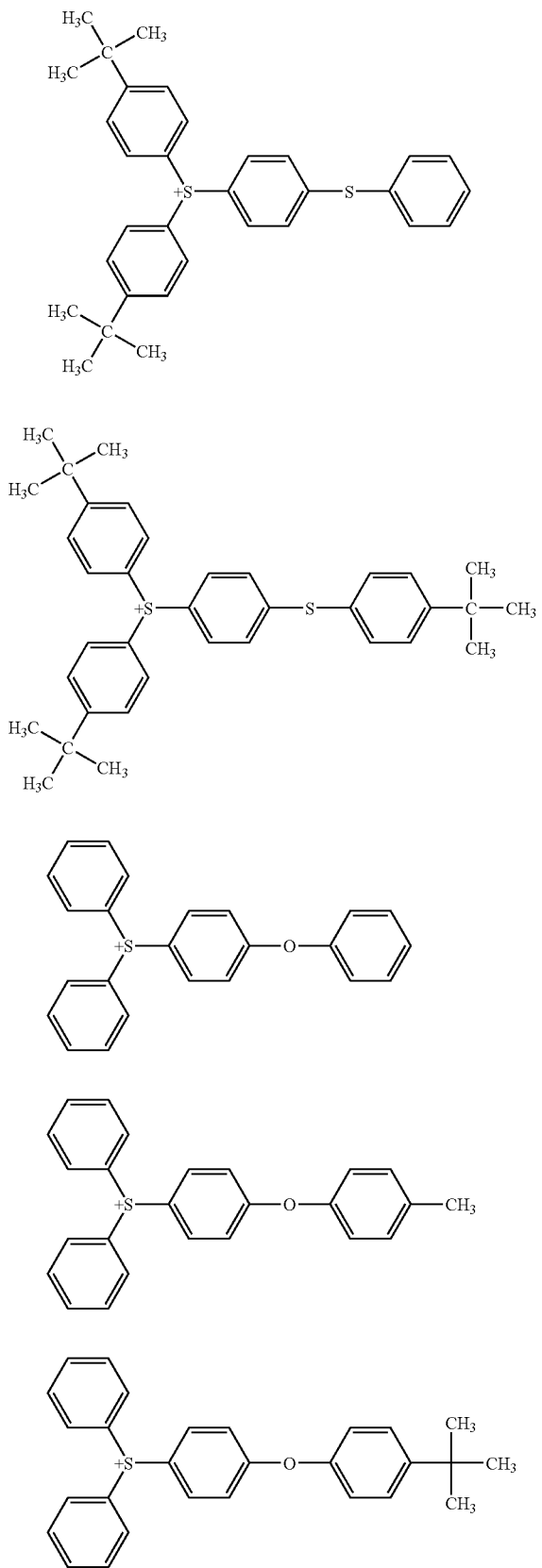

-continued
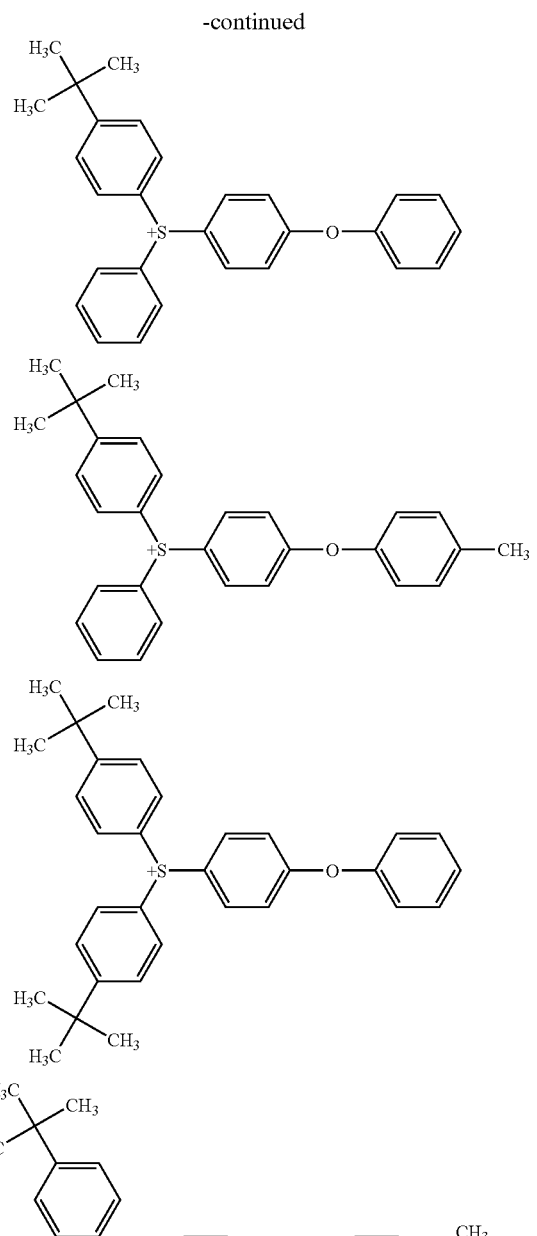
-continued
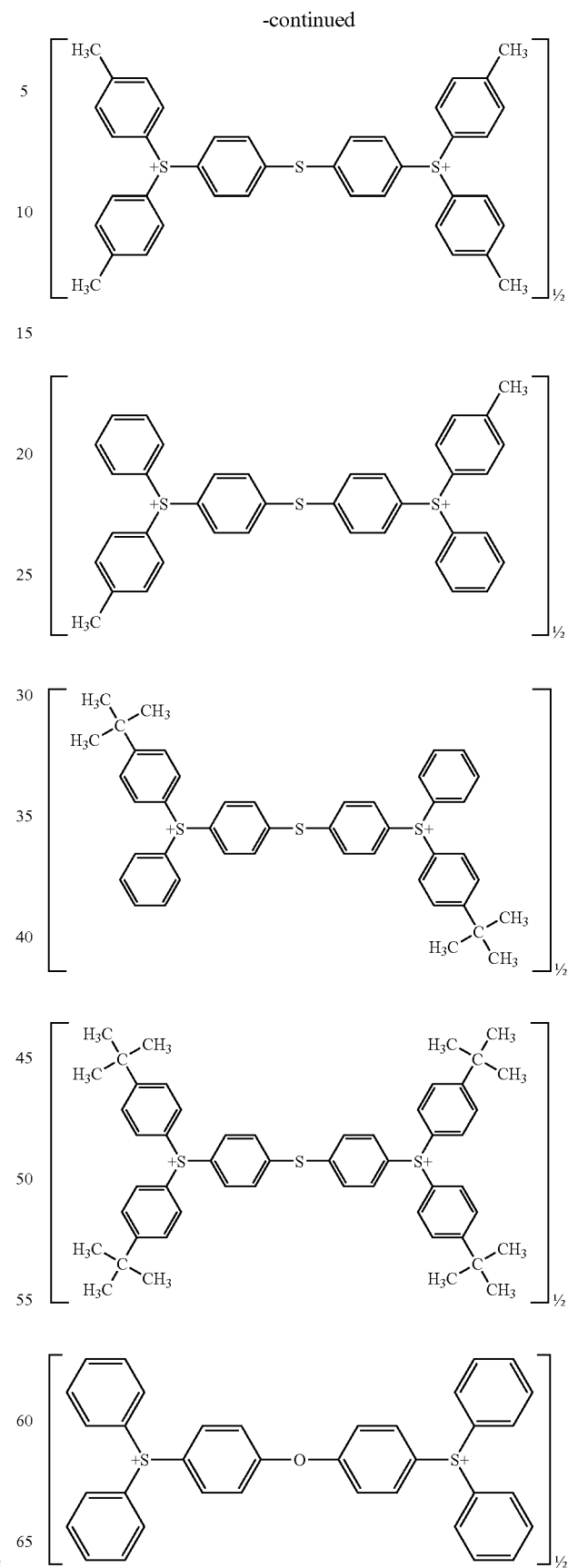

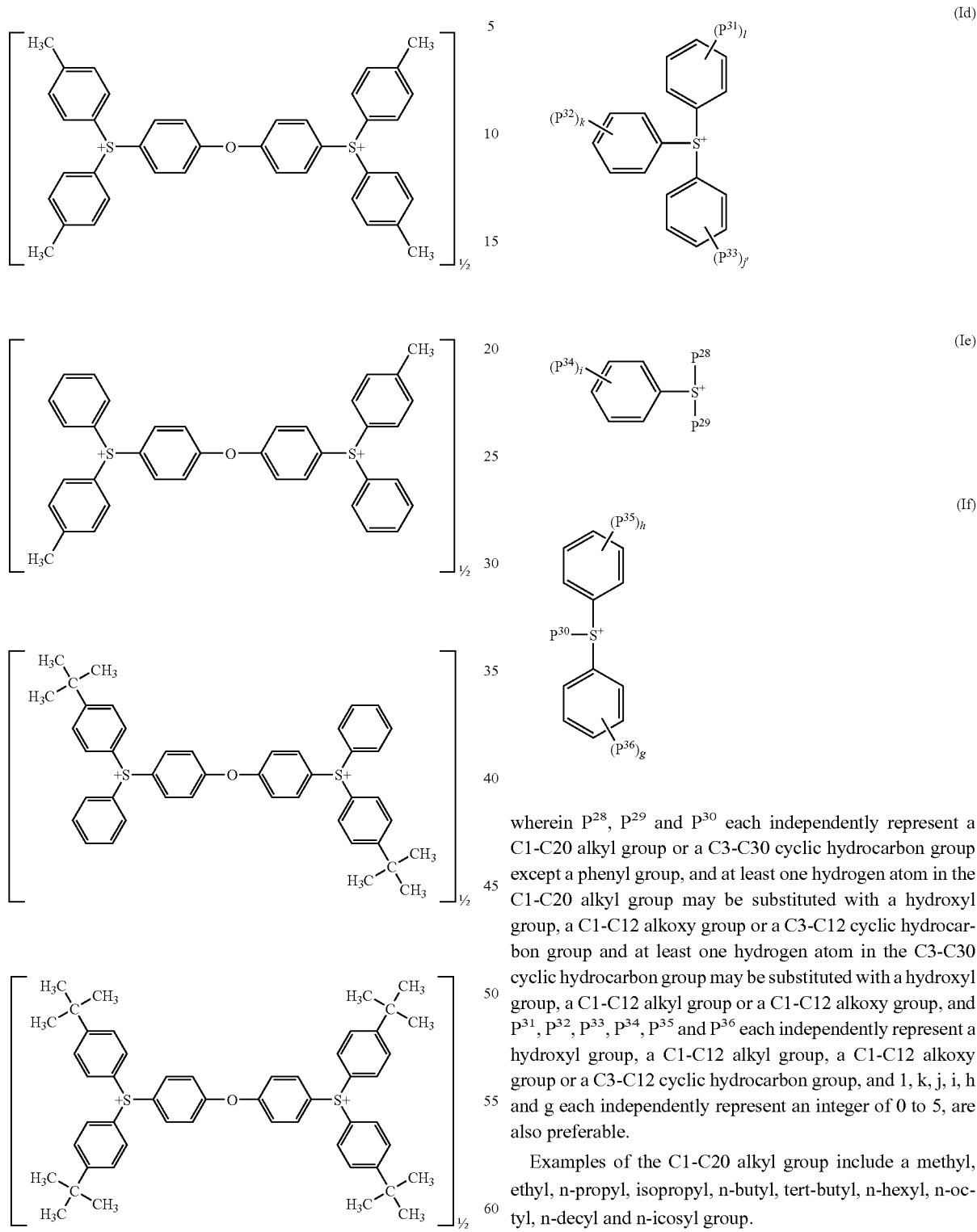

As the cation represented by $A^+$, the cation (Ia) is preferable.

As the cation represented by $A^+$, cations represented by the following formulae (Id), (Ie) and (If):

wherein $P^{28}$, $P^{29}$ and $P^{30}$ each independently represent a C1-C20 alkyl group or a C3-C30 cyclic hydrocarbon group except a phenyl group, and at least one hydrogen atom in the C1-C20 alkyl group may be substituted with a hydroxyl group, a C1-C12 alkoxy group or a C3-C12 cyclic hydrocarbon group and at least one hydrogen atom in the C3-C30 cyclic hydrocarbon group may be substituted with a hydroxyl group, a C1-C12 alkyl group or a C1-C12 alkoxy group, and $P^{31}$, $P^{32}$, $P^{33}$, $P^{34}$, $P^{35}$ and $P^{36}$ each independently represent a hydroxyl group, a C1-C12 alkyl group, a C1-C12 alkoxy group or a C3-C12 cyclic hydrocarbon group, and 1, k, j, i, h and g each independently represent an integer of 0 to 5, are also preferable.

Examples of the C1-C20 alkyl group include a methyl, ethyl, n-propyl, isopropyl, n-butyl, tert-butyl, n-hexyl, n-octyl, n-decyl and n-icosyl group.

Examples of the C1-C12 alkoxy group and the C3-C30 cyclic hydrocarbon group include the same groups as mentioned above.

As the cation represented by $A^+$, a cation represented by the formula (Ig):

(Ig)

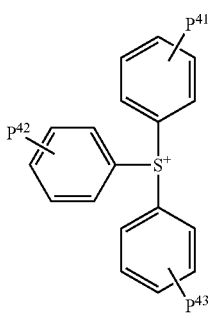

wherein $P^{41}$, $P^{42}$ and $P^{43}$ each independently represent a hydrogen atom, a hydroxyl group, a C1-C12 alkyl group or a C1-C12 alkoxy group, is more preferable, and a cation represented by the formula (Ih):

(Ih)

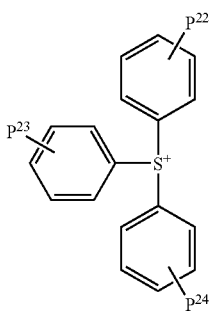

wherein $P^{22}$, $P^{23}$ and $P^{24}$ each independently represent a hydrogen atom or a C1-C4 alkyl group, is especially preferable.

Examples of the alkyl group and the alkoxy group include the same groups as mentioned above.

As Salt (I), the salt represented by the following formula:

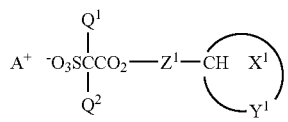

wherein $A^+$, $Q^1$, $Q^2$, $X^1$, $Y^1$ and $Z^1$ are the same as defined above, is preferable, and the salt represented by the following formula:

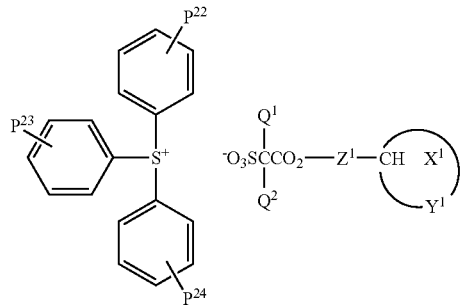

wherein $P^{22}$, $P^{23}$, $P^{24}$, $Q^1$, $Q^2$, $X^1$, $Y^1$ and $Z^1$ are the same as defined above, is more preferable, and the salts represented by the following formulae:

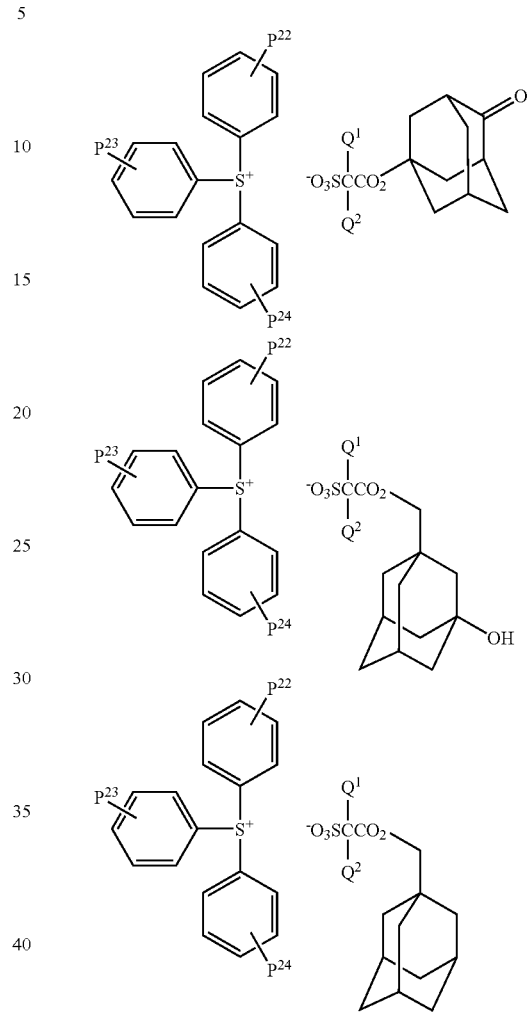

wherein $P^{22}$, $P^{23}$, $P^{24}$, $Q^1$ and $Q^2$ are the same as defined above, are especially preferable.

In the salt represented by the formula (II) (hereinafter, simply referred to as Salt (II)), $R^{22}$ represents a C1-C30 hydrocarbon group which may be substituted, and at least one —CH$_2$— in the hydrocarbon group may be substituted by —CO— or —O—. As the C1-C30 hydrocarbon group which may be substituted, and at least one —CH$_2$— in the hydrocarbon group may be substituted by —CO— or —O—, the same groups as mentioned in $R^{21}$ of Salt (I) are exemplified.

$Q^3$ and $Q^4$ each independently represent a fluorine atom or a C1-C6 perfluoroalkyl group. Examples of the C1-C6 perfluoroalkyl group include the same groups as mentioned in $Q^1$ and $Q^2$ and the trifluoromethyl group is preferable.

It is preferable that $Q^3$ and $Q^4$ each independently represent the fluorine atom or the trifluoromethyl group, and it is more preferable that $Q^3$ and $Q^4$ represent the fluorine atoms.

Specific examples of the anion part of Salt (II) include the same anion parts as mentioned in the anion parts of Salt (I).

It is preferred that $R^{22}$ represents a group represented by the formula: $R^{22}$ represents a group represented by the formula:

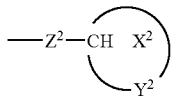

wherein $Z^2$ represents a single bond or $(CH_2)_g$, g represents an integer of 1 to 4, $Y^2$ represents —$CH_2$—, —CO— or —CH(OH)—; ring $X^2$ represents a C3-C30 monocyclic or polycyclic hydrocarbon group in which a hydrogen atom is substituted with a hydroxyl group at $Y^2$ position when $Y^2$ is —CH(OH)— or in which two hydrogen atoms are substituted with =O at $Y^2$ position when $Y^2$ is —CO—, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group.

Examples of the C1-C6 alkyl, C1-C6 alkoxy, C1-C4 perfluoroalkyl and C1-C6 hydroxyalkyl group include respectively the same groups as mentioned above.

Examples of the ring $X^2$ include the same ring groups as mentioned in ring $X^1$.

As the ring $X^2$, the adamantane ring is preferable. The group represented by the following formulae (l), (m) or (n):

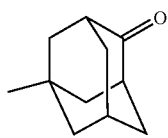 (l)

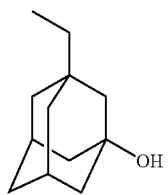 (m)

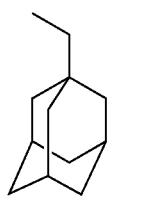 (n)

is preferable as $R^{22}$.

In the above formulae (l), (m) and (n), straight line with an open end shows a bond which is extended from an adjacent group.

$A'^+$ represents an organic cation represented by the formula (IIa):

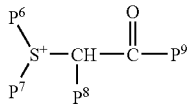 (IIa)

wherein $P^6$ and $P^7$ each independently represent a C1-C12 alkyl group or a C3-C12 cycloalkyl group, or $P^6$ and $P^7$ are bonded to form a C3-C12 divalent acyclic hydrocarbon group which forms a ring together with the adjacent $S^+$, and at least one —$CH_2$— in the divalent acyclic hydrocarbon group may be substituted with —CO—, —O— or —S—, $P^8$ represents a hydrogen atom, $P^9$ represents a C1-C12 alkyl group, a C3-C12 cycloalkyl group or an aromatic group which may be substituted, or $P^8$ and $P^9$ are bonded to form a divalent acyclic hydrocarbon group which forms a 2-oxocycloalkyl group together with the adjacent —CHCO—, and at least one —$CH_2$— in the divalent acyclic hydrocarbon group may be replaced with —CO—, —O— or —S— (hereinafter, simply referred to as the cation (IIa)).

Examples of the C1-C12 alkyl group include the same groups as mentioned above.

Examples of the C3-C12 cycloalkyl group in the cation (IIa) include a cyclopropyl, cyclobutyl, cyclopentyl, cyclohexyl, cycloheptyl, cyclooctyl and cyclodecyl group. Examples of the C3-C12 divalent acyclic hydrocarbon group formed by bonding $P^6$ and $P^7$ include a trimethylene, tetramethylene, pentamethylene group. Examples of the ring group formed together with the adjacent $S^+$ and the divalent acyclic hydrocarbon group include a tetramethylenesulfonio, pentamethylenesulfonio and oxybisethylenesulfonio group.

Examples of the aromatic group in the cation (IIa) include a phenyl, tolyl, xylyl, 4-n-butylphenyl, 4-isobutylphenyl, 4-tert-butylphenyl, 4-cyclohexylphenyl, 4-phenylphenyl and naphthyl group. The aromatic group may be substituted, and the examples of the substituents include a C1-C6 alkoxy group such as a methoxy, ethoxy, n-propoxy, n-butoxy, tert-butoxy and n-hexyloxy group; a C2-C12 acyloxy group such as an acetyloxy and 1-adamantylcarbonyloxy group; and a nitro group.

Examples of the divalent acyclic hydrocarbon group formed by bonding $P^8$ and $P^9$ include a methylene, ethylene, trimethylene, tetramethylene and pentamethylene group and examples of the 2-oxocycloalkyl group formed together with the adjacent —CHCO— and the divalent acyclic hydrocarbon group include a 2-oxocyclopentyl and 2-oxocyclohexyl group.

As the cation (IIa), the cation wherein $P^6$ and $P^7$ are bonded to form the C3-C12 divalent acyclic hydrocarbon group which forms the ring together with the adjacent $S^+$, $P^8$ represents the hydrogen atom, $P^9$ represents the C1-C12 alkyl group, the C3-C12 cycloalkyl group or the aromatic group which may be substituted with at least one selected from the C1-C6 alkoxy group, the C2-C20 acyl group and the nitro group, is preferable, and the cation wherein $P^6$ and $P^7$ are bonded to form the trimethylene, tetramethylene or pentamethylene group which forms the ring together with the adjacent $S^+$, $P^8$ represents the hydrogen atom, $P^9$ represents the C1-C12 alkyl group or the aromatic group which may be substituted with at least one selected from the C1-C6 alkoxy group and the nitro group, is more preferable.

Examples of the cation (IIa) include the followings:

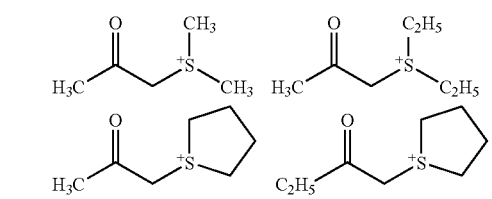

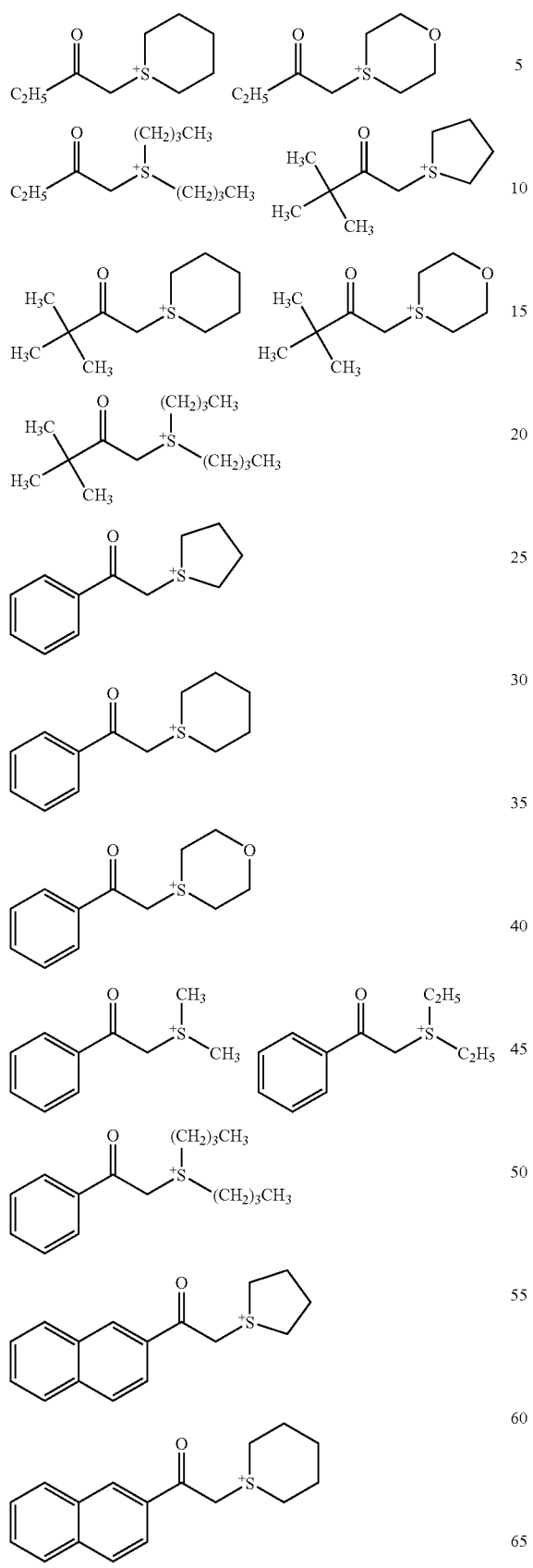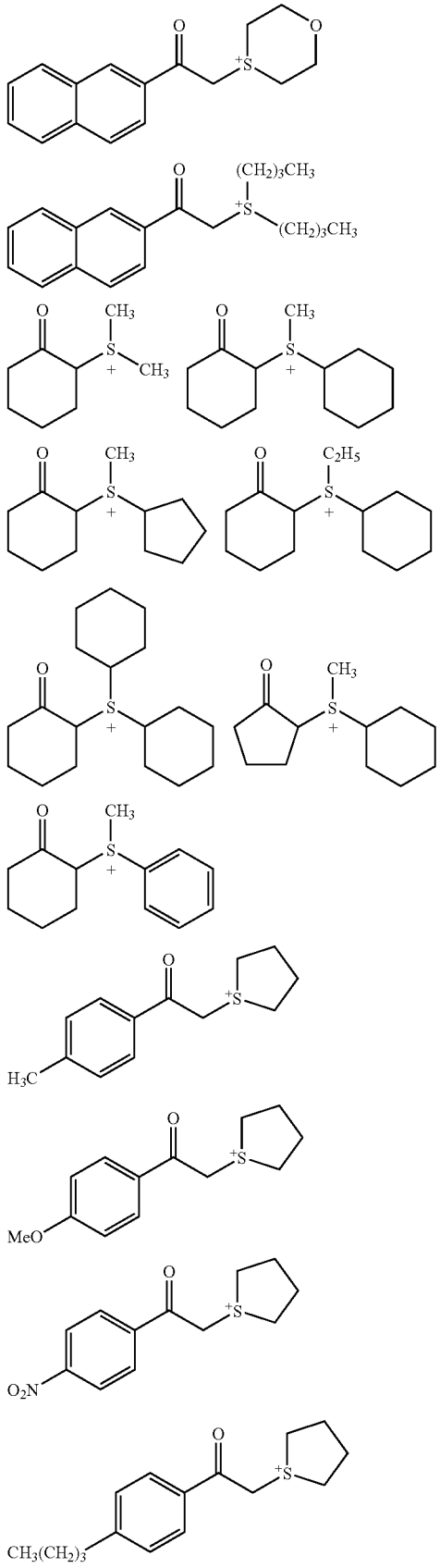

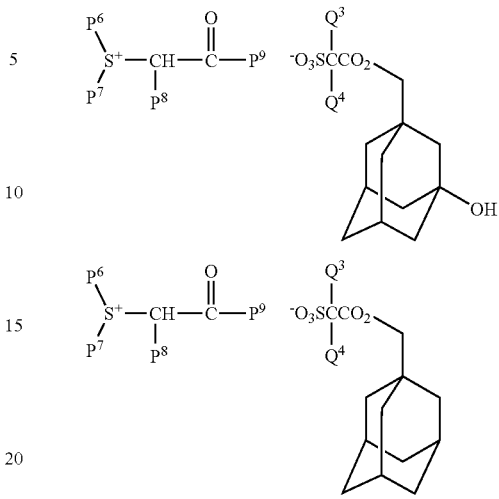

As Salt (II), the salt represented by the following formula:

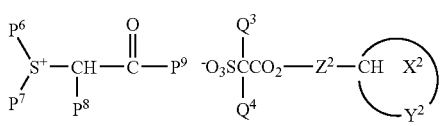

wherein $P^6$, $P^7$, $P^8$, $P^9$, $Q^3$, $Q^4$, $X^2$, $Y^2$ and $Z^2$ are the same as defined above, is more preferable, and the salts represented by the following formulae:

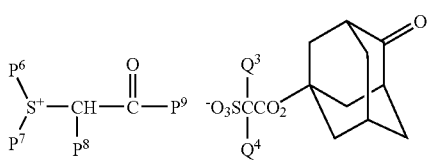

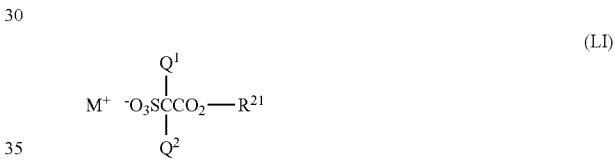

wherein $P^6$, $P^7$, $P^8$, $P^9$, $Q^3$ and $Q^4$ are the same as defined above, are especially preferable.

Salt (I) can be produced by a process comprising reacting a salt of the formula (LI):

(LI)

wherein M represents Li, Na, K or Ag, and $Q^1$, $Q^2$ and $R^{21}$ are the same meanings as defined above (hereinafter, simply referred to as the salt (LI)), with a compound of the formula (XI):

$$A^+ {}^- G \qquad (XI)$$

wherein $A^+$ is the same meaning as defined above, and G represents F, Cl, Br, I, $BF_4$, $AsF_6$, $SbF_6$, $PF_6$ or $ClO_4$ (hereinafter, simply referred to as the compound (XI)).

The reaction of the salt (LI) and the compound (XI) is usually conducted in an inert solvent such as acetonitrile, water, methanol and dichloromethane, at a temperature of about 0 to 150° C., preferably of 0 to 100° C., with stirring.

The amount of the compound (XI) is usually 0.5 to 2 moles per 1 mole of the salt (LI). Salt (I) obtained by the process above can be isolated by recrystallization, and can be purified by washing with water.

The salt (LI) used for the production of Salt (I) can be produced by a process comprising esterifying an alcohol compound represented by the formula (LII):

(LII)

wherein $R^{21}$ is the same meaning as defined above (hereinafter, simply referred to as the alcohol compound (LII)), with a carboxylic acid represented by the formula (IX):

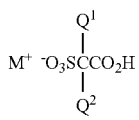
(IX)

wherein M, $Q^1$ and $Q^2$ are the same meanings as defined above (hereinafter, simply referred to as the carboxylic acid (IX)).

The esterification reaction of the alcohol compound (LII) and the carboxylic acid (IX) can generally be carried out by mixing materials in an aprotic solvent such as dichloroethane, toluene, ethylbenzene, monochlorobenzene, acetonitrile and N,N-dimethylformamide, at 20 to 200° C., preferably 50 to 150° C. In the esterification reaction, an acid catalyst or a dehydrating agent is usually added, and examples of the acid catalyst include organic acids such as p-toluenesulfonic acid, and inorganic acids such as sulfuric acid. Examples of the dehydrating agent include 1,1'-carbonyldiimidazole and N,N'-dicyclohexylcarbodiimide.

The esterification reaction may preferably be conducted with dehydration since the reaction time tends to be shortened. Examples of the dehydration method include Dean and Stark method.

The amount of the carboxylic acid (IX) is usually 0.2 to 3 moles, preferably 0.5 to 2 moles per 1 mole of the alcohol compound (LII).

The amount of the acid catalyst may be catalytic amount or the amount equivalent to solvent, and is usually 0.001 to 5 moles per 1 mole of the alcohol compound (LII). The amount of the dehydrating agent is usually 0.2 to 5 moles, preferably 0.5 to 3 moles per 1 mole of the alcohol compound (LII).

Salt (II) can be produced by a process comprising reacting a salt of the formula (LIII):

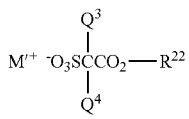
(LIII)

wherein M' represents Li, Na, K or Ag, and $Q^3$, $Q^4$ and $R^{22}$ are the same meanings as defined above (hereinafter, simply referred to as the salt (LIII)), with a compound of the formula (XII):

$$A'^+ \text{—} G'$$ (XII)

wherein $A'^+$ is the same meaning as defined above, and G' represents F, Cl, Br, I, $BF_4$, $AsF_6$, $SbF_6$, $PF_6$ or $ClO_4$ (hereinafter, simply referred to as the compound (XII)).

The reaction of the salt (LIII) and the compound (XII) is usually conducted in an inert solvent such as acetonitrile, water, methanol and dichloromethane, at a temperature of about 0 to 150° C., preferably of 0 to 100° C., with stirring.

The amount of the compound (XII) is usually 0.5 to 2 moles per 1 mole of the salt (LIII). Salt (II) obtained by the process above can be isolated by recrystallization, and can be purified by washing with water.

The salt (LIII) used for the production of Salt (II) can be produced by a process comprising esterifying an alcohol compound represented by the formula (LIV):

$$HO\text{—}R^{22}$$ (LIV)

wherein $R^{22}$ is the same meaning as defined above (hereinafter, simply referred to as the alcohol compound (LIV)), with a carboxylic acid represented by the formula (X):

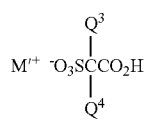
(X)

wherein M', $Q^3$ and $Q^4$ are the same meanings as defined above (hereinafter, simply referred to as the carboxylic acid (X)).

The esterification reaction of the alcohol compound (LIV) and the carboxylic acid (X) can generally be carried out by mixing materials in an aprotic solvent such as dichloroethane, toluene, ethylbenzene, monochlorobenzene, acetonitrile and N,N-dimethylformamide, at 20 to 200° C., preferably 50 to 150° C. In the esterification reaction, an acid catalyst or a dehydrating agent is usually added, and examples of the acid catalyst include organic acids such as p-toluenesulfonic acid, and inorganic acids such as sulfuric acid. Examples of the dehydrating agent include 1,1'-carbonyldiimidazole and N,N'-dicyclohexylcarbodiimide.

The esterification reaction may preferably be conducted with dehydration since the reaction time tends to be shortened. Examples of the dehydration method include Dean and Stark method.

The amount of the carboxylic acid (X) is usually 0.2 to 3 moles, preferably 0.5 to 2 moles per 1 mole of the alcohol compound (LIV).

The amount of the acid catalyst may be catalytic amount or the amount equivalent to solvent, and is usually 0.001 to 5 moles per 1 mole of the alcohol compound (LIV). The amount of the dehydrating agent is usually 0.2 to 5 moles, preferably 0.5 to 3 moles per 1 mole of the alcohol compound (LIV).

The present resist composition comprises (A) Salt (I), (B) Salt (II) and (C) a resin which contains a structural unit having an acid-labile group and which itself is insoluble or poorly soluble in an aqueous alkali solution but becomes soluble in an aqueous alkali solution by the action of an acid.

Salt (I) and Salt (II) are usually used as an acid generator, and the acid generated by irradiation to Salt (I) and Salt (II) catalytically acts against acid-labile groups in the resin, cleaves acid-labile groups, and the resin becomes soluble in an alkali aqueous solution.

In the present resist composition, the anion part of Salt (II) may be same as that of Salt (I), and The anion part of Salt (II) may be different from that of Salt (I).

The resin used for the present composition contains a structural unit having the acid-labile group and it itself is insoluble or poorly soluble in an alkali aqueous solution, but the acid-labile group cleave by an acid.

In the present specification, "—COOR" may be described as "a structure having ester of carboxylic acid", and may also be abbreviated as "ester group". Specifically, "—COOC($CH_3$)$_3$" may be described as "a structure having tert-butyl ester of carboxylic acid", or be abbreviated as "tert-butyl ester group".

Examples of the acid-labile group include a structure having ester of carboxylic acid such as alkyl ester group in which a carbon atom adjacent to the oxygen atom is quaternary carbon atom, alicyclic ester group in which a carbon atom adjacent to the oxygen atom is quaternary carbon atom, and a lactone ester group in which a carbon atom adjacent to the oxygen atom is quaternary carbon atom. The "quaternary carbon atom" means a "carbon atom joined to four substituents other than hydrogen atom". As the acid-labile group, a group having a quaternary carbon atom joined to three carbon atoms and an —OR', wherein R' represents an alkyl group, is exemplified.

Examples of the acid-labile group include an alkyl ester group in which a carbon atom adjacent to the oxygen atom is quaternary carbon atom such as a tert-butyl ester group; an acetal type ester group such as a methoxymethyl ester, ethoxymethyl ester, 1-ethoxyethyl ester, 1-isobutoxyethylester, 1-isopropoxyethylester, 1-ethoxypropoxyester, 1-(2-methoxyethoxy)ethyl ester, 1-(2-acetoxyethoxy)ethyl ester, 1-[2-(1-adamantyloxy)ethoxy]ethyl ester, 1-[2-(1-adamantanecarbonyloxy)ethoxy]ethyl ester, tetrahydro-2-furyl ester and tetrahydro-2-pyranyl ester group; an alicyclic ester group in which a carbon atom adjacent to the oxygen atom is quaternary carbon atom, such as an isobornyl ester, 1-alkylcycloalkyl ester, 2-alkyl-2-adamantyl ester and 1-(1-adamantyl)-1-alkylalkyl ester group. At least one hydrogen atom in the adamantyl group may be substituted with a hydroxyl group.

Examples of the structural unit include a structure unit derived from an ester of acrylic acid, a structural unit derived from an ester of methacrylic acid, a structural unit derived from an ester of norbornenecarboxylic acid, a structural unit derived from an ester of tricyclodecenecarboxylic acid and a structural unit derived from an ester of tetracyclodecenecarboxylic acid. The structure units derived from the ester of acrylic acid and from the ester of methacrylic acid are preferable.

The resin used for the present composition can be obtained by conducting polymerization reaction of a monomer or monomers having the acid-labile group and an olefinic double bond.

Among the monomers, those having a bulky and acid-labile group such as an alicyclic ester group (e.g. a 2-alkyl-2-adamantyl ester and 1-(1-adamantyl)-1-alkylalkyl ester group) are preferable, since excellent resolution is obtained when the resin obtained is used in the present composition.

Examples of such monomer containing the bulky and acid-labile group include a 2-alkyl-2-adamantyl acrylate, a 2-alkyl-2-adamantyl methacrylate, 1-(1-adamantyl)-1-alkylalkyl acrylate, a 1-(1-adamantyl)-1-alkylalkyl methacrylate, a 2-alkyl-2-adamantyl 5-norbornene-2-carboxylate, a 1-(1-adamantyl)-1-alkylalkyl 5-norbornene-2-carboxylate, a 2-alkyl-2-adamantyl α-chloroacrylate and a 1-(1-adamantyl)-1-alkylalkyl α-chloroacrylate.

Particularly when the 2-alkyl-2-adamantyl acrylate, the 2-alkyl-2-adamantyl methacrylate or the 2-alkyl-2-adamantyl α-chloroacrylate is used as the monomer for the resin component in the present composition, a resist composition having excellent resolution tend to be obtained. Typical examples thereof include 2-methyl-2-adamantyl acrylate, 2-methyl-2-adamantyl methacrylate, 2-ethyl-2-adamantyl acrylate, 2-ethyl-2-adamantyl methacrylate, 2-n-butyl-2-adamantyl acrylate, 2-methyl-2-adamantyl α-chloroacrylate and 2-ethyl-2-adamantyl α-chloroacrylate. When particularly 2-ethyl-2-adamantyl acrylate, 2-ethyl-2-adamantyl methacrylate, 2-isopropyl-2-adamantyl acrylate or 2-isopropyl-2-adamantyl methacrylate is used for the present composition, a resist composition having excellent sensitivity and heat resistance tends to be obtained. In the present invention, two or more kinds of monomers having a group or groups dissociated by the action of the acid may be used together, if necessary.

The 2-alkyl-2-adamantyl acrylate can be usually produced by reacting a 2-alkyl-2-adamantanol or a metal salt thereof with an acrylic halide, and the 2-alkyl-2-adamantyl methacrylate can be usually produced by reacting a 2-alkyl-2-adamantanol or a metal salt thereof with a methacrylic halide.

The resin used for the present composition can also contain other structural unit or units derived from an acid-stable monomer in addition to the above-mentioned structural units having the acid-labile group. Herein, the "structural unit derived from an acid-stable monomer" means "a structural unit not dissociated by an acid generated from Salt (I) and Salt (II)".

Examples of such other structural unit derived from the acid-stable monomer include a structural unit derived from a monomer having a free carboxyl group such as acrylic acid and methacrylic acid; a structural unit derived from an aliphatic unsaturated dicarboxylic anhydride such as maleic anhydride and itaconic anhydride; a structural unit derived from 2-norbornene; a structural unit derived from acrylonitrile or methacrylonitrile; a structural unit derived from an alkyl acrylate or an alkyl methacrylate in which a carbon atom adjacent to oxygen atom is secondary or tertiary carbon atom; a structural unit derived from 1-adamantyl acrylate or 1-adamantyl methacrylate; a structural unit derived from styrene monomer such as p-hydroxystyrene and m-hydroxystyrene; a structural unit derived from acryloyloxy-γ-butyrolactone or methacryloyloxy-γ-butyrolactone having a lactone ring which may be substituted with an alkyl group; and the like. Herein, the 1-adamantyloxycarbonyl group is the acid-stable group though the carbon atom adjacent to oxygen atom is the quaternary carbon atom, and the 1-adamantyloxycarbonyl group may be substituted with at least one hydroxyl group.

Specific examples of the structural unit derived from the acid-stable monomer include a structural unit derived from 3-hydroxy-1-adamantyl acrylate;

a structural unit derived from 3-hydroxy-1-adamantyl methacrylate;

a structural unit derived from 3,5-dihydroxy-1-adamantyl acrylate;

a structural unit derived from 3,5-dihydroxy-1-adamantyl methacrylate;

a structural unit derived from α-acryloyloxy-γ-butyrolactone;

a structural unit derived from α-methacryloyloxy-γ-butyrolactone;

a structural unit derived from β-acryloyloxy-γ-butyrolactone;

a structural unit derived from β-methacryloyloxy-γ-butyrolactone;

a structural unit represented by the formula (1):

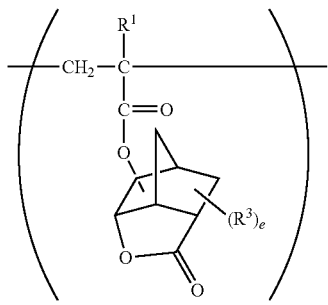

wherein $R^1$ represents a hydrogen atom or a methyl group, $R^3$ represents a methyl group, a trifluoromethyl group or a halogen atom, e represents an integer of 0 to 3, and when f represents 2 or 3, $R^3$s may be the same or different each other;
a structural unit represented by the formula (2):

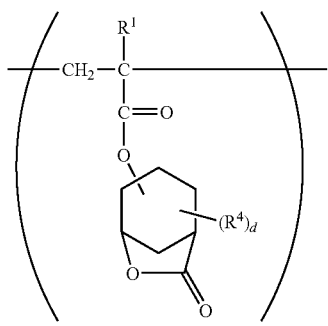

wherein $R^2$ represents a hydrogen atom or a methyl group, $R^4$ represents a methyl group, a trifluoromethyl group or a halogen atom, d represents an integer of 0 to 3, and when e represents 2 or 3, $R^4$s may be the same or different each other;
a structural unit derived from p-hydroxystyrene;
a structural unit derived from m-hydroxystyrene;
a structural unit derived from an alicyclic compound having an olefinic double bond such as a structural unit represented by the formula (3):

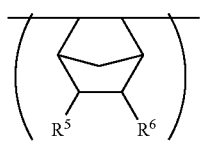

wherein $R^5$ and $R^6$ each independently represents a hydrogen atom, a C1-C3 alkyl group, a C1-C3 hydroxyalkyl group, a carboxyl group, a cyano group, a hydroxyl group or a —COOU group in which U represents an alcohol residue, or $R^5$ and $R^6$ can be bonded together to form a carboxylic anhydride residue represented by —C(=O)OC(=O)—;
a structural unit derived from an aliphatic unsaturated dicarboxylic anhydride such as a structural unit represented by the formula (4):

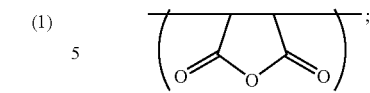

a structural unit represented by the formula (5):

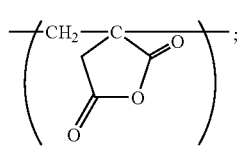

and the like.

Particularly, the resin having further at least one structural unit selected from the structural unit derived from p-hydroxystyrene, the structural unit derived from m-hydroxystyrene, the structural unit derived from 3-hydroxy-1-adamantyl acrylate, the structural unit derived from 3-hydroxy-1-adamantyl methacrylate, the structural unit derived from 3,5-dihydroxy-1-adamantyl acrylate, the structural unit derived from 3,5-dihydroxy-1-adamantyl methacrylate, the structural unit represented by the formula (1) and the structural unit represented by the formula (2) in addition to the structural unit having the acid-labile group is preferable from the standpoint of the adhesiveness of resist to a substrate and resolution of resist.

3-Hydroxy-1-adamantyl acrylate, 3-hydroxy-1-adamantyl methacrylate, 3,5-dihydroxy-1-adamantyl acrylate and 3,5-dihydroxy-1-adamantyl methacrylate can be produced, for example, by reacting corresponding hydroxyadamantane with acrylic acid, methacrylic acid or its acid halide, and they are also commercially available.

Further, the acryloyloxy-γ-butyrolactone and the methacryloyloxy-γ-butyrolactone having the lactone ring which may be substituted with the alkyl group can be produced by reacting corresponding α- or β-bromo-γ-butyrolactone with acrylic acid or methacrylic acid, or reacting corresponding α- or β-hydroxy-γ-butyrolactone with the acrylic halide or the methacrylic halide.

As monomers to give structural units represented by the formulae (1) and (2), specifically listed are, for example, an acrylate of alicyclic lactones and a methacrylate of alicyclic lactones having the hydroxyl group described below, and mixtures thereof. These esters can be produced, for example, by reacting the corresponding alicyclic lactone having the hydroxyl group with acrylic acid or methacrylic acid, and the production method thereof is described in, for example, JP 2000-26446 A.

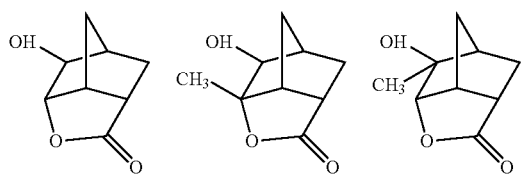

-continued

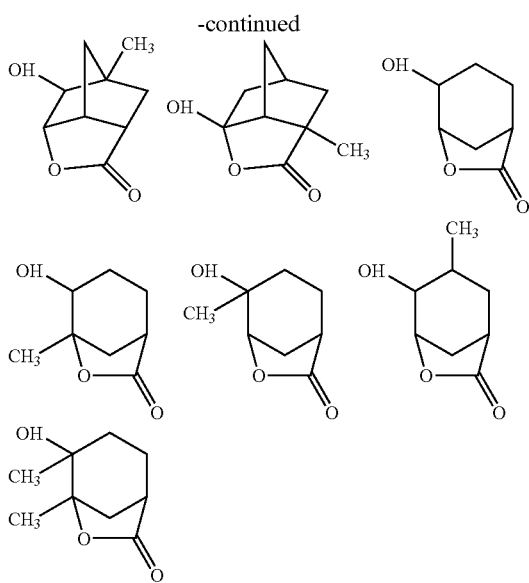

Examples of the acryloyloxy-γ-butyrolactone and the methacryloyloxy-γ-butyrolactone having the lactone ring which may be substituted with the alkyl group include α-acryloyloxy-γ-butyrolactone, α-methacryloyloxy-γ-butyrolactone, α-acryloyloxy-β,β-dimethyl-γ-butyrolactone, α-methacryloyloxy-β,β-dimethyl-γ-butyrolactone, α-acryloyloxy-α-methyl-γ-butyrolactone, α-methacryloyloxy-α-methyl-γ-butyrolactone, α-acryloyloxy-γ-butyrolactone, β-methacryloyloxy-γ-butyrolactone and β-methacryloyloxy-α-methyl-γ-butyrolactone.

The resin containing a structural unit derived from 2-norbornene shows strong structure because the alicyclic group is directly present on its main chain and shows a property that dry etching resistance is excellent. The structural unit derived from 2-norbornene can be introduced into the main chain by radical polymerization using, for example, an aliphatic unsaturated dicarboxylic anhydride such as maleic anhydride and itaconic anhydride together in addition to corresponding 2-norbornene. The structural unit derived from 2-norbornene is formed by opening of its double bond, and can be represented by the above-mentioned formula (3). The structural unit derived from maleic anhydride and from itaconic anhydride which are the structural unit derived from aliphatic unsaturated dicarboxylic anhydrides are formed by opening of their double bonds, and can be represented by the above-mentioned formula (4) and the formula (5), respectively.

In $R^5$ and $R^6$, examples of the C1-C3 alkyl group include a methyl, ethyl, and n-propyl group, and examples of the C1-C3 hydroxyalkyl group include a hydroxymethyl and 2-hydroxyethyl group.

In $R^5$ and $R^6$, the —COOU group is an ester formed from the carboxyl group, and as the alcohol residue corresponding to U, for example, an optionally substituted C1-C8 alkyl group, 2-oxooxolan-3-yl group, 2-oxooxolan-4-yl and the like are listed, and as the substituent on the C1-C8 alkyl group, a hydroxyl group, an alicyclic hydrocarbon residue and the like are listed.

Specific examples of the monomer used to give the structural unit represented by the above-mentioned formula (3) may include 2-norbornene, 2-hydroxy-5-norbornene, 5-norbornene-2-carboxylic acid, methyl 5-norbornene-2-carboxylate, 2-hydroxyethyl 5-norbornene-2-carboxylate, 5-norbornene-2-methanol and 5-norbornene-2,3-dicarboxylic anhydride.

When U in the —COOU group is the acid-labile group, the structural unit represented by the formula (3) is a structural unit having the acid-labile group even if it has the norbornane structure. Examples of monomers giving structural unit having the acid-labile group include tert-butyl 5-norbornene-2-carboxylate, 1-cyclohexyl-1-methylethyl 5-norbornene-2-carboxylate, 1-methylcyclohexyl 5-norbornene-2-carboxylate, 2-methyl-2-adamantyl 5-norbornene-2-carboxylate, 2-ethyl-2-adamantyl 5-norbornene-2-carboxylate, 1-(4-methylcyclohexyl)-1-methylethyl 5-norbornene-2-carboxylate, 1-(4-hydroxylcyclohexyl)-1-methylethyl 5-norbornene-2-carboxylate, 1-methyl-1-(4-oxocyclohexyl)ethyl 5-norbornene-2-carboxylate, 1-(1-adamantyl)-1-methylethyl 5-norbornene-2-carboxylate, and the like.

The resin used in the present composition preferably contains the structural unit or units having the acid-labile group generally in a ratio of 10 to 80% by mole in all structural units of the resin though the ratio varies depending on the kind of radiation for patterning exposure, the kind of the acid-labile group, and the like.

When the structural units particularly derived from the 2-alkyl-2-adamantyl acrylate, the 2-alkyl-2-adamantyl methacrylate, the 1-(1-adamantyl)-1-alkylalkyl acrylate or the 1-(1-adamantyl)-1-alkylalkyl methacrylate are used as the structural unit having the acid-labile group, it is advantageous in dry-etching resistance of the resist that the ratio of the structural units is 15% by mole or more in all structural units of the resin.

When, in addition to structural units having the acid-labile group, other structural units having the acid-stable group are contained in the resin, it is preferable that the sum of these structural units is in the range of 20 to 90% by mole based on all structural units of the resin.

In the case of KrF lithography, even in the case of using a structure unit derived from hydroxystyrene such as p-hydroxystyrene and m-hydroxystyrene, as one of components of the resin, a resist composition having sufficient transparency can be obtained. For obtaining such resins, the corresponding acrylic or methacrylic ester monomer can be radical-polymerized with acetoxystyrene and styrene, and then the acetoxy group in the structural unit derived from acetoxystyrene can be de-acetylated with an acid.

Specific examples of the structural unit derived from hydroxystyrene include the following structural units represented by the formulae (6) and (7).

-continued

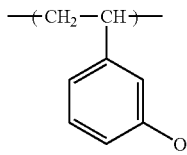
(7)

The resin used for the present resist composition can be produced by conducting the polymerization reaction of the corresponding monomer or monomers. The resin can be also produced by conducting the oligomerization reaction of the corresponding monomer or monomers followed by polymerizing the oligomer obtained.

The polymerization reaction is usually carried out in the presence of a radical initiator.

The radical initiator is not limited and examples thereof include an azo compound such as 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile), 2,2'-azobis(2,4-dimethyl-4-methoxyvaleronitrile), dimethyl-2,2'-azobis(2-methylpropionate) and 2,2'-azobis(2-hydroxymethylpropionitrile); an organic hydroperoxide such as lauroyl peroxide, tert-butyl hydroperoxide, benzoyl peroxide, tert-butyl peroxybenzoate, cumene hydroperoxide, diisopropyl peroxydicarbonate, di-n-propyl peroxydicarbonate, tert-butyl peroxyneodecanoate, tert-butyl peroxypivalate and 3,5,5-trimethylhexanoyl peroxide; and an inorganic peroxide such as potassium peroxodisulfate, ammonium peroxodisulfate and hydrogen peroxide. Among them, the azo compound is preferable and 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile) and dimethyl-2,2'-azobis(2-methylpropionate) are more preferable, and 2,2'-azobisisobutyronitrile and 2,2'-azobis(2,4-dimethylvaleronitrile) are especially preferable.

These radical initiators may be used alone or in a form of a mixture of two or more kinds thereof. When the mixture of two or more kinds thereof is used, the mixed ratio is not particularly limited.

The amount of the radical initiator is preferably 1 to 20% by mole based on all monomer or oligomer molar amount.

The polymerization temperature is usually 0 to 150° C., and preferably 40 to 100° C.

The polymerization reaction is usually carried out in the presence of a solvent and it is preferred to use a solvent which is sufficient to dissolve the monomer, the radical initiator and the resin obtained. Examples thereof include a hydrocarbon solvent such as toluene; an ether solvent such as 1,4-dioxane and tetrahydrofuran; a ketone solvent such as methyl isobutyl ketone; an alcohol solvent such as isopropyl alcohol; a cyclic ester solvent such as γ-butyrolactone; a glycol ether ester ester solvent such as propylene glycol monomethyl ether acetate; and an acyclic ester solvent such as ethyl lactate. These solvents may be used alone and a mixture thereof may be used.

The amount of the solvent is not limited, and practically, it is preferably 1 to 5 parts by weight relative to 1 part of all monomers or oligomers.

When an alicyclic compound having an olefinic double bond and an aliphatic unsaturated dicarboxylic anhydride are used as monomers, it is preferable to use them in excess amount in view of a tendency that these are not easily polymerized.

After competition of the polymerization reaction, the resin produced can be isolated, for example, by adding a solvent in which the present resin is insoluble or poorly soluble to the reaction mixture obtained and filtering the precipitated resin. If necessary, the isolated resin may be purified, for example, by washing with a suitable solvent.

The present resist composition preferably includes 80 to 99.9% by weight of the resin component and 0.1 to 20% by weight of sum of Salt (I) and Salt (II) based on the total amount of the resin component, Salt (I) and Salt (II).

The amount ratio of Salt (I) and Salt (II) is usually 9/1 to 1/9.

In the present resist composition, performance deterioration caused by inactivation of acid which occurs due to post exposure delay can be diminished by adding an organic base compound, particularly a nitrogen-containing organic base compound as a quencher.

Specific examples of the nitrogen-containing organic base compound include an amine compound represented by the following formulae:

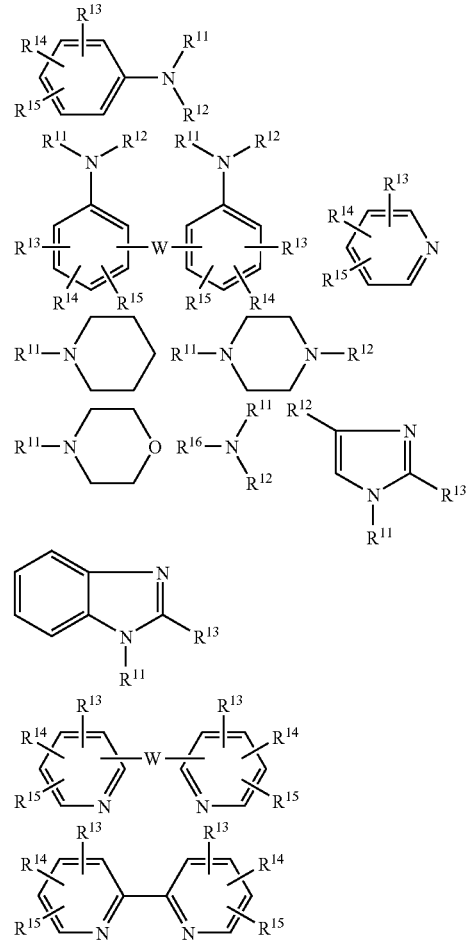

wherein $R^{11}$ and $R^{12}$ independently represent a hydrogen atom, an alkyl group, a cycloalkyl group or an aryl group, and the alkyl, cycloalkyl and aryl group may be substituted with at least one group selected from a hydroxyl group, an amino group which may be substituted with a C1-C4 alkyl group and a C1-C6 alkoxy group which may be substituted with a C1-C6 alkoxy group, $R^{13}$ and $R^{14}$ independently represent a hydrogen atom, an alkyl group, a cycloalkyl group, an aryl group or an alkoxy group, and the alkyl, cycloalkyl, aryl and alkoxy group may be substituted with at least one group selected from a hydroxyl group, an amino group which may be substituted with a C1-C4 alkyl group and a C1-C6 alkoxy group, or $R^{13}$ and $R^{14}$ bond together with the carbon atoms to which they bond to form an aromatic ring, $R^{15}$ represent a hydrogen atom, an alkyl group, a cycloalkyl group, an aryl group, an alkoxy group or a nitro group, and the alkyl, cycloalkyl, aryl and alkoxy group which may be substituted with at least one group selected from a hydroxyl group, an amino group which may be substituted with a C1-C4 alkyl group and a C1-C6 alkoxy group, $R^{16}$ represents an alkyl or cycloalkyl group, and the alkyl and cycloalkyl group may be substituted with at least one group selected from a hydroxyl group, an amino group which may be substituted with a C1-C4 alkyl group and a C1-C6 alkoxy group, and W represents —CO—, —NH—, —S—, —S—S—, an alkylene group of which at least one methylene group may be replaced with —O—, or an alkenylene group of which at least one methylene group may be replaced with —O—, and a quaternary ammonium hydroxide represented by the following formula:

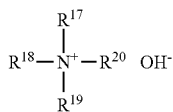

wherein $R^{17}$, $R^{18}$, $R^{19}$ and $R^{20}$ independently represent an alkyl group, a cycloalkyl group or an aryl group, and the alkyl, cycloalkyl and aryl group may be substituted with at least one group selected from a hydroxyl group, an amino group which may be substituted with a C1-C4 alkyl group and a C1-C6 alkoxy group.

The alkyl group in $R^{11}$, $R^{12}$, $R^{13}$, $R^{14}$, $R^{15}$, $R^{16}$, $R^{17}$, $R^{18}$, $R^{19}$ and $R^{20}$ preferably has about 1 to 10 carbon atoms, and more preferably has about 1 to 6 carbon atoms.

Examples of the amino group which may be substituted with the C1-C4 alkyl group include an amino, methylamino, ethylamino, n-butylamino, dimethylamino and diethylamino group. Examples of the C1-C6 alkoxy group which may be substituted with the C1-C6 alkoxy group include a methoxy, ethoxy, n-propoxy, isopropoxy, n-butoxy, tert-butoxy, n-pentyloxy, n-hexyloxy and 2-methoxyethoxy group.

Specific examples of the alkyl group which may be substituted with at least one group selected from a hydroxyl group, an amino group which may be substituted with a C1-C4 alkyl group, and a C1-C6 alkoxy group which may be substituted with a C1-C6 alkoxy group include a methyl, ethyl, n-propyl, isopropyl, n-butyl, tert-butyl, n-pentyl, n-hexyl, n-octyl, n-nonyl, n-decyl, 2-(2-methoxyethoxy)ethyl, 2-hydroxyethyl, 2-hydroxypropyl, 2-aminoethyl, 4-aminobutyl and 6-aminohexyl group.

The cycloalkyl group in $R^{11}$, $R^{12}$, $R^{13}$, $R^{14}$, $R^{15}$, $R^{16}$, $R^{17}$, $R^{18}$, $R^{19}$ and $R^{20}$ preferably has about 5 to 10 carbon atoms. Specific examples of the cycloalkyl group which may be substituted with at least one group selected from a hydroxyl group, an amino group which may be substituted with a C1-C4 alkyl group and a C1-C6 alkoxy group include a cyclopentyl, cyclohexyl, cycloheptyl and cyclooctyl group.

The aryl group in $R^{11}$, $R^{12}$, $R^{13}$, $R^{14}$, $R^{15}$, $R^{17}$, $R^{18}$, $R^{19}$ and $R^{20}$ preferably has about 6 to 10 carbon atoms. Specific examples of the aryl group which may be substituted with at least one group selected from a hydroxyl group, an amino group which may be substituted with a C1-C4 alkyl group and a C1-C6 alkoxy group include a phenyl and naphthyl group.

The alkoxy group in $R^{13}$, $R^{14}$ and $R^{15}$ preferably has about 1 to 6 carbon atoms and specific examples thereof include a methoxy, ethoxy, n-propoxy, isopropoxy, n-butoxy, tert-butoxy, n-pentyloxy and n-hexyloxy group.

The alkylene and alkenylene groups in W preferably have 2 to 6 carbon atoms. Specific examples of the alkylene group include an ethylene, trimethylene, tetramethylene, methylenedioxy and ethylene-1,2-dioxy group, and specific examples of the alkenylene group include an ethane-1,2-diyl, 1-propene-1,3-diyl and 2-butene-1,4-diyl group.

Specific examples of the amine compound include n-hexylamine, n-heptylamine, n-octylamine, n-nonylamine, n-decylamine, aniline, 2-methylaniline, 3-methylaniline, 4-methylaniline, 4-nitroaniline, 1-naphthylamine, 2-naphthylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptyamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecyamine, dicyclohexylmethylamine, tris[2-(2-methoxyethoxy)ethyl]amine, triisopropanolamine, N,N-dimethylaniline, 2,6-diisopropylaniline, imidazole, benzimidazole, pyridine, 4-methylpyridine, 4-methylimidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(4-pyridyloxy)ethane, 4,4'-dipyridyl sulfide, 4,4'-dipyridyl disulfide, 1,2-bis(4-pyridyl)ethylene, 2,2'-dipicolylamine and 3,3'-dipicolylamine.

Examples of the quaternary ammonium hydroxide include tetramethylammonium hydroxide, tetrabutylammonium hydroxide, tetrahexylammonium hydroxide, tetraoctylammonium hydroxide, phenyltrimethylammonium hydroxide, (3-trifluoromethylphenyl)trimethylammonium hydroxide and (2-hydroxyethyl)trimethylammonium hydroxide (so-called "choline").

A hindered amine compound having a piperidine skelton as disclosed in JP 11-52575 A1 can be also used as the quencher.

In the point of forming patterns having higher resolution, the quaternary ammonium hydroxide is preferably used as the quencher.

When the basic compound is used as the quencher, the present resist composition preferably includes 0.01 to 1% by weight of the basic compound based on the total amount of the resin component, Salt (I) and Salt (II).

The present resist composition can contain, if necessary, a small amount of various additives such as a sensitizer, a solution suppressing agent, other polymers, a surfactant, a stabilizer and a dye as long as the effect of the present invention is not prevented.

The present resist composition is usually in the form of a resist liquid composition in which the above-mentioned ingredients are dissolved in a solvent and the resist liquid composition is applied onto a substrate such as a silicon wafer by a conventional process such as spin coating. The solvent used is sufficient to dissolve the above-mentioned ingredients, have an adequate drying rate, and give a uniform and smooth coat after evaporation of the solvent. Solvents generally used in the art can be used.

Examples of the solvent include a glycol ether ester such as ethyl cellosolve acetate, methyl cellosolve acetate and propylene glycol monomethyl ether acetate; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone. These solvents may be used alone and two or more thereof may be mixed to use.

A resist film applied onto the substrate and then dried is subjected to exposure for patterning, then heat-treated to facilitate a deblocking reaction, and thereafter developed with an alkali developer. The alkali developer used may be any one of various alkaline aqueous solution used in the art. Generally, an aqueous solution of tetramethylammonium hydroxide or (2-hydroxyethyl)trimethylammonium hydroxide (commonly known as "choline") is often used.

It should be construed that embodiments disclosed here are examples in all aspects and not restrictive. It is intended that the scope of the present invention is determined not by the above descriptions but by appended claims, and includes all variations of the equivalent meanings and ranges to the claims.

The present invention will be described more specifically by way of examples, which are not construed to limit the scope of the present invention. The "%" and "part(s)" used to represent the content of any component and the amount of any material used in the following examples and comparative examples are on a weight basis unless otherwise specifically noted. The weight-average molecular weight of any material used in the following examples is a value found by gel permeation chromatography [HLC-8120GPC Type, Column (Three Columns): TSKgel Multipore HXL-M, Solvent: Tetrahydrofuran, manufactured by TOSOH CORPORATION] using styrene as a standard reference material. Structures of compounds were determined by NMR (GX-270 Type, or EX-270 Type, manufactured by JEOL LTD) and mass spectrometry (Liquid Chromatography: 1100 Type, manufactured by AGILENT TECHNOLOGIES LTD., Mass Spectrometry: LC/MSD Type or LC/MSD TOF Type, manufactured by AGILENT TECHNOLOGIES LTD.).

SALT SYNTHETIC EXAMPLE 1

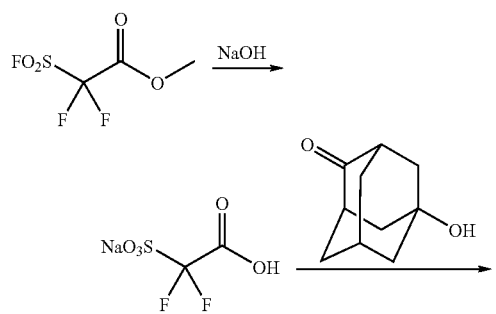

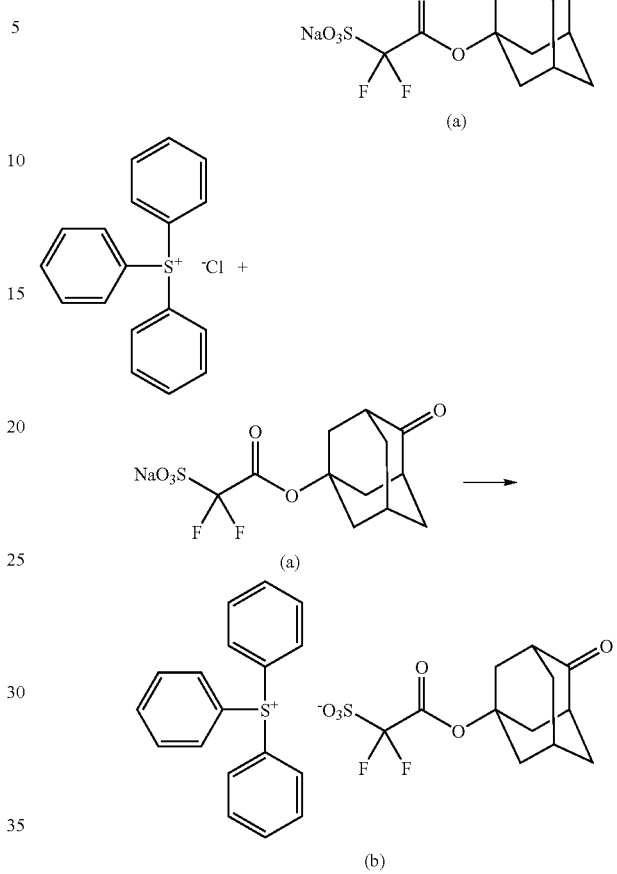

(1) 230 Parts of 30% aqueous sodium hydroxide solution was added into a mixture of 100 parts of methyl difluoro(fluorosulfonyl)acetate and 250 parts of ion-exchanged water in a ice bath. The resultant mixture was heated and refluxed at 100° C. for 3 hours. After cooling, the cooled mixture was neutralized with 88 parts of conc. hydrochloric acid and the solution obtained was concentrated to obtain 164.8 parts of sodium salt of difluorosulfoacetic acid (containing inorganic salt, purity: 62.8%).

(2) 5.0 Parts of sodium difluorosulfoacetate (purity: 62.8%), 2.6 parts of 4-oxo-1-adamantanol and 100 parts of ethylbenzene were mixed and 0.8 parts of conc. sulfuric acid was added thereto. The resultant mixture was refluxed for 30 hours. After cooling, the mixture was filtrated to obtain solids, and the solids were washed with tert-butyl methyl ether to obtain 5.5 parts of the salt represented by the above-mentioned formula (a). The purity thereof was 35.6%, which was calculated by the result of $^1$H-NMR analysis.

$^1$H-NMR (dimethylsulfoxide-$d_6$, Internal Standard: tetramethylsilane): d (ppm) 1.84 (d, 2H, J=13.0 Hz), 2.00 (d, 2H, J=11.9 Hz), 2.29-2.32 (m, 7H), 2.54 (s, 2H)

(3) To 5.4 Parts of the salt represented by the formula (a), which was obtained in (2) (purity: 35.6%), a mixed solvent of 16 parts of acetonitrile and 16 parts of ion-exchanged water was added. To the resultant mixture, a solution prepared by mixing 1.7 parts of triphenylsulfonium chloride, 5 parts of acetonitrile and 5 parts of ion-exchanged water was added. After stirred for 15 hours, the mixture obtained was concentrated and extracted with 142 parts of chloroform.

The organic layer obtained was washed with ion-exchanged water and concentrated. The concentrate obtained was washed with 24 parts of tert-butyl methyl ether and the solvent was decanted to remove to obtain 1.7 parts of the salt represented by the above-mentioned formula (b) in the form of white solid, which is called as B1.

$^1$H-NMR (dimethylsulfoxide-$d_6$, Internal Standard: tetramethylsilane): d (ppm) 1.83 (d, 2H, J=12.7 Hz), 2.00 (d, 2H, J=12.0 Hz), 2.29-2.32 (m, 7H), 2.53 (s, 2H), 7.75-7.91 (m, 15H)

MS (ESI(+) Spectrum): M+ 263.2 ($C_{18}H_{15}S^+$=263.09)

MS (ESI(-) Spectrum): M− 323.0 ($C_{12}H_{13}F_2O_6S^-$=323.04)

SALT SYNTHETIC EXAMPLE 2

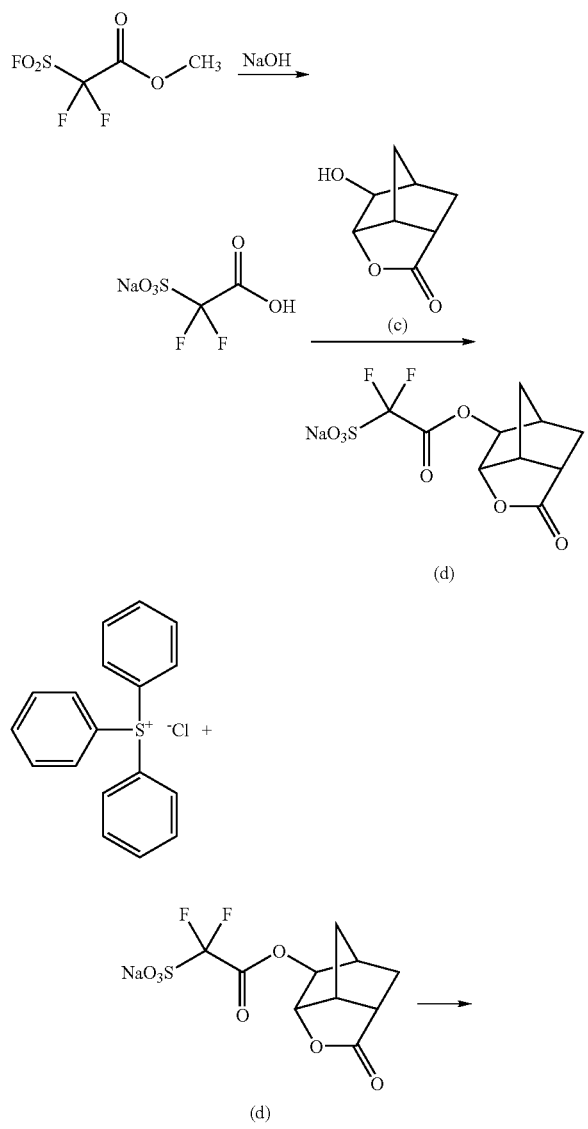

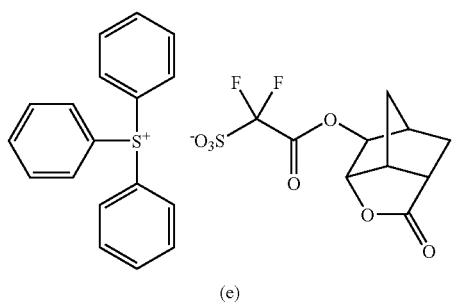

(1) 230 Parts of 30% aqueous sodium hydroxide solution was added into a mixture of 100 parts of methyl difluoro(fluorosulfonyl)acetate and 250 parts of ion-exchanged water in a ice bath. The resultant mixture was heated and refluxed at 100° C. for 3 hours. After cooling, the cooled mixture was neutralized with 88 parts of conc. hydrochloric acid and the solution obtained was concentrated to obtain 164.8 parts of sodium salt of difluorosulfoacetic acid (containing inorganic salt, purity: 62.8%).

(2) 30 Parts of sodium salt of difluorosulfoacetic acid (purity: 62.8%), 14.7 parts of the compound represented by the above-mentioned formula (c) and 300 parts of toluene were mixed and 18.1 part of p-toluenesulfonic acid was added thereto. The resultant mixture was heated and refluxed for 12 hours. The solution obtained was filtrated to obtain the solids. The solids obtained were mixed with 100 parts of acetonitrile and the resultant mixture was filtrated. The filtrate obtained was concentrated to obtain 26.7 parts of the salt represented by the above-mentioned formula (d).

$^1$H-NMR (dimethylsulfoxide-$d_6$, Internal Standard: tetramethylsilane): d (ppm) 1.57-1.67 (m, 2H), 1.91-2.06 (m, 2H), 2.53 (dd, 1H), 3.21 (td, 1H), 4.51 (d, 1H), 4.62 (s, 1H)

(3) 26.7 Parts of the salt represented by the formula (d), which was obtained in above (2), was dissolved in 267 parts of acetonitrile.

To the resultant solution, 23.9 parts of triphenylsulfonium chloride and 239 parts of ion-exchanged water were added. The resultant mixture was stirred for 15 hours, and then concentrated. The residue obtained was extracted twice with 200 parts of chloroform. The organic layers obtained was mixed, washed with ion-exchanged water and then concentrated.

The concentrate obtained was mixed with 200 parts of tert-butyl methyl ether and the mixture obtained was filtrated to obtain 37.7 part of the salt represented by the above-mentioned formula (e) in the form of a pale yellow oil, which is called as B2.

$^1$H-NMR (dimethylsulfoxide-$d_6$, Internal Standard: tetramethylsilane): d (ppm) 1.57-1.67 (m, 2H), 1.91-2.06 (m, 2H), 2.53 (dd, 1H), 3.21 (td, 1H), 4.51 (d, 1H), 4.62 (s, 1H), 7.76-7.91 (m, 15H)

MS (ESI(+) Spectrum): M+ 263.2 ($C_{18}H_{15}S^+$=263.09)

MS (ESI(-) Spectrum): M− 311.0 ($C10H_9F_2O_7S^-$=311.00)

SALT SYNTHETIC EXAMPLE 3

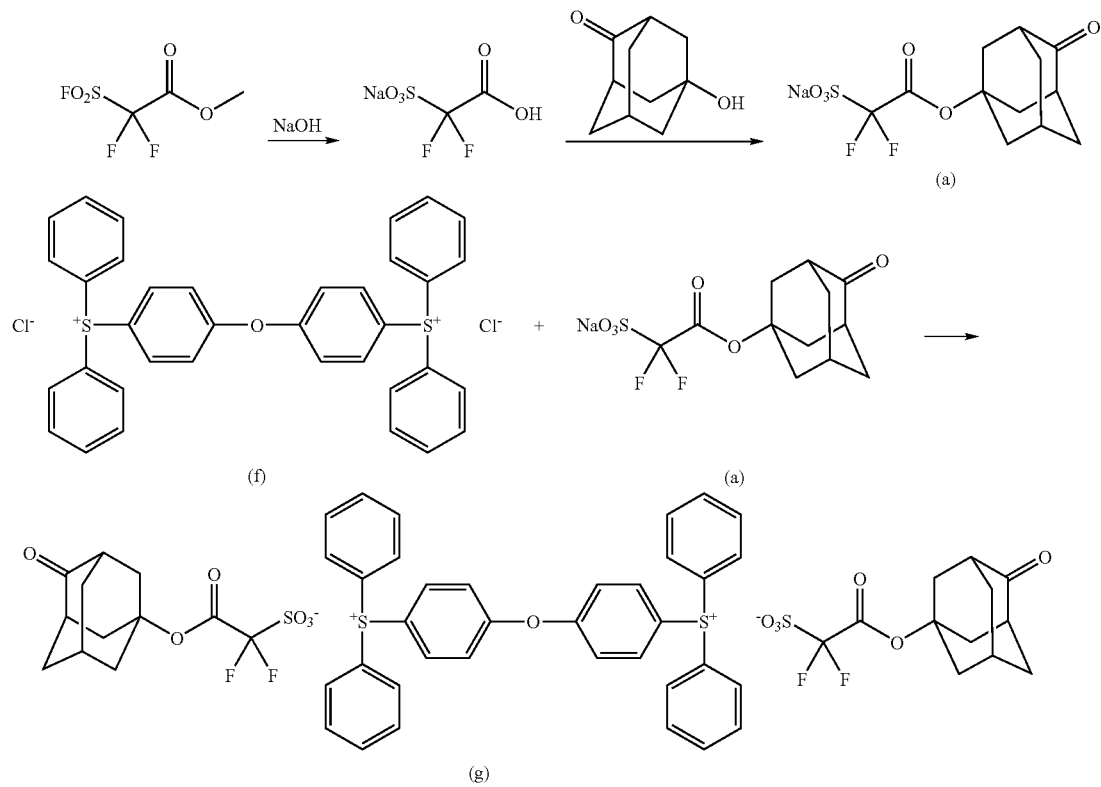

(1) 460 Parts of 30% aqueous sodium hydroxide solution was added into a mixture of 200 parts of methyl difluoro(fluorosulfonyl)acetate and 300 parts of ion-exchanged water in a ice bath. The resultant mixture was heated and refluxed at 100° C. for 2.5 hours. After cooling, the cooled mixture was neutralized with 175 parts of conc. hydrochloric acid and the solution obtained was concentrated to obtain 328.19 parts of sodium salt of difluorosulfoacetic acid (containing inorganic salt, purity: 62.8%).

(2) 5.0 Parts of sodium difluorosulfoacetate (purity: 62.8%) which was obtained in (1), 2.6 parts of 4-oxo-1-adamantanol and 100 parts of ethylbenzene were mixed and 0.8 parts of conc. sulfuric acid was added thereto. The resultant mixture was refluxed for 30 hours. After cooling, the mixture was filtrated to obtain solids, and the solids were washed with tert-butyl methyl ether to obtain 5.5 parts of the salt represented by the above-mentioned formula (a). The purity thereof was 57.6%, which was calculated by the result of $^1$H-NMR analysis.

$^1$H-NMR (dimethylsulfoxide-$d_6$, Internal Standard: tetramethylsilane): d (ppm) 1.84 (d, 2H), 2.00 (d, 2H), 2.29-2.32 (m, 7H), 2.54 (s, 2H)

(3) To 4.3 Parts of the salt represented by the formula (a), which was obtained in above (2) (purity: 57.6%), 43.0 parts of chloroform was added. To the resultant mixture, 2.2 parts of the sulfonium salt represented by the above-mentioned formula (f) and 11.7 parts of ion-exchanged water were added. After stirred for 15 hours, the mixture obtained was separated to an organic layer and an aqueous layer. The organic layer was repeated to wash with ion-exchanged water until the aqueous layer obtained was neutralized, and then concentrated. The concentrate obtained was mixed with 15.0 parts of tert-butyl methyl ether and the supernatant was removed by decantation. The residue obtained was dried to obtain 2.3 parts of the salt represented by the above-mentioned formula (g) in the form of white solid, which is called as B3.

$^1$H-NMR (dimethylsulfoxide-$d_6$, Internal Standard: tetramethylsilane): d (ppm) 1.82 (d, 2H), 1.98 (d, 2H), 2.27-2.35 (m, 7H), 2.51 (s, 2H), 7.52 (d, 4H), 7.74-7.89 (m, 20H), 7.91 (d, 4H)

SALT SYNTHETIC EXAMPLE 4

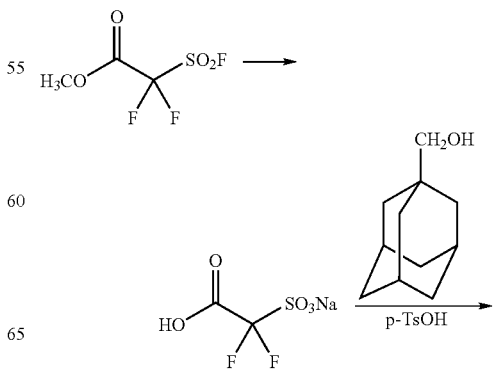

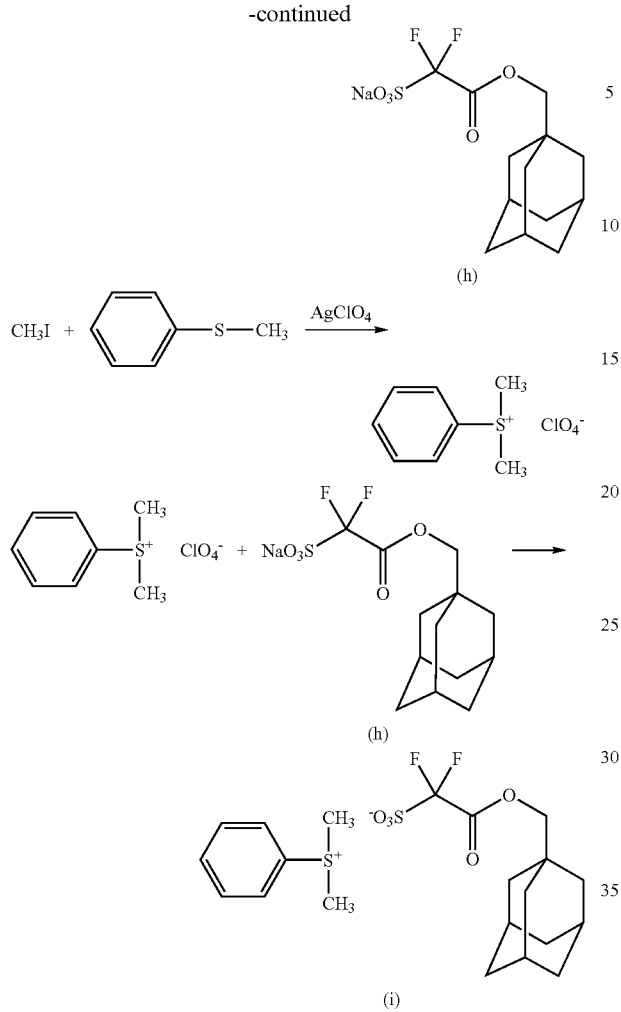

(1) 460 Parts of 30% aqueous sodium hydroxide solution was added into a mixture of 200 parts of methyl difluoro(fluorosulfonyl)acetate and 300 parts of ion-exchanged water in a ice bath. The resultant mixture was heated and refluxed at 100° C. for 2.5 hours. After cooling, the cooled mixture was neutralized with 175 parts of conc. hydrochloric acid and the solution obtained was concentrated to obtain 328.19 parts of sodium salt of difluorosulfoacetic acid (containing inorganic salt, purity: 62.8%).

(2) 75.1 Parts of p-toluenesulfonic acid was added to a mixture of 123.3 parts of sodium salt of difluorosulfoacetic acid (purity: 62.8%), 65.1 parts of 1-adamantanemethanol and 600 parts of dichloroethane, and the resultant mixture was heated and refluxed for 12 hours. The mixture was concentrated to remove dichloroethane and 400 parts of tert-butyl methyl ether was added to the residue obtained. The mixture obtained was stirred and filtrated to obtain the solid. To the solid, 400 parts of acetonitrile was added and the resultant mixture was stirred and filtrated and this operation was repeated again.

The filtrates obtained were mixed and the solution obtained was concentrated to obtain 99.5 parts of the salt represented by the above-mentioned formula (h).

$^1$H-NMR (dimethylsulfoxide-$d_6$, Internal standard: tetramethylsilane): δ (ppm) 1.51 (d, 6H), 1.62 (dd, 6H), 1.92 (s, 3H), 3.80 (s, 2H)

(3) 5.0 Parts of thioanisole was dissolved in 15.0 parts of acetonitrile. 8.35 Parts of silver (I) perchlorate was added thereto and then 11.4 parts of acetonitrile solution containing 5.71 parts of methyl iodide was added. The resultant mixture was stirred for 24 hours.

The precipitate was filtrated to remove and the filtrate was concentrated. The concentrate was mixed with 36.8 parts of tert-butyl methyl ether and the resultant mixture was stirred and filtrated to obtain 8.22 parts of dimethylphenylsulfonium perchlorate as white solid.

(4) 5.98 Parts of the salt represented by the above-mentioned formula (h), which was obtained in the above-mentioned (2) was mixed with 35.9 parts of chloroform. To the resultant mixture, a solution obtained by mixing 4.23 parts of dimethylphenylsulfonium perchlorate obtained in (3) with 12.7 parts of ion-exchanged water was added. The resultant mixture was stirred for 4 hours, and separated to an organic layer and an aqueous layer. The aqueous layer was extracted with 23.9 parts of chloroform to obtain a chloroform layer. The organic layer and the chloroform layer were mixed and repeated to wash with ion-exchanged water until the aqueous layer obtained was neutralized, and then concentrated. The concentrate obtained was mixed with 31.8 parts of tert-butyl methyl ether and the resultant mixture was filtrated to obtain 5.38 parts of the salt represented by the above-mentioned formula (i) in the form of white solid, which is called as B4.

$^1$H-NMR (dimethylsulfoxide-$d_6$, Internal standard: tetramethylsilane): δ (ppm) 1.51 (d, 6H), 1.62 (dd, 6H), 1.92 (s, 3H), 3.26 (s, 6H), 3.80 (s, 2H), 7.68-7.80 (m, 3H), 8.03-8.06 (m, 2H)

MS (ESI(+) Spectrum): M$^+$ 193.0 ($C_{18}H_{15}S^+$=139.06)

MS (ESI(−) Spectrum): M$^−$ 323.0 ($C_{13}H_{17}F_2O_5S$-=323.08)

SALT SYNTHETIC EXAMPLE 5

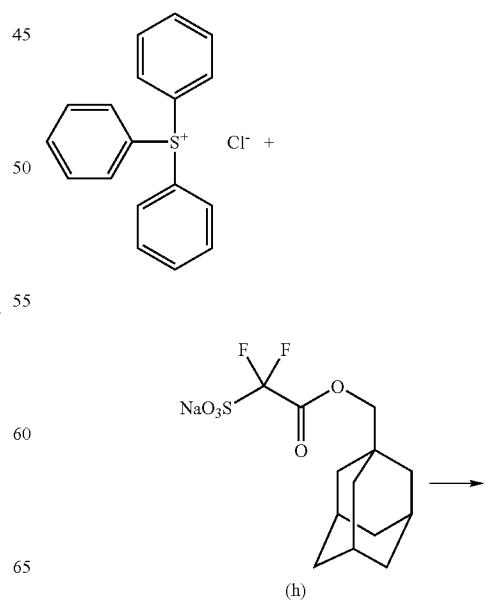

-continued

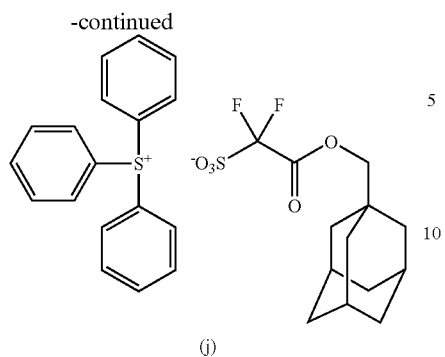

(j)

(1) 32.8 Parts of the salt represented by the above-mentioned formula (h), which was obtained according to similar method described in above Salt Synthetic Example 4 (1) and (2), was dissolved in 100 parts of ion-exchanged water. To the resultant solution, a mixture of 28.3 parts of triphenylsulfonium chloride and 140 parts of methanol was added to stir for 15 hours. The resultant mixture was concentrated. The residue obtained was extracted twice with 200 parts of chloroform. The organic layers obtained were mixed and repeated to wash with ion-exchanged water until the aqueous layer obtained was neutralized.

The solution obtained was concentrated. To the concentrate, 300 parts of tert-butyl methyl ether was added and stirred. The resultant mixture was filtrated and the solid obtained was dried to obtain 39.7 parts of the salt represented by the above-mentioned formula (j) in the form of white solid, which is called as B5.

$^1$H-NMR (dimethylsulfoxide-$d_6$, Internal standard: tetramethylsilane): δ (ppm) 1.52 (d, 6H), 1.63 (dd, 6H), 1.93 (s, 3H), 3.81 (s, 2H), 7.76-7.90 (m, 15H)

MS (ESI(+) Spectrum): M$^+$ 263.2 ($C_{18}H_{15}S^+$=263.09)

MS (ESI(−) Spectrum): M$^−$ 323.0 ($C_{13}H_{17}F_2O_5S^−$=323.08)

SALT SYNTHETIC EXAMPLE 6

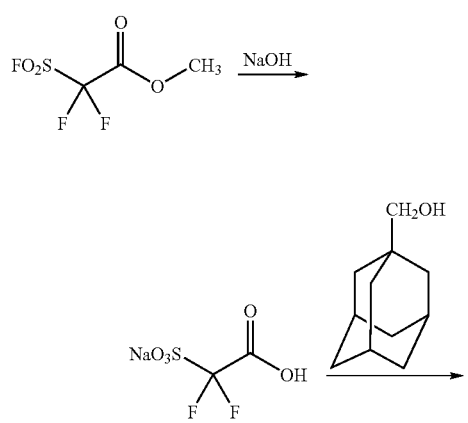

-continued (h)

(k)

(1) 460 Parts of 30% aqueous sodium hydroxide solution was added into a mixture of 200 parts of methyl difluoro(fluorosulfonyl)acetate and 300 parts of ion-exchanged water in a ice bath. The resultant mixture was heated and refluxed at 100° C. for 2.5 hours. After cooling, the cooled mixture was neutralized with 175 parts of conc. hydrochloric acid and the solution obtained was concentrated to obtain 328.19 parts of sodium salt of difluorosulfoacetic acid (containing inorganic salt, purity: 62.8%).

(2) 123.3 Parts of sodium salt of difluorosulfoacetic acid (purity: 62.8%), 65.7 parts of 1-adamantanemethanol and 600 parts of dichloroethane were mixed and 75.1 parts of p-toluenesulfonic acid was added thereto.

The resultant mixture was heated and refluxed for 12 hours. The solution obtained was concentrated to remove dichloroethane. The residue obtained was mixed with 400 parts of tert-butyl methyl ether and the resultant mixture was stirred.

The mixture was filtrated to obtain the solid. The solid was mixed with 400 parts of acetonitrile and the resultant mixture was filtrated to obtain the filtrate and the solid.

The solid obtained was mixed with 400 parts of acetonitrile and the resultant mixture was filtrated to obtain the filtrate and the solid.

The filtrates obtained were mixed and concentrated to obtain 99.5 parts of the salt represented by the above-mentioned formula (h).

$^1$H-NMR (dimethylsulfoxide-$d_6$, Internal Standard: tetramethylsilane): δ (ppm) 1.51 (d, 6H), 1.62 (dd, 6H), 1.92 (s, 3H), 3.80 (s, 2H)

(3) 150 Parts of 2-bromoacetophenone was dissolved in 375 parts of acetone, and 66.5 parts of tetrahydrothiophene was added dropwise to the solution obtained. The resultant mixture was stirred at room temperature for 24 hours and the white precipitates were filtrated, washed, and dried to obtain 207.9 parts of 1-(2-oxo-2-phenylethyl)tetrahydrothiophenium bromide in the form of white crystals.

$^1$H-NMR (dimethylsulfoxide-$d_6$, Internal standard: tetramethylsilane): δ (ppm) 2.13-2.36 (m, 4H), 3.50-3.67 (m, 4H), 5.41 (s, 2H), 7.63 (t, 2H), 7.78 (t, 1H), 8.02 (d, 2H)

(4) 99.5 Parts of the salt represented by the formula (h), which was obtained in above (2), was dissolved in 298 parts of acetonitrile. To the solution obtained, 79.5 parts of 1-(2-oxo-2-phenylethyl)tetrahydrothiophenium bromide obtained in above (3) and 159 parts of ion-exchanged water. The resultant mixture was stirred for 15 hours and concentrated. The concentrate obtained was extracted twice with 500 parts of chloroform. The organic layers obtained were mixed, washed with ion-exchanged water and concentrated. To the concentrate, 250 parts of tert-butyl methyl ether was added and the resultant mixture was stirred and filtrated. The solid obtained was dried under reduced pressure to obtain 116.9 parts of the salt represented by the above-mentioned formula (k) in the form of white solid, which is called as C1.

$^1$H-NMR (dimethylsulfoxide-$d_6$, Internal Standard: tetramethylsilane): d (ppm) 1.50 (d, 6H), 1.62 (dd, 6H), 1.92 (s, 3H), 2.13-2.32 (m, 4H), 3.45-3.63 (m, 4H), 3.80 (s, 2H), 5.30 (s, 2H), 7.62 (t, 2H), 7.76 (t, 1H), 8.00 (d, 2H)

MS (ESI(+) Spectrum): M+ 207.0 ($C_{12}H_{15}OS^+$=207.08)
MS (ESI(−) Spectrum): M− 323.0 ($C_{13}H_{17}F_2O_5S^−$=323.08)

SALT SYNTHETIC EXAMPLE 7

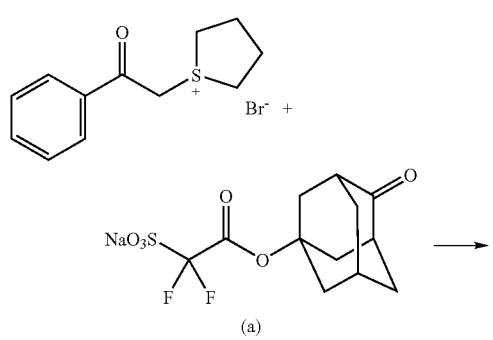

(1) 10.0 Parts of the salt represented by the formula (a) (purity: 55.2%), which was obtained according to similar method described in Salt Synthetic Example 1 (1) and (2), was mixed with a mixed solvent of 30 parts of acetonitrile and 20 parts of ion-exchanged water. To the resultant mixture, the solution prepared by mixing 5.0 parts of 1-(2-oxo-2-phenylethyl)tetrahydrothiophenium bromide, 10 parts of acetonitrile and 5 parts of ion-exchanged water was added. After stirred for 15 hours, the stirred mixture was concentrated and extracted with 98 parts of chloroform. The organic layer was washed with ion-exchanged water. The obtained organic layer was concentrated. The concentrate was mixed with 70 parts of ethyl acetate and the resultant mixture was filtrated to obtain 5.2 parts of the salt represented by the above-mentioned formula (o) in the form of white solid, which is called as C2.

$^1$H-NMR (dimethylsulfoxide-$d_6$, Internal Standard: tetramethylsilane): d (ppm) 1.83 (d, 2H, J=12.5 Hz), 2.00 (d, 2H, J=12.0 Hz), 2.21-2.37 (m, 11H), 2.53 (s, 2H), 3.47-3.62 (m, 4H), 5.31 (s, 2H), 7.63 (t, 2H, J=7.3 Hz), 7.78 (t, 1H, J=7.6 Hz), 8.01 (dd, 2H, J=1.5 Hz, 7.3 Hz)

MS (ESI(+) Spectrum): M+ 207.1 (C12H$_{15}$OS$^+$=207.08)
MS (ESI(−) Spectrum): M− 323.0 ($C_{12}H_{13}F_2O_6S^−$=323.04)

SALT SYNTHETIC EXAMPLE 8

-continued

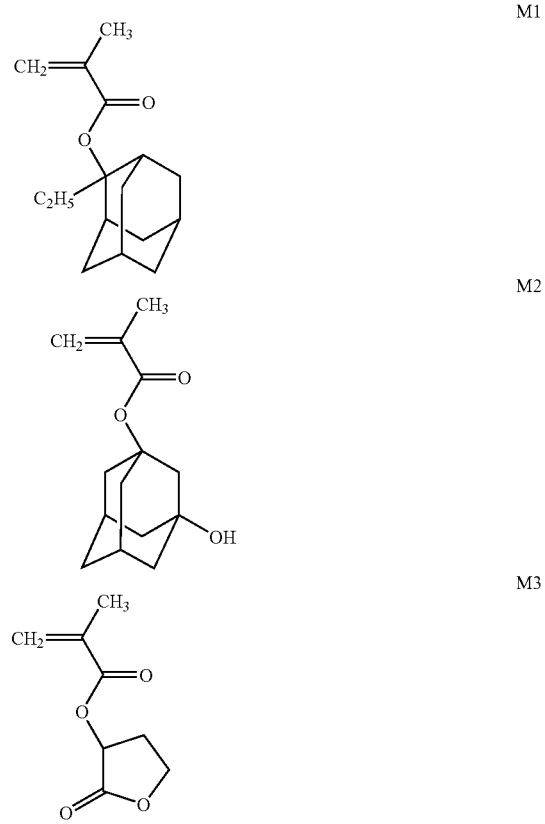

(1) 50 Parts of 2-bromo-4'-methoxyacetophenone was dissolved in 150 parts of acetone and 19 parts of tetrahydrothiophene was added dropwise thereto. The resultant mixture was stirred at room temperature for 24 hours, and then filtrated to obtain the white precipitate. The precipitate was washed with acetone and dried to obtain 63 parts of 1-[2-oxo-2-(4'-methoxyphenylethyl)]tetrahydrothiophenium bromide in the form of white solid.

$^1$H-NMR (dimethylsulfoxide-$d_6$, Internal Standard: tetramethylsilane): d (ppm) 2.14-2.34 (m, 4H), 3.48-3.65 (m, 4H), 3.89 (s, 3H), 5.39 (s, 2H), 7.15 (d, 2H, J=8.9 Hz), 8.00 (d, 2H, J=8.9 Hz)

(2) 3.05 Parts of the salt represented by the above-mentioned formula (h), which was obtained according to similar method descried in Salt Synthetic Example 6 (1) and (2), was dissolved in 15.3 parts of acetonitrile.

To the resultant solution, a solution, which was prepared by mixing 2.61 parts of 1-[2-oxo-2-(4'-methoxyphenylethyl)] tetrahydrothiophenium bromide, which was obtained in above (1), and 13.1 parts of ion-exchanged water was added. The resultant mixture was stirred for 15 hours and concentrated. The residue obtained was extracted twice with 50 parts of chloroform and the extracts obtained were washed with ion-exchanged water and concentrated. The concentrate was mixed with 30 parts of tert-butyl methyl ether and the resultant mixture was filtrated to obtain the solid. The solid was dried to obtain 3.44 parts of the salt represented by the above-mentioned formula (p) in the form of white solid, which is called as C3.

$^1$H-NMR (dimethylsulfoxide-$d_6$, Internal Standard: tetramethylsilane): d (ppm) 1.52 (d, 6H), 1.63 (dd, 6H), 1.93 (s, 3H), 2.12-2.30 (m, 4H), 3.43-3.60 (m, 4H), 3.81 (s, 2H), 3.88 (s, 3H), 5.26 (s, 2H), 7.15 (d, 2H), 7.98 (d, 2H)

MS (ESI(+)  Spectrum): M+ 237.2 ($C_{13}H_{17}O_2S^+$=237.09)

MS (ESI(−) Spectrum): M− 323.0 ($C_{13}H_{17}F_2O_5S^-$=323.08)

RESIN SYNTHETIC EXAMPLE 1

Monomers used in this Resin Synthetic Example are following monomers M1, M2 and M3.

The monomer M1, monomer M2 and monomer M3 were dissolved in 2 times amount of methyl isobutyl ketone as much as the amount of all monomers to be used (monomer molar ratio; monomer M1: monomer M2: monomer M3=5: 2.5:2.5). To the solution, 2,2'-azobisisobutyronitrile was added as an initiator in a ratio of 2 mol % based on all monomer molar amount, and the resultant mixture was heated at 80° C. for about 8 hours. The reaction solution was poured into large amount of heptane to cause precipitation. The precipitate was isolated and washed twice with large amount of heptane for purification. As a result, copolymer having a weight-average molecular weight of about 9,200 was obtained. This copolymer had the following structural units. This is called as resin A1.

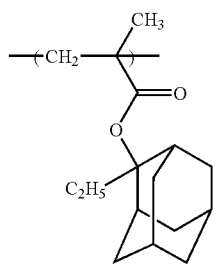

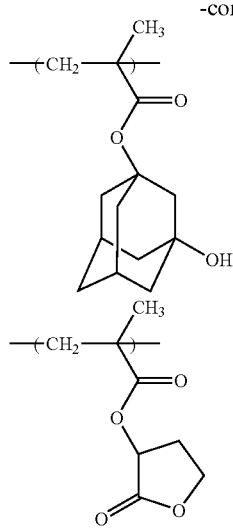

RESIN SYNTHETIC EXAMPLE 2

Monomers used in this Resin Synthetic Example are following monomers M1, M2 and M4.

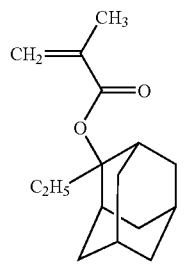
M1

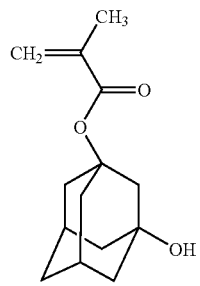
M2

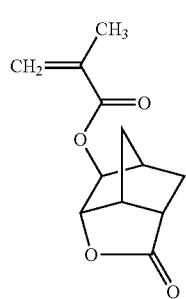
M4

The monomer M1, monomer M2 and monomer M4 were dissolved in 1.28 times amount of 1,4-dioxane as much as the amount of all monomers to be used (monomer molar ratio; monomer M1: monomer M2: monomer M4=50:25:25). To the solution, 2,2'-azobisisobutyronitrile was added as an initiator in a ratio of 3 mol % based on all monomer molar amount.

The solution obtained was added to 0.72 times amount of 1,4-dioxane as much as the amount of all monomers to be used at 88° C. for 2 hours.

The resultant mixture was stirred at the same temperature for 5 hours.

The reaction solution was cooled and then, was poured into large amount of a mixed solvent of methanol and water to cause precipitation. The precipitate was isolated and washed twice with large amount of methanol for purification. As a result, copolymer having a weight-average molecular weight of about 8,500 was obtained. This copolymer had the following structural units. This is called as resin A2.

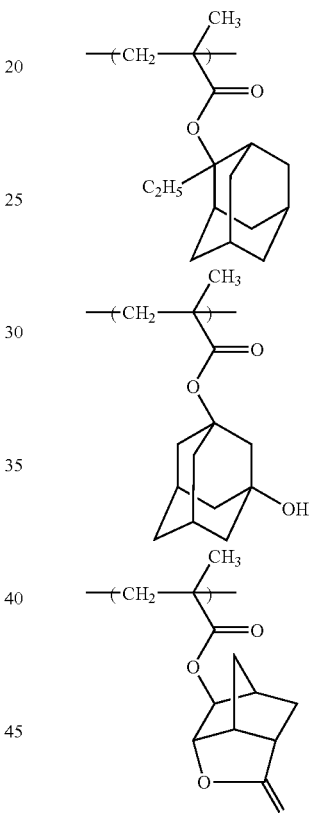

RESIN SYNTHETIC EXAMPLE 3

Monomers used in this Resin Synthetic Example are following monomers M1, M2, M3, M4 and M5.

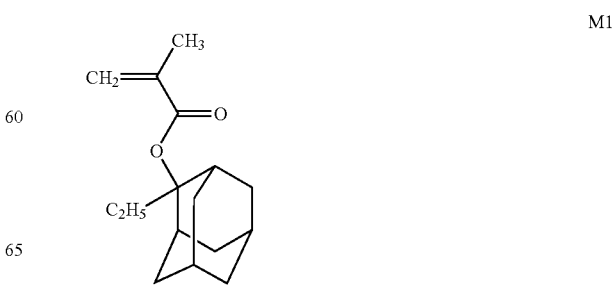
M1

M2

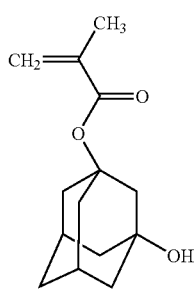

M3

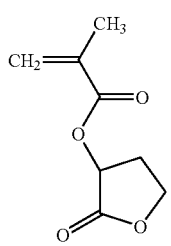

M4

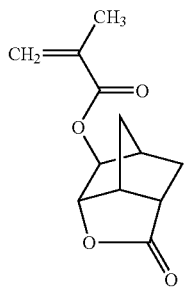

M5

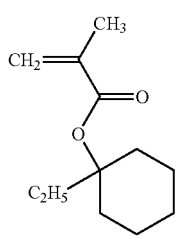

The monomer M1, monomer M2, monomer M3, monomer M4 and monomer M5 were dissolved in 1.3 times amount of 1,4-dioxane as much as the amount of all monomers to be used (monomer molar ratio; monomer M1: monomer M2: monomer M3: monomer M4: monomer M5=25:5:30:20:20). To the solution, 2,2'-azobisisobutyronitrile was added as an initiator in a ratio of 2.5 mol % based on all monomer molar amount. The solution obtained was added to 1.3 times amount of 1,4-dioxane as much as the amount of all monomers to be used at 87° C. for 2 hours. The resultant mixture was stirred at the same temperature for 6 hours. The reaction solution was cooled and then, was poured into large amount of methanol to cause precipitation. The precipitate was isolated and washed twice with large amount of methanol for purification. As a result, copolymer having a weight-average molecular weight of about 9,100 was obtained.

This copolymer had the following structural units. This is called as resin A3.

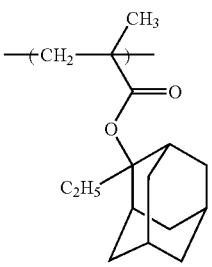

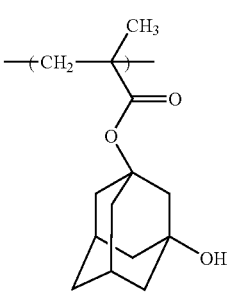

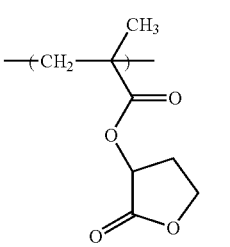

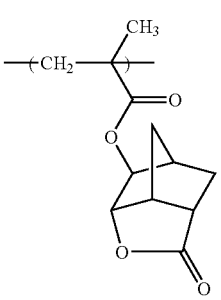

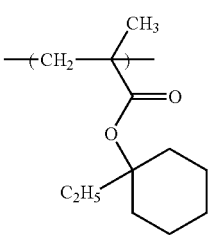

EXAMPLES 1 to 10 and COMPARATIVE EXAMPLES 1 to 7
<Acid Generator>
Acid Generator B1:
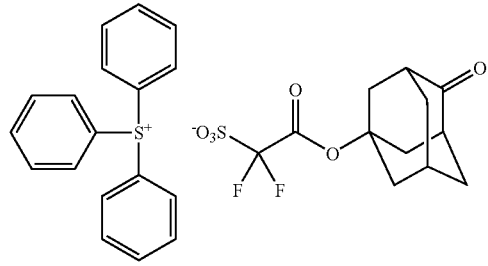
Acid Generator B2:
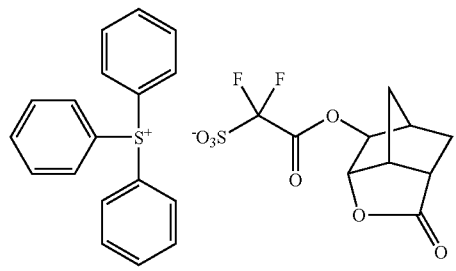
Acid Generator B3:
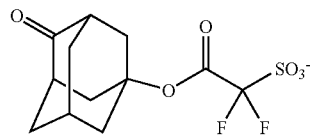
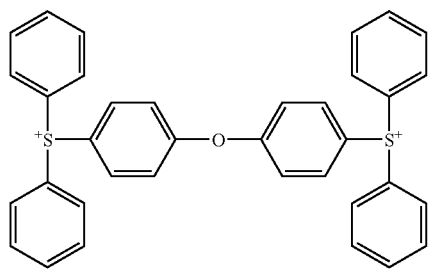
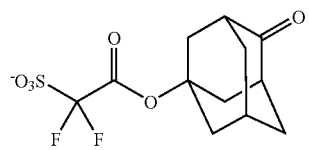
Acid Generator B4:
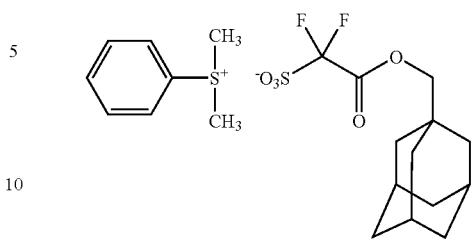
Acid Generator B5:
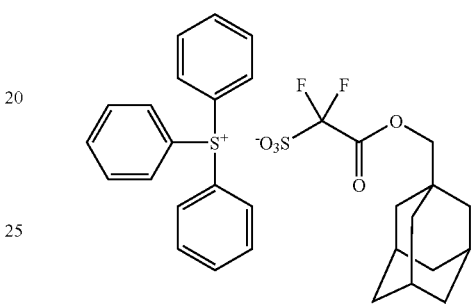
Acid Generator C1:
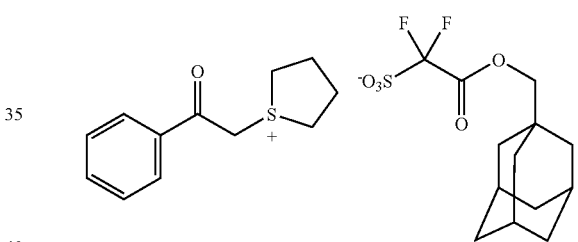
Acid Generator C2:
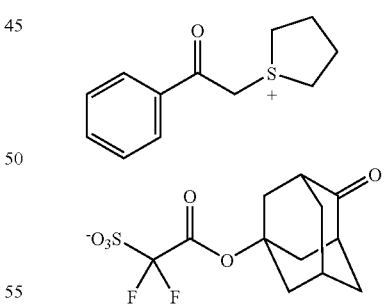
Acid Generator C3:
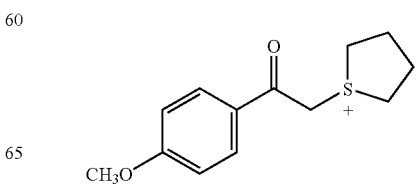

-continued

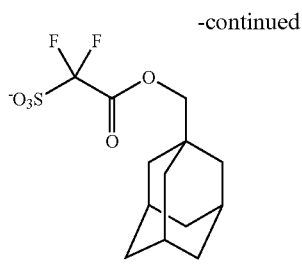

<Resin>

Resins A1 to A3

<Quencher>

Q1: 2,6-diisopropylaniline

<Solvent>

| Y1: propylene glycol monomethyl ether acetate | 145 parts |
|---|---|
| 2-heptanone | 20.0 parts |
| propylene glycol monomethyl ether | 20.0 parts |
| γ-butyrolactone | 3.5 parts |

The following components were mixed and dissolved, further, filtrated through a fluorine resin filter having pore diameter of 0.2 μm, to prepare resist liquid.

Resin (kind and amount are described in Table 1)

Acid generator (kind and amount are described in Table 1)

Quencher (kind and amount are described in Table 1)

Solvent (kind is described in Table 1)

Silicon wafers were each coated with "ARC-29A", which is an organic anti-reflective coating composition available from Nissan Chemical Industries, Ltd., and then baked under the conditions: 205° C., 60 seconds, to form a 780 Å-thick organic anti-reflective coating. Each of the resist liquids prepared as above was spin-coated over the anti-reflective coating so that the thickness of the resulting film became 0.15 μm after drying. The silicon wafers thus coated with the respective resist liquids were each prebaked on a direct hotplate at a temperature shown in column of "PB" of Table 1 for 60 seconds. Using an ArF excimer stepper ("FPA-5000AS3" manufactured by CANON INC., NA=0.75, 2/3 Annular), each wafer thus formed with the respective resist film was subjected to line and space pattern exposure, with the exposure quantity being varied stepwise.

After the exposure, each wafer was subjected to post-exposure baking on a hotplate at a temperature shown in column of "PEB" of Table 1 for 60 seconds and then to paddle development for 60 seconds with an aqueous solution of 2.38 wt % tetramethylammonium hydroxide.

Each of a dark field pattern developed on the organic anti-reflective coating substrate after the development was observed with a scanning electron microscope, the results of which are shown in Table 2. The term "dark field pattern", as used herein, means a pattern obtained by exposure and development through a reticle comprising chromium base surface (light-shielding portion) and linear glass layers (light-transmitting portion) formed in the chromium surface and aligned with each other. Thus, the dark field pattern is such that, after exposure and development, resist layer surrounding the line and space pattern remains on substrate.

Effective Sensitivity (ES): It is expressed as the amount of exposure that the line pattern and the space pattern become 1:1 after exposure through 100 nm line and space pattern mask and development.

Line Edge Roughness (LER): Each of a wall surface of pattern developed on the organic anti-reflective coating substrate after the development was observed with a scanning electron microscope. when the wall surface is smoother than that of Comparative Example 1, its evaluation is marked by "○", when the wall surface is smooth as same as that of Comparative Example 1, its evaluation is marked by "Δ", and when the wall surface is rougher than that of Comparative Example 1, its evaluation is marked by "X".

TABLE 1

| Ex. No. | Resin (kind/ amount (part)) | Acid generator (kind/amount (part)) | Quencher (kind/ amount (part)) | Solvent | PB (° C.) | PEB (° C.) |
|---|---|---|---|---|---|---|
| Ex. 1 | A1/10 | B1/0.30 C1/0.60 | Q1/0.060 | Y1 | 115 | 115 |
| Ex. 2 | A1/10 | B1/0.40 C1/0.30 | Q1/0.060 | Y1 | 115 | 115 |
| Ex. 3 | A1/10 | B1/0.40 C2/0.30 | Q1/0.060 | Y1 | 115 | 115 |
| Ex. 4 | A2/10 | B1/0.40 C1/0.30 | Q1/0.060 | Y1 | 130 | 125 |
| Ex. 5 | A1/10 | B5/0.40 C1/0.30 | Q1/0.070 | Y1 | 115 | 115 |
| Ex. 6 | A1/10 | B2/0.40 C1/0.30 | Q1/0.070 | Y1 | 115 | 115 |
| Ex. 7 | A1/10 | B3/0.60 C1/0.30 | Q1/0.050 | Y1 | 115 | 115 |
| Ex. 8 | A1/10 | B4/0.40 C1/0.30 | Q1/0.050 | Y1 | 115 | 115 |
| Ex. 9 | A1/10 | B1/0.40 C3/0.30 | Q1/0.060 | Y1 | 115 | 115 |
| Ex. 10 | A3/10 | B1/0.40 C1/0.30 | Q1/0.060 | Y1 | 115 | 105 |
| Comp. Ex. 1 | A1/10 | B1/0.50 | Q1/0.060 | Y1 | 115 | 115 |
| Comp. Ex. 2 | A1/10 | C1/1.50 | Q1/0.060 | Y1 | 115 | 115 |
| Comp. Ex. 3 | A2/10 | B1/0.50 | Q1/0.055 | Y1 | 130 | 125 |
| Comp. Ex. 4 | A2/10 | C1/1.20 | Q1/0.055 | Y1 | 130 | 125 |
| Comp. Ex. 5 | A1/10 | C3/1.50 | Q1/0.060 | Y1 | 115 | 115 |
| Comp. Ex. 6 | A3/10 | B1/0.50 | Q1/0.060 | Y1 | 115 | 105 |
| Comp. Ex. 7 | A2/10 | C2/1.50 | Q1/0.060 | Y1 | 120 | 120 |

TABLE 2

| Ex. No. | ES (mJ/cm$^2$) | Resolution (nm) | LER |
|---|---|---|---|
| Ex. 1 | 29 | 90 | ○ |
| Ex. 2 | 29 | 90 | ○ |
| Ex. 3 | 31 | 90 | ○ |
| Ex. 4 | 24 | 90 | ○ |
| Ex. 5 | 33 | 90 | ○ |
| Ex. 6 | 37 | 90 | ○ |
| Ex. 7 | 33 | 90 | ○ |
| Ex. 8 | 28 | 90 | ○ |
| Ex. 9 | 33 | 90 | ○ |
| Ex. 10 | 30 | 90 | ○ |
| Comp. Ex. 1 | 30 | 90 | Δ |
| Comp. Ex. 2 | 34 | 95 | ○ |
| Comp. Ex. 3 | 24 | 90 | X |

TABLE 2-continued

| Ex. No. | ES (mJ/cm$^2$) | Resolution (nm) | LER |
|---|---|---|---|
| Comp. Ex. 4 | 29 | 95 | Δ |
| Comp. Ex. 5 | 40 | 95 | ◯ |
| Comp. Ex. 6 | 32 | 90 | X |
| Comp. Ex. 7 | 38 | 95 | X |

Apparent from Table 2, the resist compositions of Examples, which accord to the present invention, give good resist pattern in resolution and in smoothness of wall surface.

The present composition provides good resist pattern in resolution and line edge roughness and is especially suitable for ArF excimer laser lithography, KrF excimer laser lithography and ArF immersion lithography.

What is claimed is:

1. A chemically amplified resist composition comprising:
(A) a salt represented by the formula (I):

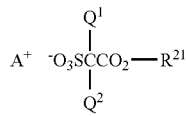

wherein R$^{21}$ represents a C1-C30 hydrocarbon group which may be substituted, and at least one —CH$_2$— in the hydrocarbon group may be substituted by —CO— or —O—, Q$^1$ and Q$^2$ each independently represent a fluorine atom or a C1-C6 perfluoroalkyl group,
and A$^+$ represents at least one organic cation selected from a cation represented by the formula (Ia):

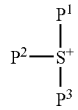

wherein P$^1$, P$^2$ and P$^3$ each independently represent a C1-C30 alkyl group which may be substituted with at least one selected from a hydroxyl group, a C3-C12 cyclic hydrocarbon group and a C1-C12 alkoxy group, or a C3-C30 cyclic hydrocarbon group which may be substituted with at least one selected from a hydroxyl group and a C1-C12 alkoxy group, a cation represented by the formula (Ib):

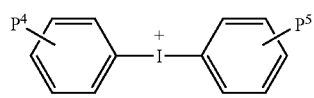

wherein P$^4$ and P$^5$ each independently represent a hydrogen atom, a hydroxyl group, a C1-C12 alkyl group or a C1-C12 alkoxy group, and a cation represented by the formula (Ic):

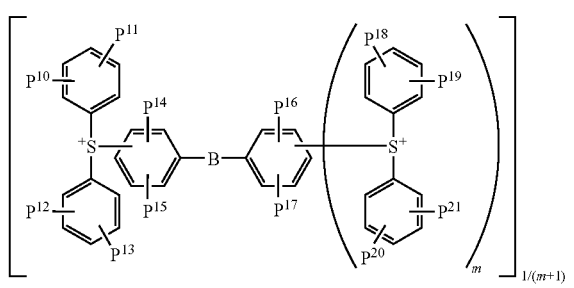

wherein P$^{10}$, P$^{11}$, P$^{12}$, P$^{13}$, P$^{14}$, P$^{15}$, P$^{16}$, P$^{17}$, P$^{18}$, P$^{19}$, P$^{20}$ and P$^{21}$ each independently represent a hydrogen atom, a hydroxyl group, a C1-C12 alkyl group or a C1-C12 alkoxy group, B represents a sulfur or oxygen atom and m represents 0 or 1, (B) a salt represented by the formula (II):

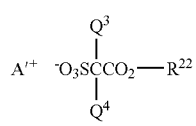

wherein R$^{22}$ represents a C1-C30 hydrocarbon group which may be substituted, and at least one —CH$_2$— in the hydrocarbon group may be substituted by —CO— or —O—, Q$^3$ and Q$^4$ each independently represent a fluorine atom or a C1-C6 perfluoroalkyl group, and A$^{\prime+}$ represents an organic cation represented by the formula (IIa):

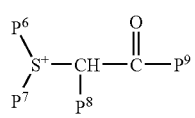

wherein P$^6$ and P$^7$ each independently represent a C1-C12 alkyl group or a C3-C12 cycloalkyl group, or P$^6$ and P$^7$ are bonded to form a C3-C12 divalent acyclic hydrocarbon group which forms a ring together with the adjacent S$^+$, and at least one —CH$_2$— in the divalent acyclic hydrocarbon group may be substituted with —CO—, —O— or —S—,
P$^8$ represents a hydrogen atom, P$^9$ represents a C1-C12 alkyl group, a C3-C12 cycloalkyl group or an aromatic group which may be substituted, or P$^8$ and P$^9$ are bonded to form a divalent acyclic hydrocarbon group which forms a 2-oxocycloalkyl group together with the adjacent —CHCO—, and at least one —CH$_2$— in the divalent acyclic hydrocarbon group may be replaced with —CO—, —O— or —S—; and (C) a resin which contains a structural unit having an acid-labile group and which itself is insoluble or poorly soluble in an aqueous alkali solution but becomes soluble in an aqueous alkali solution by the action of an acid.

2. The resist composition according to claim 1, wherein $Q^1$, $Q^2$, $Q^3$ and $Q^4$ each independently represent a fluorine atom or a trifluoromethyl group.

3. The resist composition according to claim 1, wherein $Q^1$, $Q^2$, $Q^3$ and $Q^4$ represent fluorine atoms.

4. The resist composition according to claim 1, wherein $A^+$ is a cation represented by the formula (Id), (Ie) or (If):

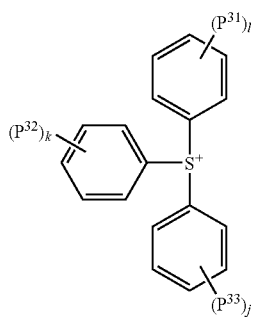

(Id)

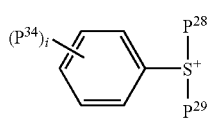

(Ie)

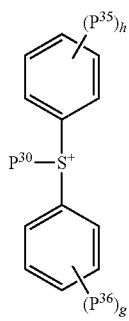

(If)

wherein $P^{28}$, $P^{29}$ and $P^{30}$ each independently represent a C1-C20 alkyl group or a C3-C30 cyclic hydrocarbon group except a phenyl group, and at least one hydrogen atom in the C1-C20 alkyl group may be substituted with a hydroxyl group, a C1-C12 alkoxy group or a C3-C12 cyclic hydrocarbon group and at least one hydrogen atom in the C3-C30 cyclic hydrocarbon group may be substituted with a hydroxyl group, a C1-C12 alkyl group or a C1-C12 alkoxy group, and $P^{31}$, $P^{32}$, $P^{33}$, $P^{34}$, $P^{35}$ and $P^{36}$ each independently represent a hydroxyl group, a C1-C12 alkyl group, a C1-C12 alkoxy group or a C3-C12 cyclic hydrocarbon group, and l, k, j, i, h and g each independently represent an integer of 0 to 5.

5. The resist composition according to claim 1, wherein $A^+$ is a cation represented by the formula (Ig):

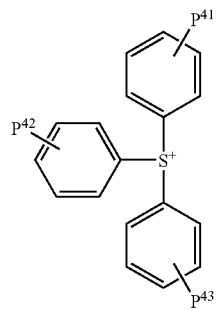

(Ig)

wherein $P^{41}$, $P^{42}$ and $P^{43}$ each independently represent a hydrogen atom, a hydroxyl group, a C1-C12 alkyl group or a C1-C12 alkoxy group.

6. The resist composition according to claim 1, wherein $A^+$ is a cation represented by the formula (Ih):

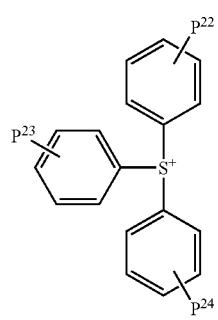

(Ih)

wherein $P^{22}$, $P^{23}$ and $P^{24}$ each independently represent a hydrogen atom or a C1-C4 alkyl group.

7. The resist composition according to claim 1, wherein $R^{21}$ represents a group represented by the formula:

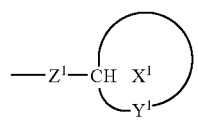

wherein $Z^1$ represents a single bond or $-(CH_2)_f-$, f represents an integer of 1 to 4, $Y^1$ represents $-CH_2-$, $-CO-$ or $-CH(OH)-$; ring $X^1$ represents a C3-C30 monocyclic or polycyclic hydrocarbon group in which a hydrogen atom is substituted with a hydroxyl group at $Y^1$ position when $Y^1$ is $-CH(OH)-$ or in which two hydrogen atoms are substituted with $=O$ at $Y^1$ position when $Y^1$ is $-CO-$, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group.

8. The resist composition according to claim 7, wherein the group represented by the formula:

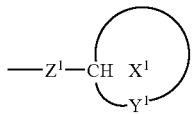

is a group represented by the formula (l), (m) or (n):

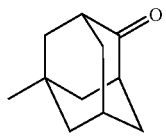
(l)

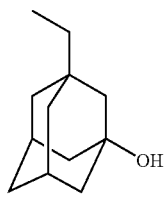
(m)

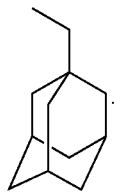
(n)

9. The resist composition according to claim 1, wherein A$^+$ is a cation represented by the formula (Ih):

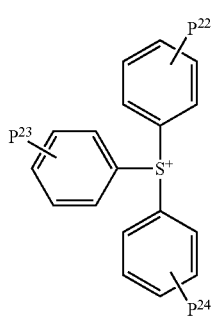
(Ih)

wherein P$^{22}$, P$^{23}$ and P$^{24}$ each independently represent a hydrogen atom or a C1-C4 alkyl group, and R$^{21}$ represents a group represented by the formula:

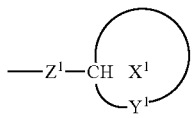

wherein Z$^1$ represents a single bond or —(CH$_2$)$_f$—, f represents an integer of 1 to 4, Y$^1$ represents —CH$_2$—, —CO— or —CH(OH)—; ring X$^1$ represents a C3-C30 monocyclic or polycyclic hydrocarbon group in which a hydrogen atom is substituted with a hydroxyl group at Y$^1$ position when Y$^1$ is —CH(OH)— or in which two hydrogen atoms are substituted with =O at Y$^1$ position when Y is —CO—, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group.

10. The resist composition according to claim 9, wherein the group represented by the formula:

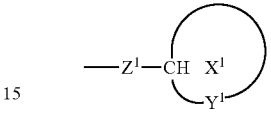

is a group represented by the formula (l), (m) or (n):

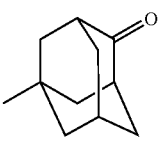
(l)

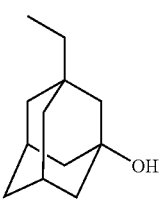
(m)

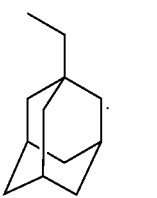
(n)

11. The resist composition according to claim 1, wherein P$^6$ and P$^7$ are bonded to form a C3-C12 divalent acyclic hydrocarbon group which forms a ring together with the adjacent S$^+$, P$^8$ represents a hydrogen atom, P$^9$ represents a C1-C12 alkyl group, a C3-C12 cycloalkyl group or an aromatic group which may be substituted with at least one selected from a C1-C6 alkoxy group, a C2-C20 acyl group and a nitro group.

12. The resist composition according to claim 1, wherein R$^{22}$ represents a group represented by the formula:

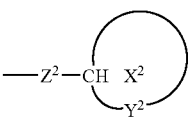

wherein Z$^2$ represents a single bond or —(CH$_2$)g, g represents an integer of 1 to 4, Y$^2$ represents —CH$_2$—, —CO— or —CH(OH)—; ring X$^2$ represents a C3-C30 monocyclic or polycyclic hydrocarbon group in which a hydrogen atom is substituted with a hydroxyl group at Y$^2$ position when Y$^2$ is —CH(OH)— or in which two hydrogen atoms are substituted with =O at $Y^2$ position when $Y^2$ is —CO—, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group.

13. The resist composition according to claim 12, wherein the group represented by the formula:

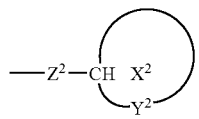

is a group represented by the formula (l), (m) or (n):

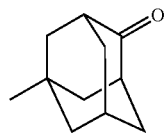 (l)

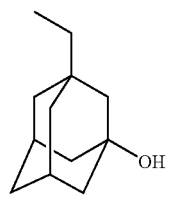 (m)

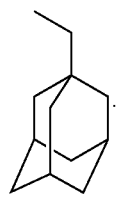 (n)

14. The resist composition according to claim 1, wherein $P^6$ and $P^7$ are bonded to form a C3-C12 divalent acyclic hydrocarbon group which forms a ring together with the adjacent $S^+$, $P^8$ represents a hydrogen atom, $P^9$ represents a C1-C12 alkyl group, a C3-C12 cycloalkyl group or an aromatic group which may be substituted with at least one selected from a C1-C6 alkoxy group, a C2-C20 acyl group and a nitro group; and $R^{22}$ represents a group represented by the formula:

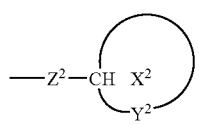

wherein $Z^2$ represents a single bond or —(CH$_2$)g, g represents an integer of 1 to 4, $Y^2$ represents —CH$_2$—, —CO— or —CH(OH)—; ring $X^2$ represents a C3-C30 monocyclic or polycyclic hydrocarbon group in which a hydrogen atom is substituted with a hydroxyl group at $Y^2$ position when $Y^2$ is —CH(OH)— or in which two hydrogen atoms are substituted with =O at $Y^2$ position when $Y^2$ is —CO—, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group.

15. The resist composition according to claim 14, wherein the group represented by the formula:

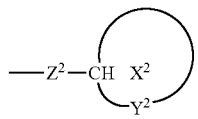

is a group represented by the formula (l), (m) or (n):

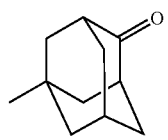 (l)

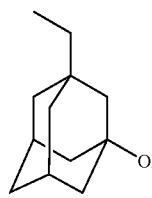 (m)

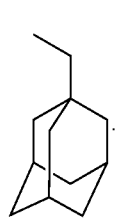 (n)

16. The resist composition according to claim 1, wherein $A^+$ is a cation represented by the formula (Ih):

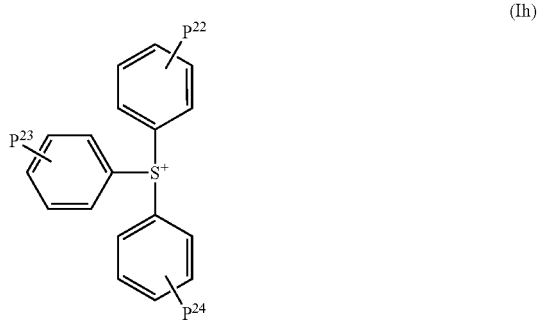 (Ih)

wherein $P^{22}$, $P^{23}$ and $P^{24}$ each independently represent a hydrogen atom or a C1-C4 alkyl group, $R^{21}$ represents a group represented by the formula:

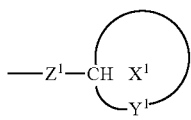

wherein $Z^1$ represents a single bond or $-(CH_2)_f-$, f represents an integer of 1 to 4, $Y^1$ represents $-CH_2-$, $-CO-$ or $-CH(OH)-$; ring $X^1$ represents a C3-C30 monocyclic or polycyclic hydrocarbon group in which a hydrogen atom is substituted with a hydroxyl group at $Y^1$ position when $Y^1$ is $-CH(OH)-$ or in which two hydrogen atoms are substituted with $=O$ at $Y^1$ position when Y is $-CO-$, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group, and $R^{22}$ represents a group represented by the formula:

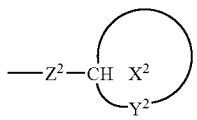

wherein $Z^2$ represents a single bond or $-(CH_2)_g$, g represents an integer of 1 to 4, $Y^2$ represents $-CH_2-$, $-CO-$ or $-CH(OH)-$; ring $X^2$ represents a C3-C30 monocyclic or polycyclic hydrocarbon group in which a hydrogen atom is substituted with a hydroxyl group at $Y^2$ position when $Y^2$ is $-CH(OH)-$ or in which two hydrogen atoms are substituted with $=O$ at $Y^2$ position when $Y^2$ is $-CO-$, and at least one hydrogen atom in the C3-C30 monocyclic or polycyclic hydrocarbon group may be substituted with a C1-C6 alkyl group, a C1-C6 alkoxy group, a C1-C4 perfluoroalkyl group, a C1-C6 hydroxyalkyl group, a hydroxyl group or a cyano group.

17. The resist composition according to claim 16, wherein the group represented by the formula:

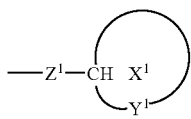

and the group represented by the formula:

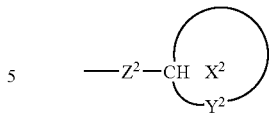

each independently represent a group represented by the formula (l), (m) or (n):

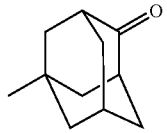
(l)

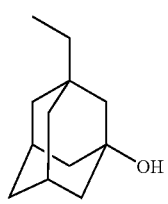
(m)

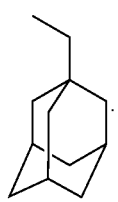
(n)

18. The resist composition according to claim 1, wherein the amount ratio of the salt represented by the formula (I) and the salt represented by the formula (II) is 9/1 to 1/9.

19. The resist composition according to claim 1, wherein the resin contains a structural unit derived from a monomer having a bulky and acid-labile group.

20. The resist composition according to claim 19, the bulky and acid-labile group is a 2-alkyl-2-adamantyl ester group or a 1-(1-adamantyl)-1-alkylalkyl ester group.

21. The resist composition according to claim 19, the monomer having a bulky and acid-labile group is 2-alkyl-2-adamantyl acrylate, 2-alkyl-2-adamantyl methacrylate, 1-(1-adamantyl)-1-alkylalkyl acrylate, 1-(1-adamantyl)-1-alkylalkyl methacrylate, 2-alkyl-2-adamantyl 5-norbornene-2-carboxylate, 1-(1-adamantyl)-1-alkylalkyl 5-norbornene-2-carboxylate, 2-alkyl-2-adamantyl α-chloroacrylate or 1-(1-adamantyl)-1-alkylalkyl α-chloroacrylate.

22. The resist composition according to claim 1, wherein the resist composition further comprises a basic compound.

* * * * *